(12) United States Patent
Sasai et al.

(10) Patent No.: US 11,350,096 B2
(45) Date of Patent: *May 31, 2022

(54) IMAGE CODING METHOD, IMAGE DECODING METHOD, IMAGE CODING APPARATUS, IMAGE DECODING APPARATUS, AND IMAGE CODING AND DECODING APPARATUS

(71) Applicant: Sun Patent Trust, New York, NY (US)

(72) Inventors: Hisao Sasai, Osaka (JP); Takahiro Nishi, Nara (JP); Youji Shibahara, Tokyo (JP); Toshiyasu Sugio, Osaka (JP)

(73) Assignee: SUN PATENT TRUST, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/822,816

(22) Filed: Mar. 18, 2020

(65) Prior Publication Data

US 2020/0221095 A1 Jul. 9, 2020

Related U.S. Application Data

(63) Continuation of application No. 15/995,654, filed on Jun. 1, 2018, now Pat. No. 10,638,134, which is a
(Continued)

(51) Int. Cl.
*H04N 19/00* (2014.01)
*H04N 19/13* (2014.01)
(Continued)

(52) U.S. Cl.
CPC .......... *H04N 19/13* (2014.11); *H03M 7/4018* (2013.01); *H04N 19/119* (2014.11);
(Continued)

(58) Field of Classification Search
CPC . H03M 7/4018; H04N 19/119; H04N 19/122; H04N 19/13; H04N 19/176
See application file for complete search history.

(56) References Cited

U.S. PATENT DOCUMENTS 6,795,584 B2  9/2004  Karczewicz et al.
7,305,035 B2  12/2007  Kondo et al.
(Continued)

FOREIGN PATENT DOCUMENTS

CN  1585958  2/2005
CN  1589023  3/2005
(Continued)

OTHER PUBLICATIONS

ISO/IEC 14496-10 MPEG-4 Part 10: "Advanced Video Coding", Oct. 1, 2004.
(Continued)

*Primary Examiner* — Li Liu
(74) *Attorney, Agent, or Firm* — Wenderoth, Lind & Ponack, L.L.P.

(57) ABSTRACT

An image coding method comprising: obtaining current signals to be coded of each of the processing units of the image; generating a binary signal by performing binarization on each of the current signals to be coded; selecting a context for each of the current signals to be coded from among a plurality of contexts; performing arithmetic coding of the binary signal by using coded probability information associated with the context selected in the selecting; and updating the coded probability information based on the binary signal, wherein, in the selecting, the context for the current signal to be coded is selected, as a shared context, for a signal which is included in one of a plurality of processing units and has a size different from a size of the processing unit including the current signal to be coded.

2 Claims, 32 Drawing Sheets

Related U.S. Application Data continuation of application No. 15/498,774, filed on Apr. 27, 2017, now Pat. No. 10,015,494, which is a continuation of application No. 14/951,893, filed on Nov. 25, 2015, now Pat. No. 9,681,137, which is a continuation of application No. 14/271,930, filed on May 7, 2014, now Pat. No. 9,258,558, which is a continuation of application No. 13/348,041, filed on Jan. 11, 2012, now Pat. No. 8,755,620.

(60) Provisional application No. 61/431,912, filed on Jan. 12, 2011.

(51) Int. Cl.
| | |
|---|---|
| H04N 19/61 | (2014.01) |
| H04N 19/91 | (2014.01) |
| H04N 19/176 | (2014.01) |
| H03M 7/40 | (2006.01) |
| H04N 19/119 | (2014.01) |
| H04N 19/122 | (2014.01) |
| H04N 19/124 | (2014.01) |
| H04N 19/159 | (2014.01) |
| H04N 19/52 | (2014.01) |
| H04N 19/136 | (2014.01) |
| H04N 19/157 | (2014.01) |

(52) U.S. Cl.
CPC ......... *H04N 19/122* (2014.11); *H04N 19/124* (2014.11); *H04N 19/159* (2014.11); *H04N 19/176* (2014.11); *H04N 19/52* (2014.11); *H04N 19/61* (2014.11); *H04N 19/91* (2014.11); *H04N 19/136* (2014.11); *H04N 19/157* (2014.11)

(56) References Cited

U.S. PATENT DOCUMENTS

| | | |
|---|---|---|
| 7,742,528 B2 | 6/2010 | Kondo et al. |
| 7,970,059 B2 | 6/2011 | Kondo et al. |
| 8,005,146 B2 | 8/2011 | Kondo et al. |
| 8,098,736 B2 | 1/2012 | Kondo et al. |
| 2004/0066974 A1 | 4/2004 | Karczewicz et al. |
| 2004/0184544 A1 | 9/2004 | Kondo et al. |
| 2004/0223657 A1 | 11/2004 | Sugimoto et al. |
| 2004/0240745 A1 | 12/2004 | Sugimoto et al. |
| 2005/0099522 A1 | 5/2005 | Kondo et al. |
| 2005/0123207 A1 | 6/2005 | Marpe et al. |
| 2005/0253740 A1 | 11/2005 | Marpe et al. |
| 2006/0233254 A1 | 10/2006 | Lee et al. |
| 2007/0110153 A1 | 5/2007 | Cho et al. |
| 2007/0237240 A1 | 10/2007 | Lee et al. |
| 2007/0242892 A1 | 10/2007 | Sugimoto et al. |
| 2008/0056374 A1 | 3/2008 | Kondo et al. |
| 2008/0056375 A1 | 3/2008 | Kondo et al. |
| 2008/0063083 A1 | 3/2008 | Kondo et al. |
| 2008/0111722 A1 | 5/2008 | Reznik |
| 2008/0219578 A1 | 9/2008 | Lee |
| 2008/0260037 A1 | 10/2008 | Kondo et al. |
| 2008/0260038 A1 | 10/2008 | Kondo et al. |
| 2008/0260039 A1 | 10/2008 | Kondo et al. |
| 2009/0161974 A1 | 6/2009 | Bjontegaard et al. |
| 2009/0175332 A1 | 7/2009 | Karczewicz et al. |
| 2009/0273491 A1 | 11/2009 | Sakaguchi et al. |
| 2010/0150464 A1 | 6/2010 | Kondo et al. |
| 2010/0158485 A1 | 6/2010 | Kondo et al. |
| 2011/0001643 A1 | 1/2011 | Sze et al. |
| 2011/0243245 A1 | 10/2011 | Kondo et al. |
| 2012/0082231 A1 | 4/2012 | Rojals et al. |
| 2012/0082232 A1 | 4/2012 | Rojals et al. |
| 2012/0082235 A1 | 4/2012 | Lou et al. |
| 2012/0140814 A1 | 6/2012 | Rojals et al. |
| 2012/0163448 A1 | 6/2012 | Zheng et al. |
| 2012/0163456 A1 | 6/2012 | Coban et al. |
| 2013/0027230 A1 | 1/2013 | Marpe et al. |

FOREIGN PATENT DOCUMENTS

| | | |
|---|---|---|
| CN | 1917647 | 2/2007 |
| EP | 2 663 075 | 11/2013 |
| JP | 2004-7381 | 1/2004 |
| JP | 2004-64725 | 2/2004 |
| JP | 2004-266567 | 9/2004 |
| JP | 2006-19814 | 1/2006 |
| JP | 2006-501740 | 1/2006 |
| JP | 2007-142637 | 6/2007 |
| WO | 03/027940 | 4/2003 |
| WO | 2004/032032 | 4/2004 |
| WO | 2009/082239 | 7/2009 |
| WO | 2011/052234 | 5/2011 |

OTHER PUBLICATIONS

Thomas Wiegand et al., "Overview of the H.264/AVC Video Coding Standard", IEEE Transactions on Circuits and Systems for Video Technology, Jul. 2003, pp. 560-576.

Sakae Okubo et al., "Kaitei San-pan H.264/AVC Kyokasho (Third Edition, H.264/AVC Textbook)", Impress R&D, Jan. 1, 2009, pp. 153-157, with its English Translation.

Thomas Wiegand et al., "Draft ITU-T Recommendation and Final Draft International Standard of Joint Video Specification (ITU-T Rec. H.264 | ISO/IEC 14496-10 AVC)", Joint Video Team (JVT) of ISO/IEC MPEG & ITU-T VCEG (ISO/IEC JTC1/SC29/WG11 and ITU-T SG16 Q.6), JVT-G050r1, May 27, 2003, pp. 160-161.

International Search Report and Written Opinion dated Feb. 4, 2012 in corresponding International Application No. PCT/JP2012/000148.

Thomas Wiegand et al., "WD1: Working Draft 1 of High-Efficiency Video Coding", Joint Collaborative Team on Video Coding (JCT-VC) of ITU-T SG16 WP3 and ISO/IEC JTC1/SC29/WG11, JCTVC-C403, Ver. 1, 3$^{rd}$ Meeting: Guangzhou, CN, Oct. 7-15, 2010.

Marpe, D.; Schwarz, H.; Wiegand, T. "Context-based adaptive binary arithmetic coding in the H.264/AVC video compression standard", IEEE Transactions on Circuits and Systems for Video Technology, Jul. 2003, vol. 13, Issue: 7 pp. 620-636.

Tung Nguyen; Schwarz, H.; Kirchhoffer, H.; Marpe, D.; Wiegand, T. "Improved context modeling for coding quantized transform coefficients in video compression" Picture Coding Symposium (PCS), 2010, pp. 378-381.

Wien, M. "Variable block-size transforms for H.264/AVC", IEEE Transactions on Circuits and Systems for Video Technology, Jul. 2003, vol. 13, Issue: 7 pp. 604-613.

Marpe, D.; Wiegand, T.; Sullivan, G.J. "The H.264/MPEG4 advanced video coding standard and its applications", Communications Magazine, IEEE, Aug. 2006, vol. 44 , Issue: 8 pp. 134-143.

Jungong Han et al., "Variable block-size transform and entropy coding at the enhancement layer of FGS", 2004 International Conference on Image Processing (ICIP), vol. 1, Oct. 2004, pp. 481-484.

Hisao Sasai et al., "Simplified Context modeling for Transform Coefficient Coding", Joint Collaborative Team on Video Coding (JCT-VC) of ITU-T SG16 WP3 and ISO/IEC JTC1/SC29/WG11, JCTVC-D185, 4th Meeting: Daegu, KR, Jan. 20-28, 2011, pp. 1-5.

International Search Report dated Feb. 14, 2012 in corresponding International Application No. PCT/JP2012/000158.

International Preliminary Report on Patentability and Written Opinion of the International Searching Authority dated Jul. 16, 2013 in corresponding International Application No. PCT/JP2012/000158.

International Search Report dated Feb. 14, 2012 in corresponding International Application No. PCT/JP2012/000148.

International Preliminary Report on Patentability and Written Opinion of the International Searching Authority dated Jul. 16, 2013 in corresponding International Application No. PCT/JP2012/000148.

J. Sole et al., "Parallel Context Processing for the significance map in high coding efficiency", Joint Collaborative Team on Video

(56) References Cited

OTHER PUBLICATIONS

Coding (JCT-VC) of ITU-T SG16 WP3 and ISO/IEC JTC1/SC29/WG11, JCTVC-D262, 4th Meeting: Daegu, KR, Jan. 20-28, 2011, pp. 1-4.
Decision on Grant dated Feb. 15, 2016 in corresponding Russian Application No. 2013106272 (with English translation).
Extended European Search Report dated Mar. 24, 2016 in corresponding European Patent Application No. 12733945.5.
Hisao Sasai et al., "CE11: Context size reduction for the significance map", Joint Collaborative Team on Video Coding (JCT-VC) of ITU-T SG16 WP3 and ISO/IEC JTC1/SC29/WG11, $5^{th}$ Meeting: Geneva, CH, Mar. 16-23, 2011, Document: JCTVC-E227, XP030008733, Mar. 10, 2011.
Martin Winken et al., "Description of video coding technology proposal by Fraunhofer HHI", Joint Collaborative Team on Video Coding (JCT-VC) of ITU-T SG16 WP3 and ISO/IEC JTC1/SC29/WG11, $1^{st}$ Meeting: Dresden, DE, Apr. 15-23, 2010, Document: JCTVC-A116, XP030007557, Apr. 24, 2010.
"Test model under Consideration for High-Efficiency Video Coding", ISO/IEC JTC1/SC29/WG11, MPEG Meeting, Apr. 19-23, 2010, No. N11280, XP030017777, Jul. 28, 2010.
Office Action dated Jun. 22, 2016 in corresponding Taiwanese Application No. 101101243 (with English translation of Search Report).
Office Action dated Aug. 3, 2016 in U.S. Appl. No. 14/951,893.
Heising et al., "CABAC and ABT", Joint Video Team (JVT) of ISO/IEC MPEG & ITU-T VCEG (ISO/IEC JTC1/SC29/WG11 and ITU-T SG16 Q.6) 4th Meeting: Klagenfurt, Austria, Jul. 22-26, 2002, SW, JVT-D021, Jul. 26, 2002.
Communication pursuant to Article 94(3) EPC dated Oct. 19, 2017 in European Application No. 12 733 945.5.
Office Action dated Jul. 14, 2017 in U.S. Appl. No. 15/498,774.
Summons to attend oral proceedings pursuant to Rule 115(1) EPC dated Dec. 4, 2018 for corresponding European Patent Application No. 12733945.5.
Office Action dated Feb. 7, 2019 in corresponding Indian Patent Application No. 1126/CHENP/2013.
Hearing Notice dated Aug. 19, 2021 issued for Indian Patent Application No. 1126/CHENP/2013.

FIG. 4

| Indices ctxIdx | Occurrence probabilities pStateIdx | Symbols valMPS |
|---|---|---|
| 0 | 12 | 1 |
| 1 | 7 | 0 |
| 2 | 41 | 0 |
| 3 | 22 | 1 |
| 4 | 10 | 1 |
| 5 | 8 | 0 |
| 6 | 50 | 1 |
| : | : | : |

FIG. 5A

| Tables | 1 | | | | 2 | | | | |
|---|---|---|---|---|---|---|---|---|---|
| Conditions | 0 | 1 | 2 | 3 | 4 | 5 | 6 | 7 | ... |
| ctxIdx | 0 | 1 | 2 | 2 | 14 | 14 | 15 | 15 | ... |

BLKS: A     BLKS: B

FIG. 5B

| Tables | 3 | | | | 4 | | | | |
|---|---|---|---|---|---|---|---|---|---|
| Conditions | 10 | 11 | 12 | 13 | 14 | 15 | 16 | 17 | ... |
| ctxIdx | 0 | 1 | 2 | 2 | 3 | 4 | 2 | 2 | ... |

BLKS: A     BLKS: B

FIG. 5C

| Tables | 5 | | | | 6 | | | | | 7 | | |
|---|---|---|---|---|---|---|---|---|---|---|---|---|
| Conditions | 10 | 11 | 12 | 13 | 14 | 15 | 16 | 17 | ... | 18 | 19 | ... |
| ctxIdx | 0 | 1 | 2 | 2 | 14 | 14 | 15 | 15 | ... | 18 | 19 | ... |

BLKS: A     BLKS: B     BLKS: C, D, E

FIG. 23

| |
|---|
| Video stream (PID=0x1011, Primary video) |
| Audio stream (PID=0x1100) |
| Audio stream (PID=0x1101) |
| Presentation graphics stream (PID=0x1200) |
| Presentation graphics stream (PID=0x1201) |
| Interactive graphics stream (PID=0x1400) |
| Video stream (PID=0x1B00, Secondary video) |
| Video stream (PID=0x1B01, Secondary video) |

Stream of TS packets

Data structure of PMT

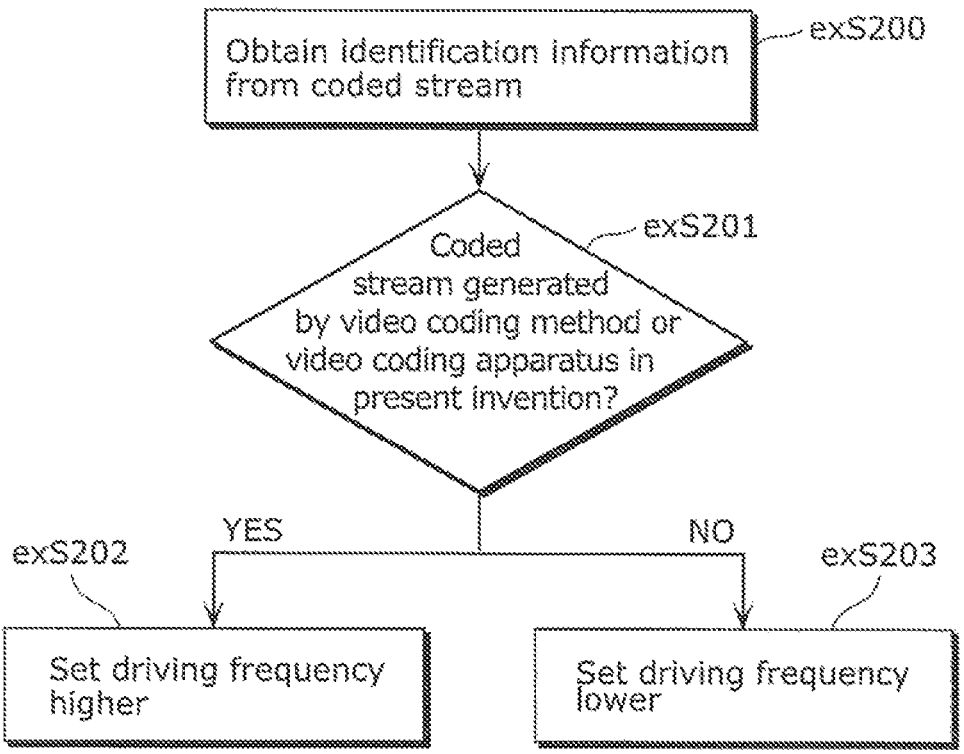

IMAGE CODING METHOD, IMAGE DECODING METHOD, IMAGE CODING APPARATUS, IMAGE DECODING APPARATUS, AND IMAGE CODING AND DECODING APPARATUS

CROSS REFERENCE TO RELATED APPLICATIONS

This is a continuation of application Ser. No. 15/995,654, filed Jun. 1, 2018, which is a continuation of application Ser. No. 15/498,774, filed Apr. 27, 2017, now U.S. Pat. No. 10,015,494 which is a continuation of application Ser. No. 14/951,893, filed Nov. 25, 2015, now U.S. Pat. No. 9,681,137, which is a continuation of application Ser. No. 14/271,930, filed May 7, 2014, now U.S. Pat. No. 9,258,558, which is a continuation of application Ser. No. 13/348,041, filed Jan. 11, 2012, now U.S. Pat. No. 8,755,620, which is based on and claims the benefit of U.S. Provisional Patent Application No. 61/431,912 filed Jan. 12, 2011. The entire disclosures of the above-identified applications, including the specification, drawings and claims are incorporated herein by reference in their entirety.

BACKGROUND OF THE INVENTION

(1) Field of the Invention

The present invention relates to image coding methods, image decoding methods, image coding apparatuses, and image decoding apparatuses, and in particular to an image coding method, an image decoding method, an image coding apparatus, an image decoding apparatus, and an image coding and decoding apparatus intended to perform arithmetic coding or/and arithmetic decoding.

(2) Description of the Related Art

Recent years have seen an increase in the number of applications for services of, for example, video on demand type services. Examples of such services include video-conferencing through the Internet, digital video broadcasting, and streaming of video contents. These applications require that video data having a substantial amount of digital data is transmitted through transmission channels and is stored on storage media. However, conventional transmission channels have a limited available frequency bandwidth, and conventional storage media have a limited capacity. Accordingly, in order to transmit the video data using a conventional transmission channel and to record the video data onto a conventional recording medium, it is inevitable to compress or reduce the amount of the video data.

For the purpose of compressing video data, many video coding standards have been developed. Such video coding standards are, for instance, International Telecommunication Union Telecommunication Standardization Sector (ITU-T) standards denoted with H.26x and ISO/IEC standards denoted with MPEG-x. The most advanced video coding standards are currently the standards denoted as H.264/AVC or MPEG-4/AVC (see ISO/IEC 14496-10, "MPEG-4 Part 10 Advanced Video Coding", and Thomas Wiegand et al, "Overview of the H. 264/AVC Video Coding Standard", IEEE TRANSACTIONS ON CIRCUITS AND SYSTEMS FOR VIDEO TECHNOLOGY, JULY 2003, pp. 560-576).

The data compression processes in the H.264/AVC Standard is roughly divided into prediction, transform, quantization, and entropy coding. The entropy coding is intended to reduce redundant information in information to be used for the prediction and quantized information. Representatives of entropy coding include variable-length coding, adaptive coding, and fixed-length coding. Representatives of variable-length coding include Huffman coding, run-length coding, and arithmetic coding. Among these, the arithmetic coding is known as a scheme which is intended to determine output codes using contexts for identifying symbol occurrence probabilities and which provides a high coding efficiency by switching contexts according to the features of an image, compared to Huffman coding which uses a fixed coding table.

SUMMARY OF THE INVENTION

However, the conventional arithmetic coding has a problem of not providing a sufficient coding efficiency. The present invention has been made to solve the aforementioned problem, with an aim to provide an image coding method, an image coding apparatus, an image decoding method, an image decoding apparatus, and an image coding and decoding apparatus which make it possible to increase coding efficiency.

In order to achieve the aforementioned problem, an image coding method according to the present invention is for compression-coding an image including a plurality of processing units having mutually different sizes, the image coding method comprising: obtaining current signals to be coded of each of the processing units of the image (S401); generating a binary signal by performing binarization on each of the current signals to be coded (S402); selecting a context for each of the current signals to be coded from among a plurality of contexts (S403); performing arithmetic coding of the binary signal by using coded probability information associated with the context selected in the selecting (S404); and updating the coded probability information associated with the context selected in the selecting, based on the binary signal generated in the generating (S405), wherein, in the selecting, the context for the current signal to be coded is selected, as a shared context, for a signal which is included in one of a plurality of processing units and has a size different from a size of the processing unit including the current signal to be coded.

For example, it is possible to apply the same context for the signals to be coded having the same statistical properties. For this reason, the image coding method according to the present invention is intended to select the shared context for the signals having the same statistical properties even when the processing unit sizes are different. In this way, it is possible to reduce the number of contexts to be used. This reduction in the number of the contexts makes it possible to reduce the size of memory for storing the contexts. Here, it is unnecessary that the image coding method according to the present invention is configured to use all of the contexts for different processing units. In other words, the image coding method according to the present invention may be configured to partly use the contexts exclusively for a particular processing unit.

Conventionally, the number of contexts is large because a different context is set based on a processing unit size and on a coefficient position or a surrounding condition. In the case where a large number of contexts is used, there is a possibility that the numbers of updates of coded probability information for some of the contexts are small and the accuracies of the coded probability information are not assured. In contrast, as described above, the image coding method according to the present invention makes it possible to reduce the number of contexts, to increase the numbers of updates for the contexts to be selected and shared, and to increase the prediction accuracy of the coded probability information. This increase in the accuracy of the coded probability information makes it possible to increase the coding efficiency.

According to the image coding method of the present invention, the context which is set as a shared context in advance may be selected in the case where the size of the processing unit including the current signal to be coded obtained in the obtaining is larger than a predetermined size.

Here, generally, a context is selected according to a surrounding condition. When the processing unit size is comparatively large, the statistical properties become approximately the same, and thus, the same shared context can be used. An aspect of the image coding method according to the present invention makes it possible to reduce the number of contexts by using a shared context in the case where the processing unit size is larger than the predetermined size. In this way, it is possible to increase the prediction accuracy of the coded probability information and to thereby increase the coding efficiency in the case where the processing unit size is larger than the predetermined size.

The image coding method of the present invention may further comprise performing frequency transform on the image to generate transform coefficients of frequency components and to generate the current signals to be coded which respectively indicate the transform coefficients of the frequency components, wherein in the selecting, the context which is set as a dedicated context for a processing unit which is included in the processing units may be selected in the case where the frequency component corresponding to the current signal to be coded is lower than a predetermined frequency.

In this way, it is possible to select a context adapted to the features of the image.

The image coding method according to the present invention may further comprise segmenting the image into a plurality of sub blocks each having the same sub processing unit size, wherein in the generating, the binary signal may be generated by performing binarization on the current signals to be coded of each of the sub blocks, and in the selecting, the context which may be set for each of the sub blocks having the sub processing unit size in advance is selected. It is possible to apply the same context by setting the context based on the sub block size, irrespective of whether the block size is large or small.

In order to achieve the aforementioned problem, an image decoding method according to the present invention is for reconstructing a coded image including a plurality of processing units having mutually different sizes by decoding the coded image, the image decoding method comprising: obtaining current signals to be decoded of each of the processing units of the coded image (S501); selecting a context of each of the current signals to be decoded from among a plurality of contexts (S502); generating a binary signal by performing arithmetic decoding of the current signal to be decoded by using decoded probability information associated with the context selected in the selecting (S503); reconstructing the coded image by performing multi-value conversion on the binary signal (S504); and updating the decoded probability information associated with the context selected in the selecting, based on the binary signal (S505), wherein, in the selecting, the context for the current signal to be decoded is selected, as a shared context, for a signal which is included in a plurality of processing units and has a size different from a size of the processing unit including the current image to be decoded.

In this way, it is possible to appropriately decode the coded image coded using the image coding method according to the present invention. As in the image coding method according to the present invention, it is possible to reduce the number of contexts. Furthermore, it is possible to increase the numbers of updates for the contexts, and to thereby increase the prediction accuracy of decoded probability information.

According to the image decoding method of the present invention, in the selecting, the context which is set as a shared context in advance may be selected in the case where the processing unit size of the processing unit including the current signals to be coded obtained in the obtaining is larger than a predetermined size.

In this way, it is possible to reduce the number of contexts because the shared context is used when the processing unit size is larger than the predetermined size. In this way, it is possible to increase the prediction accuracy of the coded probability information and to thereby increase the coding efficiency in the case where the processing unit size is larger than the predetermined size.

According to the image decoding method of the present invention, in the selecting, the context which is set as a dedicated context in advance for a processing unit included in the processing units may be selected when the frequency component corresponding to the current signal to be decoded is lower than a predetermined frequency in the case where the current signal to be decoded is a signal indicating one of transform coefficients of frequency components generated through frequency transform in the generation of the coded image.

According to the image decoding method of the present invention, in the selecting, the context which is set as a shared context in advance for processing units which are included in the processing units and have high frequencies which are higher than the predetermined frequency may be selected when the frequency component corresponding to the current signal to be decoded is higher than the predetermined frequency in the case where the current signal to be decoded is a signal indicating one of transform coefficients of frequency components generated through frequency transform in the generation of the coded image.

In this way, it is possible to select a context adapted to the features of the image.

According to the image decoding method of the present invention, in the case where the coded image is a coded image generated by segmenting the image into a plurality of sub blocks each having the same sub processing unit size, and performing binarization and arithmetic coding of each of the sub blocks, in the selecting, the context which is set as a context for each of the sub blocks having the sub processing unit size may be selected.

It is possible to apply the same context by setting the context based on the sub block size, irrespective of whether the block size is large or small.

It is to be noted that the present invention can be realized or implemented not only as image coding methods, but also as image coding apparatuses which include processing units for performing the processing steps included in the image coding methods. Likewise, the present invention can be realized or implemented not only as image decoding methods, but also as image decoding apparatuses which include processing units for performing the processing steps included in the image decoding methods. Furthermore, the present invention can be realized or implemented as image coding and decoding apparatuses which include processing units for performing the processing steps included in both the image coding methods and the image decoding methods.

Furthermore, these steps may be realized as a program for causing a computer to execute these steps. Furthermore, the present invention may be implemented as recording media such as computer-readable Compact Disc-Read Only Memories (CD-ROMs) including the programs recorded thereon, and information, data, and/or signals representing the programs. Naturally, the program, information, data, and signals may be distributed through communication networks such as the Internet.

Some or all of the structural elements which make up any one of the image coding apparatuses and the image decoding apparatuses may be configured in the form of a single system Large Scale Integration (LSI). Such a system LSI is a super multifunctional LSI manufactured by integrating plural structural element units on a single chip. For example, the system LSI is a computer system configured to include a macro processor, a ROM, a Random Access Memory (RAM), and the like.

The present invention makes it possible to perform predictions of symbol occurrence probabilities with high accuracy, and to thereby increase the image coding efficiency.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings:

FIG. 4 is a diagram showing an example of a signal information table for use in an image coding method and an/the image coding apparatus according to the present invention;

FIG. 5A is a block diagram showing an example of a context table for use in an/the image coding method and an/the image coding apparatus according to the present invention;

FIG. 5B is a block diagram showing an example of a context table for use in an/the image coding method and an/the image coding apparatus according to the present invention;

FIG. 5C is a block diagram showing an example of a context table for use in an/the image coding method and an/the image coding apparatus according to the present invention;

FIG. 23 is a drawing showing a structure of multiplexed data;

FIG. 33 is a drawing showing steps for identifying video data and switching between driving frequencies;

FIG. 34 is a drawing showing an example of a look-up table in which standards of video data are associated with driving frequencies;

DESCRIPTION OF THE PREFERRED EMBODIMENTS

First, a basic structure of a conventional image coding apparatus and a conventional image coding method are described before explaining embodiments of the present invention.

The conventional image coding apparatus executes compression coding processing composed of prediction, transform and quantization, and entropy coding on a current signal to be coded of an image.

Hereinafter, the entropy coding among the processes performed by the image coding apparatus is described with reference to FIG. 1 and FIG. 2. Here, arithmetic coding is explained as the entropy coding.

Figure 1:
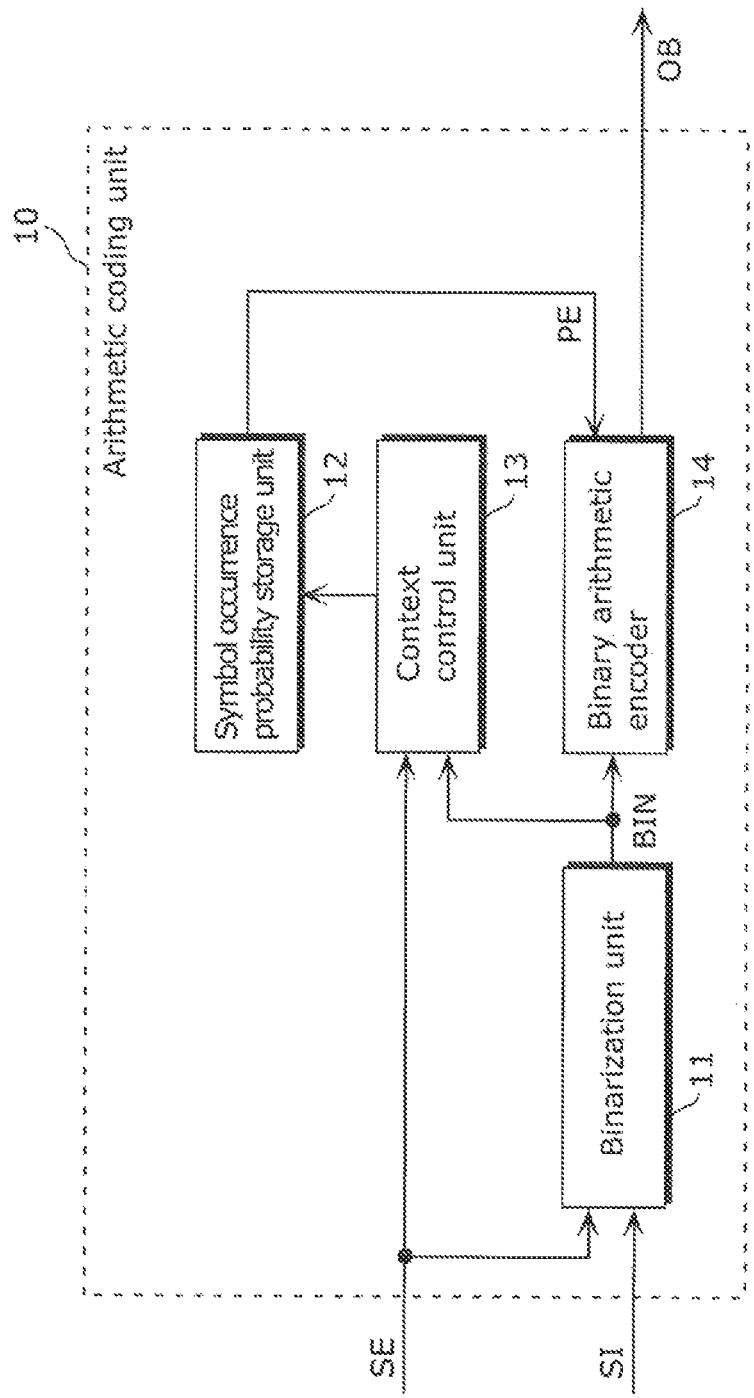
FIG. 1 is a block diagram showing a structure of an arithmetic coding apparatus according to conventional art.
Figure 2:
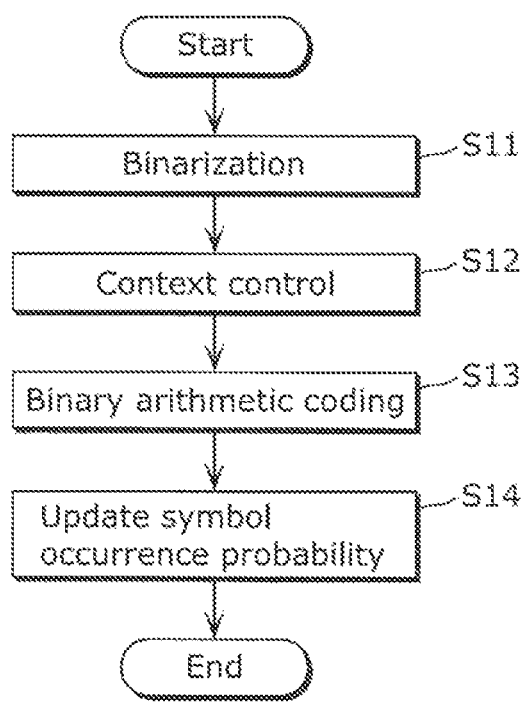
FIG. 2 is a flowchart indicating an arithmetic coding method according to conventional art.

FIG. 1 is a block diagram showing a structure of an arithmetic coding unit which executes the conventional arithmetic coding method. FIG. 2 is a flowchart indicating a processing procedure of the arithmetic coding method (an example of the entropy coding) conforming to the conventional H.264/AVC Standard.

As shown in FIG. 1, the arithmetic coding unit 10 includes a binarization unit 11, a symbol occurrence probability storage unit 12, a context control unit 13, and a binary arithmetic encoder 14.

The arithmetic coding unit 10 receives, as inputs, (i) an input signal SI that is a current signal to be coded which becomes a coding target, (ii) a signal type information SE that indicates the type of the input signal SI, and (iii) a block size signal BLKS that indicates the block size of the input signal SI. Hereinafter, descriptions are given assuming a case where the input signal SI is a signal indicating a current one of the quantized coefficients generated by quantizing the image is a zero coefficient and a case where the input signal SI is a signal indicating a current one of the quantized coefficients is a non-zero coefficient.

The binarization unit 11 executes, based on the signal type information SE, a two-value conversion (binarization) process for converting the input signal SI into binary information (a symbol) of "0" or "1", and sends a binary signal BIN to the binary arithmetic encoder 14 and the context control unit 13.

The symbol occurrence probability storage unit 12 stores (i) a single signal information table and (ii) a context table which includes a plurality of contexts prepared for different block sizes and conditions.

This signal information table is a table which stores contexts, probability information indicating symbol occurrence probabilities PE, and symbols in an associated manner. The symbol occurrence probabilities PE are probability information for use in processing by the binary arithmetic encoder 104 which will be described later.

Here, FIG. 4 shows an example of a signal information table in which indices ctxIdx, occurrence probabilities pStateIdx, and symbols valMPS which are symbols each having a high occurrence probability (Most Probable Symbols) are respectively associated with each other. Each of the indices ctxIdx indicates a context. In addition, the probability information pStateIdx and the symbol valMPS are the same as shown in the H.264 Standard. In other words, each of the probabilities pStateIdx is an index indicating a value of a corresponding one of the symbol occurrence probabilities PE. The symbol occurrence probability storage unit 12 further stores an occurrence probability table (not shown) indicating a value of one of the symbol occurrence probabilities PE which corresponds to the probability information pStateIdx.

The context table is a table which stores a plurality of contexts ctxIdx for different block sizes BLKS and conditions. Here, such conditions are determined according to the positions of the quantized coefficients of current signals to be coded.

Here, FIG. 5A is a block diagram showing an example of a conventional context table. More specifically, for example, in Table 1, (i) a context ctxIds 0 is set for a condition 0 indicating the position of a coefficient corresponding to a low frequency component, (ii) a context ctxIds 1 is set for a condition 1 indicating the position of a coefficient corresponding to a low frequency component, and (iii) a context ctxIds 2 is set for conditions 2 and 3 each indicating a surrounding condition corresponding to a high frequency component. In addition, for example, in Table 2, (i) a context ctxIds 14 is set for conditions 4 and 5 each indicating the position of a coefficient corresponding to a low frequency component, and (ii) a context ctxIds 15 is set for conditions 6 and 7 each indicating a surrounding condition corresponding to high frequency components.

It is assumed here, for example, that Table 1 is used for a block size A that is a 4×4 block size, and that Table 2 is used for a block size B that is an 8×8 block size. As shown in FIG. 5A, the values 0, 1, and 2 of the contexts ctxIdx for use in Table 1 are not used in Table 2. Table 1 and Table 2 respectively correspond to different block sizes, and thus different contexts ctxIdx are set for different block sizes.

The context control unit 13 performs context control processing of reading out the symbol occurrence probability PE corresponding to the block size shown by a block size signal BLKS and a condition determined based on the signal type information from the symbol occurrence probability storage unit 12, and outputting the read-out symbol occurrence probability PE to the binary arithmetic encoder 14. In addition, the context control unit 13 calculates a new symbol occurrence probability PE based on a binary signal BIN which is input from the binarization unit 11. After the context control processing is executed, the context control unit 13 performs update processing by replacing, with the new symbol occurrence probability PE, the symbol occurrence probability PE identified in the context control processing from among the contexts ctxIdx stored in the symbol occurrence probability storage unit 12.

The binary arithmetic encoder 14 generates an output signal OB by performing arithmetic coding on the binary signal BIN input from the binarization unit 11, based on the symbol occurrence probability PE read out by the context control unit 13, and outputs the generated output signal OB.

Next, a flow of arithmetic coding procedure is described with reference to FIG. 2.

The arithmetic coding unit 10 starts the arithmetic coding upon receiving the input signal SI, the block size signal BLKS, and the signal type information SE.

Upon the arithmetic coding is started, in Step 11, the binarization unit 11 executes binarization using a predetermined approach according to the signal type information SE.

In Step S12, the context control unit 13 obtains the block size of the input signal SI based on the block size signal BLKS, and obtains the position of the coefficient as a condition, based on the signal type information SE. Furthermore, the context control unit 13 identifies the context ctxIdx corresponding to the block size and condition of the input signal SI, based on the context table stored in the symbol occurrence probability storage unit 12. Furthermore, the context control unit 13 further identifies the symbol occurrence probability PE based on the signal information table shown in FIG. 4, and causes the symbol occurrence probability storage unit 12 to output the identified symbol occurrence probability PE to the binary arithmetic encoder (context control processing).

In Step S13, the binary arithmetic encoder 14 performs arithmetic coding on the binary signal BIN using the symbol occurrence probability PE received from the symbol occurrence probability storage unit 12 in Step S12, and outputs the result as the output signal OB.

In Step S14, the context control unit 13 calculates a new symbol occurrence probability PE based on the binary signal BIN calculated by the binarization unit 11 in Step S11, and updates the value of the corresponding occurrence probability pStateIdx in the signal information table stored in the symbol occurrence probability storage unit 12. Upon the arithmetic coding on the input signal SI is completed, arithmetic coding on a next signal to be processed (not shown) is performed.

As described above, the conventional technique shown in FIG. 1 and FIG. 2 sets contexts for different block sizes and conditions. In other words, contexts a set based on very fine classifications.

However, it is highly likely that very fine classifications produce contexts which have a low occurrence frequency for update processing of the symbol occurrence probability PE. A context having a low occurrence frequency for update processing decreases an accuracy of the symbol occurrence probability PE. This makes it difficult to perform control adapted to features of an image although such control is an advantageous effect of the arithmetic coding. As a result, the coding efficiency is decreased.

For this reason, such classifications need to be set appropriately in order to increase the accuracy of the symbol occurrence probabilities PE and to thereby perform control adapted to the features of the image.

The conventional video coding standard supports only limited block sizes such as a 4×4 block size and an 8×8 block size. However, recently, there is a demand for supporting other block sizes such as a 16×16 block size and a 32×32 block size. An increase in the number of block sizes significantly increases the number of contexts. Thus, conventionally, there is a problem that the update frequency of the symbol occurrence probability PE may be further decreased.

Hereinafter, embodiments of the present invention are described with reference to the drawings. It is to be noted that each of the embodiments described below shows a preferred specific example of the present invention. The values, shapes, materials, structural elements, the arrangement and positions of the structural elements, the connection states of the structural elements, the steps, the order of the steps are all examples, and thus should not be interpreted as limiting the present invention. The present invention is limited based only on the scope of the Claims. Therefore, the structural elements which are not defined in independent Claims each of which indicates the most generic concept of the present invention among the structural elements in the embodiments indicated below are not always necessary for achieving the aim of the present invention, but explained as constituting the preferred embodiments.

Embodiment 1

Embodiment 1 relating to an image coding method and an image coding apparatus according to the present invention is described with reference to FIG. 3 to FIG. 8.

The image coding method according to the present invention particularly relates to an arithmetic coding method as an example of entropy coding among compression coding composed of prediction, transform and quantization, entropy coding, and the like performed on a current signal to be coded of an image. In addition, the image coding apparatus according to the present invention is configured to include a prediction unit, a transform and quantization unit, and an arithmetic coding unit (entropy coding unit) which executes the arithmetic coding method. The overall structure of the image coding apparatus is described later.

(Outline of Embodiment 1)

The outline of an arithmetic coding method and an arithmetic coding unit according to Embodiment 1 is firstly described. Here, a description is given of a case where a signal indicating whether a current one of the quantized coefficients of frequency components generated through transform and quantization is a zero coefficient or a non-zero coefficient is input as an input signal SI to the arithmetic coding unit.

In the case where the input signal SI is a signal corresponding to a high frequency component, for example, when the block size is a large block size larger than a 16×16 block size, the symbol occurrence probability PE is determined based on a surrounding condition. In other words, the high frequency components in the blocks having a 16×16 block size or larger have the same statistical properties of the image, and thus the same context is applicable thereto when the conditions (surrounding conditions) are the same even if the block sizes are different.

In contrast, in the case where the input signal SI corresponds to a low frequency component in a block having a large size, the symbol occurrence probability PE is determined based on the position of the coefficient. More specifically, the signal corresponding to the low frequency component including an orthogonal component is (i) a signal having a high likelihood of having the features of the image and (ii) a part from which the statistical information can be easily obtained because of a high presence frequency of a signal of SignificantFlag. For this reason, in the case of the input signals SI corresponding to the low frequency components in the large block sizes, it is possible to perform arithmetic coding using the statistical information adapted to the features of the image more significantly than conventional by setting different contexts without setting a shared context when the block sizes are different even when the conditions (the positions of the coefficients) are the same. This makes it possible to increase the coding efficiency.

As described above, in Embodiment 1, (i) in the case of the input signals SI of high frequency components in large blocks having a large block size, the context which is set for the same condition is partly or fully shared between the blocks having different block sizes, and (ii) in the case of the input signal SI of a low frequency component in the block having a large block size and the input signal SI of a low frequency component in the block having a small block size, contexts are set for the respective block sizes and conditions without context sharing between the blocks.

Here, there is little disadvantage of using such a shared context for the low frequency components in the blocks having a large block size. Thus, it is also good to use a shared context for the input signals SI corresponding to the blocks having the large block size irrespective of whether each of the input signals SI corresponds to a low frequency component or a high frequency component. A preferable method of selecting context sharing targets is to set the targets according to the input signals SI which are the coding target signals and the details of the signal type information SE.

(Structure of Arithmetic Coding Unit in Embodiment 1)

Next, a description is given of the structure of an arithmetic coding unit which performs an arithmetic coding method according to Embodiment 1.

Figure 3:
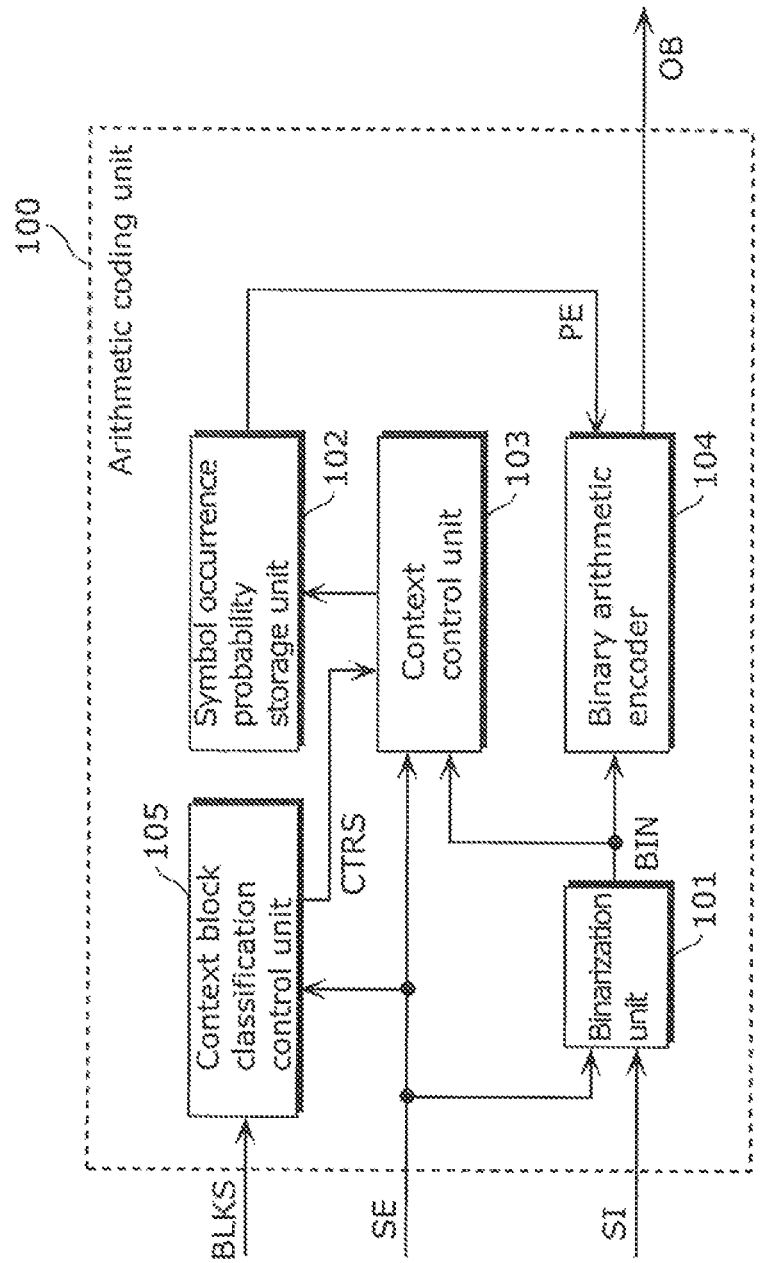
FIG. 3 is a block diagram showing an example of a structure of an arithmetic coding unit of an image coding apparatus according to the present invention.

Here, FIG. 3 is a block diagram showing an example of the structure of the arithmetic coding unit 100 according to Embodiment 1.

As shown in FIG. 3, the arithmetic coding unit 100 includes a binarization unit 101, a symbol occurrence probability storage unit 102, a context control unit 103, a binary arithmetic encoder 104, and a context block classification control unit 105.

The arithmetic coding unit 100 generates an output signal OB by executing arithmetic coding on an input signal SI which is a current signal to be coded, and outputs the generated output signal OB. In Embodiment 1, the arithmetic coding unit 100 receives, as inputs, the input signal SI, a signal type information SE indicating the type of the input signal SI, and a block size signal BLKS indicating the block size of the input signal SI.

Here, in Embodiment 1, descriptions are given assuming a case where the input signal SI is a signal indicating whether a current one of the quantized coefficients of frequency components generated by quantizing the image is a zero coefficient or a non-zero coefficient (a signal called SignificantFlag in H.264). It is to be noted that the input signal SI is not limited thereto, and may be a raw quantized coefficient or may be information used to generate the quantized coefficient.

In addition, the signal type information SE is information indicating the properties of the input signal SI which is the current signal to be coded. More specifically, in Embodiment 1, descriptions are given assuming a case where the input signal SI is a position information indicating the position of the quantized coefficient and information (a surrounding condition) indicating whether the quantized coefficients surrounding the current quantized coefficient are zero or non-zero. It is to be noted that the signal type information SE is not limited thereto, and may be, for example, information indicating whether the direct component of the quantized coefficient is zero or non-zero, or may be information indicating a prediction direction in the case where the prediction method applied to the input signal SI is intra prediction.

Embodiment 1 is configured to receive block size signals BLKS assuming that contexts are set suitably for block sizes. However, it is possible to configure an embodiment which does not use such block size signals BLKS in the case of setting contexts according to other features of the image.

The binarization unit 101 generates a binary signal by performing binarization on the current signal to be coded. More specifically, the binarization unit 101 generates a binary signal BIN by performing binarization for converting the input signal SI which is the current signal to be coded into binary information (a symbol) of "0" or "1", based on the signal type information SE. The binarization unit 101 sends the generated binary signal BIN to the binary arithmetic encoder 104 and the context control unit 103.

The symbol occurrence probability storage unit 102 is a storage unit configured with a non-volatile memory or the like, and stores a signal information table and a plurality of context tables. Here, the plurality of context tables is generated and stored in advance. The same plurality of context tables are stored also in the symbol occurrence probability storage unit 302 which constitutes an image decoding apparatus according to Embodiment 2 described later. The symbol occurrence probability storage unit 102 further stores an occurrence probability table (not shown) indicating a value of one of the symbol occurrence probabilities PE which corresponds to the probability information pStateIdx.

The signal information table is the same as a conventional signal information table shown in FIG. 4, and stores indices ctxIdx indicating contexts, occurrence probabilities pStateIdx, and symbols valMPS in an associated manner.

Here, the table storing the occurrence probabilities pStateIdx which are indices indicating the symbol occurrence probabilities PE and ctxIdx indicating the contexts in an associated manner is used as the signal information table. However, it is noted that a table storing contexts ctxIdx and the values of symbol occurrence probabilities PE in a directly associated manner may be used instead. In this case, it is possible to handle values finer than values managed in the table by representing the values of the symbol occurrence probabilities PE, for example, at a 16-bit accuracy (0-65535), and to thereby increase the coding efficiency.

In Embodiment 1, the context table is composed of a plurality of tables in which contexts ctxIds are set according to conditions. The contexts ctxIds are the same as the indices ctxIds in the aforementioned signal information table. Here, each of FIG. 5B and FIG. 5C shows an example of a context table for use in Embodiment 1.

In Table 3 of FIG. 5B, (i) a context ctxIds 0 is set for a condition 10 indicating the position of a coefficient corresponding to a low frequency component, (ii) a context ctxIds 1 is set for a condition 11 indicating the position of a coefficient corresponding to a low frequency component, and (iii) a context ctxIds 2 is set for conditions 12 and 13 each indicating a surrounding condition corresponding to high frequency components. In addition, in Table 4, (i) a context ctxIds 3 is set for a condition 14 indicating the position of a coefficient corresponding to a low frequency component, (ii) a context ctxIds 4 is set for a condition 15 indicating the position of a coefficient corresponding to a low frequency component, and (iii) a context ctxIds 2 is set for conditions 16 and 17 each indicating a surrounding condition corresponding to high frequency components.

Here, the index ctxIdx associated with the high frequency components (the conditions are 12 and 13) in Table 3 and the index ctxIdx associated with the high frequency components (the conditions are 16 and 17) in Table 4 are set to have the same value 2. In this way, the block size corresponding to Table 3 and the block size corresponding to Table 4 share the context for the input signals SI corresponding to high frequency components.

The context table shown in FIG. 5C is a variation example of the context table shown in FIG. 5B, and is composed of three Tables 5 to 7. Table 5 and Table 6 are used for setting contexts based on block sizes. Specifically, Table 5 and Table 6 correspond to a block size A (for example, a 4×4 small block size) and a block size B (for example, an 8×8 small block size), respectively. In addition, Table 7 is used to set a shared context irrespective of the block size of the input signal SI and whether the input signal SI is a low frequency component or a high frequency component. For example, Table 7 corresponds to a large block size such as a block size C (for example, a 16×16 block size), a block size D (for example, a 32×32 block size), and a block size E (for example, a 64×64 block size). The settings for Table 5 and Table 6 are the same as the settings for Table 1 and Table 2. In Table 7, a context ctxIds 18 is set for a condition 18, and a context ctxIds 19 is set for a condition 19.

It is to be noted in Embodiment 1 that conditions are determined according to one of (i) information (a surrounding condition) of bits surrounding a current signal to be coded in a macroblock, (ii) information related to bits already subjected to arithmetic coding in the macroblock, and (iii) the bit position (position information, coefficient information) of the current signal to be coded.

The context control unit 103 executes context control processing for identifying a symbol probability PE for use in the binary arithmetic encoder 104 and update processing for updating the symbol occurrence probability PE.

A description is given of context control processing by the context control unit 103. The context control unit 103 obtains a control signal CTRS which is output from a context block classification control unit 105 which is described later, and obtains a table to be used from among the context tables in the symbol occurrence probability storage unit 102. Furthermore, the context control unit 103 identifies the context ctxIdx corresponding to the condition identified based on the signal type information SE, with reference to the identified table in the symbol occurrence probability storage unit 102.

Next, the context control unit 103 obtains an occurrence probability pStateIdx corresponding to the index ctxIdx with reference to the signal information table. The context control unit 103 identifies a symbol occurrence probability PE for use in the binary arithmetic encoder 104, with reference to the occurrence probability table stored in the symbol occurrence probability storage unit 102, based on the occurrence probability pStateIdx. Furthermore, the context control unit 103 causes the symbol occurrence probability storage unit 102 to output the identified symbol occurrence probability PE to the binary arithmetic encoder 104.

Next, a description is given of update processing by the context control unit 103. The update processing by the context control unit 103 is performed based on the H.264 Standard. More specifically, the context control unit 103 derives a new symbol occurrence probability PE and a symbol valMPS, based on a binary signal BIN which is input from the binarization unit 101. The context control unit 103 replaces, with the value corresponding to the new symbol occurrence probability PE, the value of the occurrence probability pStateIdx corresponding to the context ctxIdx identified in the context control processing, in the signal information table shown in FIG. 4 stored in the symbol occurrence probability storage unit 102.

The binary arithmetic encoder 104 generates an output signal OB by performing arithmetic coding on the binary signal input from the binarization unit 101, using the symbol occurrence probability PE read out from the symbol occurrence probability storage unit 102 by the context control unit 103, and outputs the generated output signal OB.

In Embodiment 1, the context block classification control unit 105 determines a table from among the context tables in the symbol occurrence probability storage unit 102 based on the block size signal BLKS and the signal type information SE, generates a control signal CTRS indicating the determined table, and outputs the control signal CTRS to the context control unit 103.

(Processing Procedure in Embodiment 1)

Next, a description is given of the structure of an arithmetic coding method performed by the arithmetic coding unit 100 according to Embodiment 1.

Figure 6:
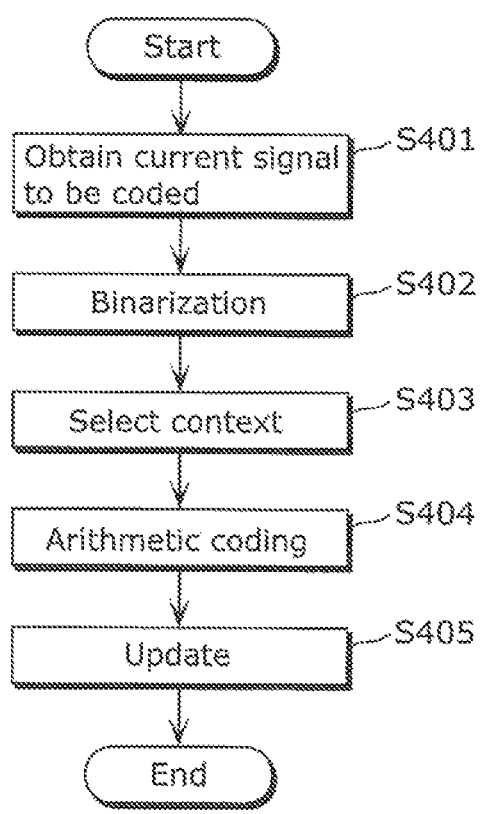
FIG. 6 is a flowchart indicating a processing procedure in an arithmetic coding method in an/the image coding method according to the present invention.

Here, FIG. 6 is a flowchart indicating a processing procedure in an arithmetic coding method according to the present invention. The image coding method according to the present invention is configured to include: a current signal to be coded obtaining step of obtaining a current signal to be coded of an image (Step S401); a binarization step of generating a binary signal by binarizing the current signal to be coded (Step S402); a context selecting step of selecting a context for the current signal to be coded (Step S403); an arithmetic coding step of performing arithmetic coding of the binary signal, using coded probability information associated with the context selected in the context selecting step (Step S404); and an update step of updating the coded probability information associated with the context selected in the context selecting step, based on the binary signal (Step S405), and to select, in the context selecting step, the context of the current signal to be coded such that the context is shared by another signal to be coded included in a processing unit having a processing unit size different from the size of a processing unit including the current signal to be coded.

Figure 7:
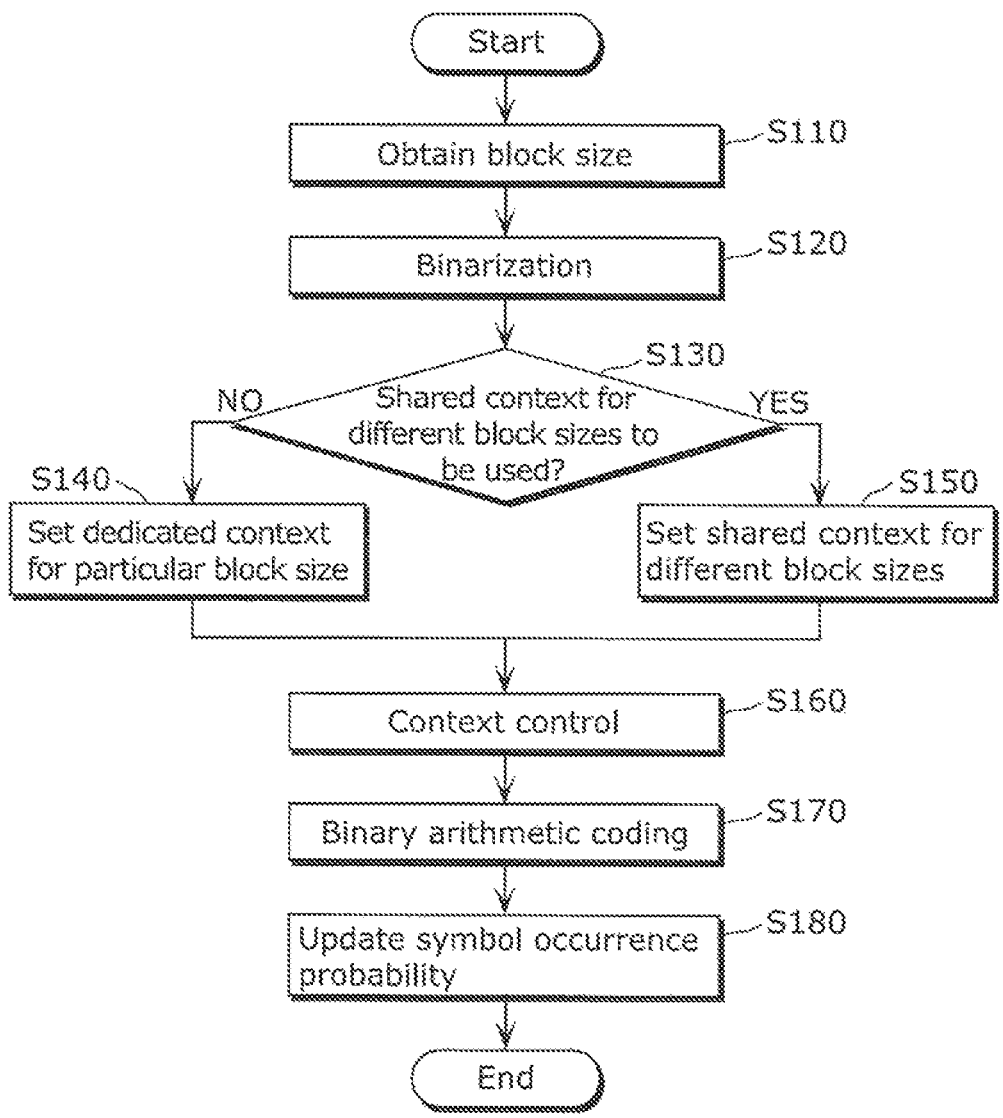
FIG. 7 is a flowchart indicating a processing procedure in an/the arithmetic coding method in an/the image coding method according to the present invention.

FIG. 7 is a flowchart indicating, in more detail, the outline of the processing procedure of the arithmetic coding method according to Embodiment 1. Here, the flowchart in FIG. 7 indicates the arithmetic coding processing performed on a single input signal (a current signal to be coded). The input signal SI is generated for each of the frequency components of each of the blocks of an image through transform and quantization. Thus, the arithmetic coding of the whole block is completed when arithmetic coding of all the frequency components is executed. As shown in FIG. 7, when the arithmetic coding is started, the context block classification control unit 105 obtains the block size of the current signal to be coded, based on a block size signal BLKS (Step S110).

The binarization unit 101 obtains the input signal SI which is a coding target and the signal type information SE (the current signal to be coded obtaining step), and performs binarization based on the signal type information SE on the input signal SI according to the H.264 Standard so as to generate a binary signal BIN (Step S120, the binarization step). Here, the signal type information SE includes information indicating a binarization scheme.

Next, the context block classification control unit 105 determines whether or not to use a shared context for different block sizes, based on the block size and the signal type information SE obtained in Step S110 (Step S130).

When the context block classification control unit 105 determines to use a dedicated context for a particular block size (No in Step S130), the context block classification control unit 105 selects the table in which the dedicated context for a particular block size from among the context tables in the symbol occurrence probability storage unit 102, and outputs a control signal CTRS indicating the table to the context control unit 103 (Step S140).

On the other hand, when the context block classification control unit 105 determines to use the shared context for different block sizes (Yes in Step S130), the context block classification control unit 105 selects the table in which the shared context for different block sizes is set from among the context tables in the symbol occurrence probability storage unit 102, and outputs a control signal CTRS indicating the table to the context control unit 103 (Step S150).

The context control unit 103 determines the context table corresponding to the input signal SI from among the context tables stored in the symbol occurrence probability storage unit 102, based on the control signal CTRS (Step S160).

The context control unit 103 determines a context ctxIdx based on a condition determined based on the signal type information SE, with reference to the selected context table (the processing from Step S130 to this point corresponds to the context selecting step, and the context block classification control unit 105 and the context control unit 103 which execute the steps correspond to the context selection control unit). Furthermore, the context control unit 103 identifies a symbol occurrence probability PE corresponding to the context ctxIdx, with reference to the signal information table and the occurrence probability table, reads out the identified symbol occurrence probability PE from the symbol occurrence probability storage unit 102, and outputs the read-out symbol occurrence probability PE to the binary arithmetic encoder 104.

The binary arithmetic encoder 104 generates an output signal OB by performing arithmetic coding of the binary signal based on the symbol occurrence probability PE read out by the context control unit 13, and outputs the generated output signal OB (Step S170, the arithmetic coding step).

The context control unit 103 executes update processing of updating the symbol occurrence probability PE based on the binary signal generated by the binarization unit 101 (Step S180, the update step).

Next, descriptions are given of details (corresponding to Steps S130 to S160) of operations performed by the context block classification control unit 105, with reference to FIG. 8 to FIG. 11.

Here, each of FIG. 8, FIG. 9, FIG. 10A, and FIG. 10B is a flowchart indicating an example of operations by the context block classification control unit 105 according to Embodiment 1.

Figure 11:
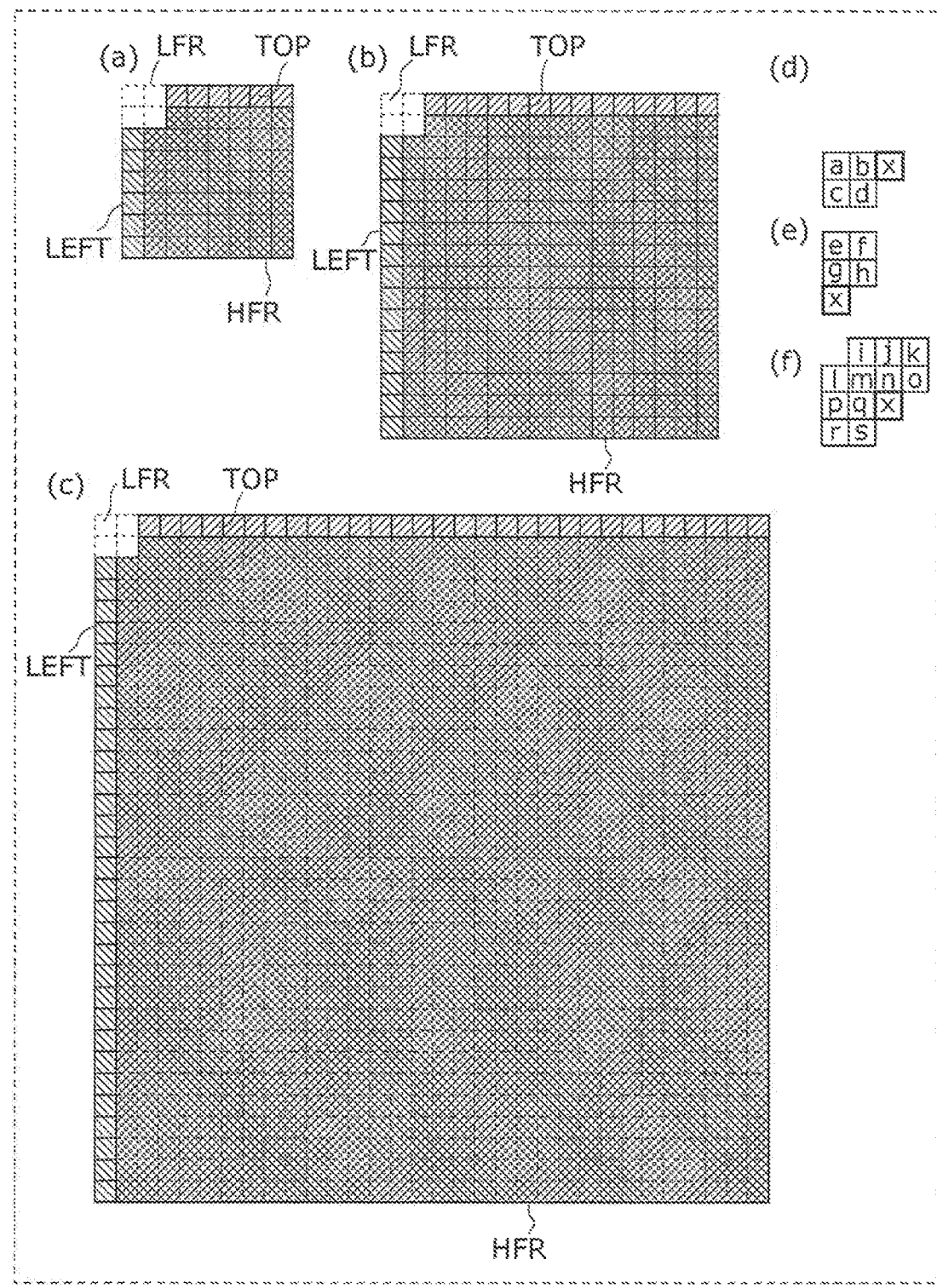
FIG. 11 is a schematic diagram illustrating a surrounding condition calculation method in an/the image coding method and an/image coding apparatus according to the present invention.

Each of (a) to (c) of FIG. 11 is a schematic diagram showing the positional relationships of quantized coefficients in a corresponding one of blocks having an 8×8, 16×16, or 32×32 block size.

Operation Example 1

Figure 8:
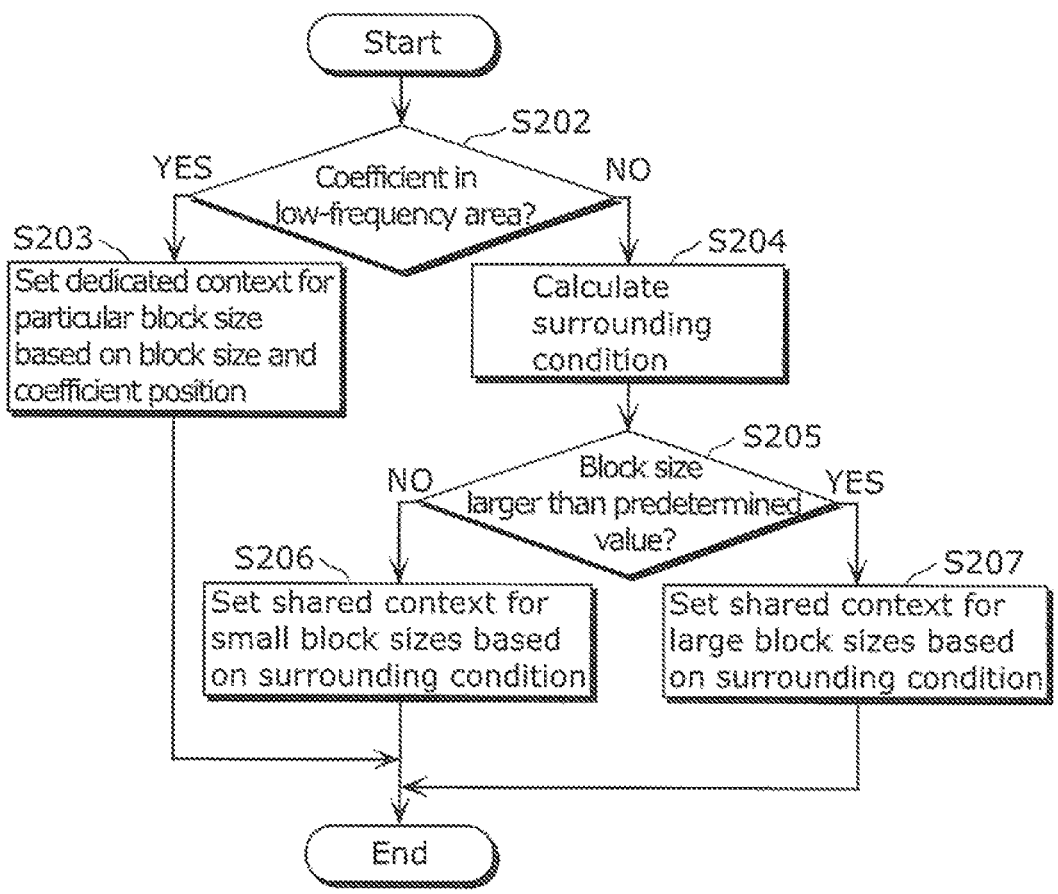
FIG. 8 is a flowchart indicating an example of a processing procedure in a context block classification control unit which constitutes an/the image coding method and an/image coding apparatus according to the present invention.

In FIG. 8, the context block classification control unit 105 firstly determines the coefficient position based on the signal type information SE, and determines whether the coefficient position of the input signal SI which is the current signal to be coded is included in the low frequency area or in the high frequency area (Step S202).

Here, as described above, the quantized coefficients correspond to signals generated by performing frequency transform and quantization on the image, and the coefficient positions correspond to the frequency components in the frequency transform. For example, in the schematic diagram shown as each of (a) to (c) in FIG. 11, the quantized coefficients corresponding to the low frequency components are located at the upper left portion, and the quantized coefficients corresponding to the high frequency components are located at the lower right portion. More specifically, in an exemplary case where a coefficient position is one of coefficient positions in a 2×2 block including al least one direct component, in particular, a case where a coefficient position is one of the positions shown as LFR in the schematic diagram shown as each of (a) to (c) in FIG. 11, it is determined that the input signal SI is a coefficient corresponding to a low frequency component. In the case where the coefficient position is one of the coefficient positions shown as a symbol other than LFR in each of (a) to (c) in FIG. 11, it is determined that the input signal SI is a coefficient corresponding to a high frequency component.

In the case where the input signal SI is a coefficient corresponding to the low frequency component (YES in Step S202), the context block classification control unit 105 selects a context table in which the contexts are set based on block sizes, and outputs the information as a control signal CTRS. Here, in the context table, indices ctxIdx for the low frequency components are set further based on the conditions respectively determined based on the coefficient positions. Accordingly, as a result, the context control unit 103 sets the context for the input signal SI according to the block size and the coefficient position (Step S203).

On the other hand, in the case where the input signal SI is a coefficient corresponding to the high frequency component (NO in Step S202), the context block classification control unit 105 calculates a surrounding condition of the current signal to be coded (Step S204). The method for calculating the surrounding condition is described later.

Next, the context block classification control unit 105 determines whether or not the block size of the current signal to be coded is larger than a predetermined size (Step S205).

In the case where the block size of the input signal SI is smaller than, for example, a 16×16 block size (NO in Step S205), the context block classification control unit 105 selects a shared context table for small block sizes, and outputs the information as a control signal CTRS. Here, in the context table, indices ctxIdx for the high frequency components are set further based on the conditions respectively determined based on the surrounding conditions. Accordingly, as a result, the context control unit 103 sets the context for small size blocks, based on the surrounding condition (Step S206).

In the case where the block size of the input signal SI is larger than the predetermined size (YES in Step S205), the context block classification control unit 105 selects a shared context table for large block sizes, and outputs the information as a control signal CTRS. Here, in the context table, indices ctxIdx for the high frequency components are set further based on the conditions respectively determined based on the surrounding conditions. Accordingly, as a result, the context control unit 103 sets the context for large size blocks, based on the surrounding condition (Step S207).

Here, it is possible to further increase the coding efficiency by making it possible to select 16×16, 32×32, and 64×64 block sizes as frequency transform sizes, although, in H.264, only the quantized coefficients in blocks each having a 4×4 or 8×8 block size are defined. However, when the number of selectable block sizes is increased, too fine contexts are set for the respective block sizes. Thus, the use frequency of each of the contexts is significantly decreased. For this reason, a shared context is used for input signals having the same statistical properties even when the block sizes are different according to the aforementioned method. More specifically, in Operation Example 1, a context is shared between large blocks having a large block size and another context is shared between small blocks having a small block size such that, for example, the context for small blocks is used for blocks each having a 4×4 or 8×8 block size, and the context for large blocks is used for blocks each having a 16×16, 32×32, or 64×64 block size. This makes it possible to perform arithmetic coding of the image using the statistical properties adapted to the features of the image, and concurrently, to increase the use frequency of each of the contexts and to thereby increase the coding efficiency. In the above example, it is possible, to select a 4×4, 8×8, 16×16, 32×32, and 64×64 block sizes as sizes in frequency transform. However, the selectable sizes are not limited thereto. Such selectable sizes can be arbitrarily set, for example, a 4×4, 8×8, 16×16, and 32×32 block sizes can be set.

Operation Example 2

Figure 9:
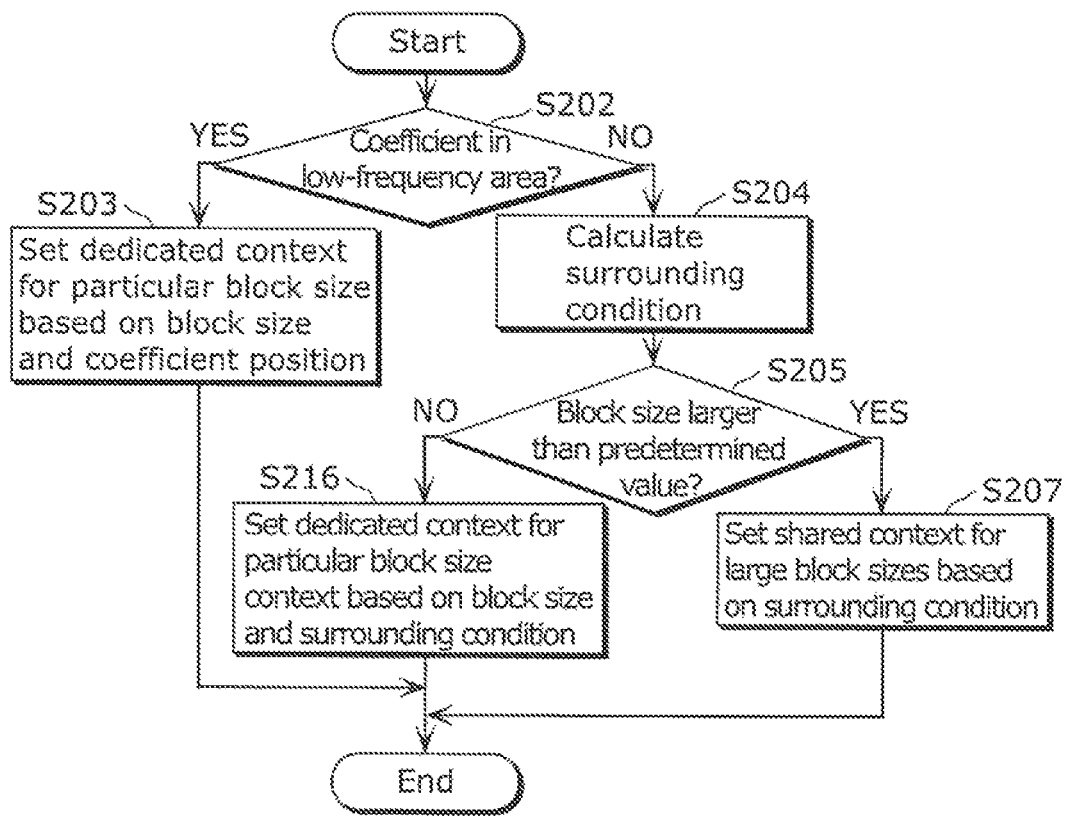
FIG. 9 is a flowchart indicating an example of a processing procedure in a context block classification control unit which constitutes an/the image coding method and an/image coding apparatus according to the present invention.

In FIG. 9, the context block classification control unit 105 firstly determines, based on the signal type information SE, a coefficient position of an input signal SI which is the current signal to be coded, and determines whether the input signal SI is included in the low frequency area or in the high frequency area (Step S202). Here, the determination method is the same as in Operation Example 1.

In the case where the input signal SI is a coefficient corresponding to a low frequency component (YES in Step S202), the context block classification control unit 105 selects a context table set for the block size, and outputs the information as a control signal CTRS. Here, in the context table, indices ctxIdx for the low frequency components are set further based on the conditions respectively determined based on the coefficient positions. Accordingly, as a result, the context control unit 103 sets the context according to the block size and the coefficient position (Step S203).

On the other hand, in the case where the input signal SI is a coefficient corresponding to the high frequency component (NO in Step S202), the context block classification control unit 105 calculates a surrounding condition of the current signal to be coded (Step S204). The method for calculating the surrounding condition is described later.

Next, the context block classification control unit 105 determines whether or not the block size of the current signal to be coded is larger than a predetermines size (Step S205).

In the case where the block size of the input signal SI is smaller than, for example, a 16×16 block size (NO in Step S205), the context block classification control unit 105 selects a context table for the block size, and outputs the information as a control signal CTRS. In other words, a context table for a block having a 4×4 block size and a context table for a block having an 8×8 block size are separately selected. Accordingly, the context control unit 103 sets the different contexts for the respective block sizes and conditions (Step S216). In the case where the block size is small, the input images SI may have different image features such as detailed image contents. Thus, it is possible to execute arithmetic coding more suitably adapted to the features of the image by performing a variation example as shown in FIG. 9.

In the case where the block size of the input signal SI is larger than the predetermined size (YES in Step S205), the context block classification control unit 105 selects a shared context table for large block sizes, and outputs the information as a control signal CTRS. In other words, a shared context table for blocks each having a 16×16, 32×32, or 64×64 block size is determined as the context to be used. Here, in the context table, indices ctxIdx for the high frequency components are set further based on the conditions respectively determined based on the surrounding conditions. Accordingly, as a result, the context control unit 103 sets the context for large size blocks, based on the surrounding condition (Step S207).

In the above example, it is possible, to select a 4×4, 8×8, 16×16, 32×32, and 64×64 block sizes as sizes in frequency transform. However, the selectable sizes are not limited thereto. Such selectable sizes can be arbitrarily set, for example, a 4×4, 8×8, 16×16, and 32×32 block sizes can be set.

Operation Example 3

Figure 10A:
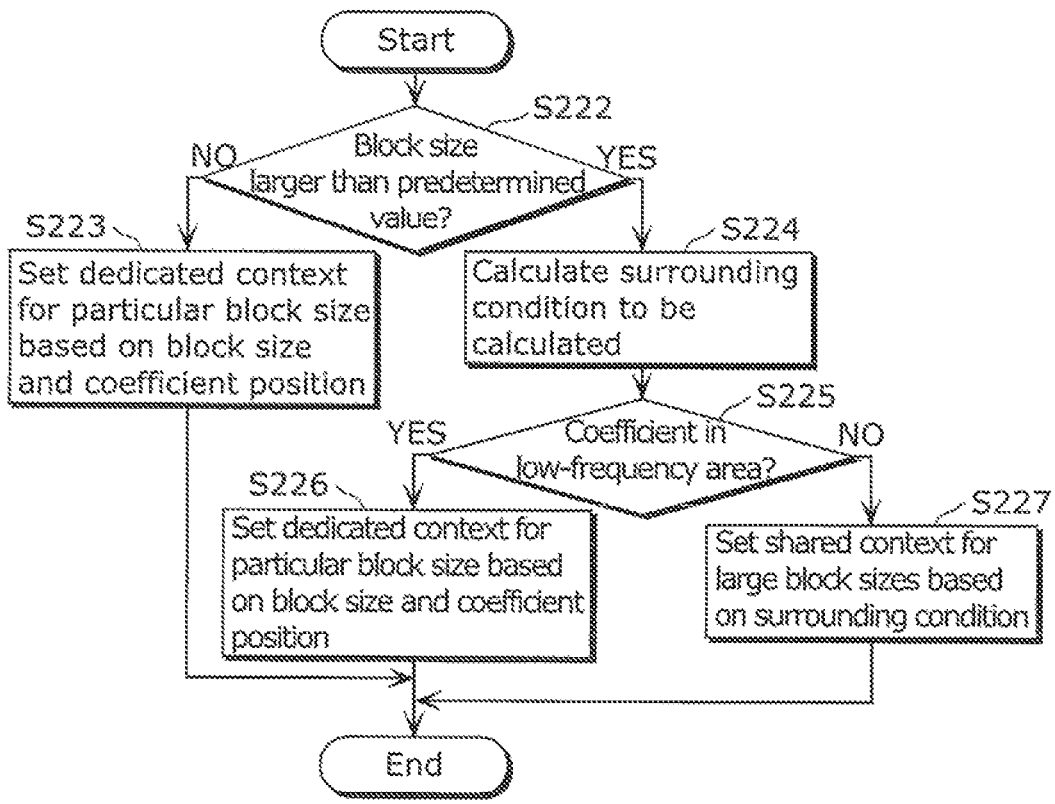
FIG. 10A is a flowchart indicating an example of a processing procedure in a context block classification control unit which constitutes an/the image coding method and an/image coding apparatus according to the present invention.

FIG. 10A is a flowchart obtained by switching Step S202 and Step S205 in FIG. 9. FIG. 10A and FIG. 9 shows substantially the same operations.

In FIG. 10A, the context block classification control unit 105 firstly determines whether or not the block size of the input signal SI which is a current signal to be coded is larger than a predetermined size (corresponding to Step S222 and S205 in FIG. 9). The following describes an assumed case where the predetermined size is the 8×8 block size.

In the case where the block size of the input signal SI is smaller than the predetermined size (NO in Step S222), the context block classification control unit 105 selects a context table for the block size, and outputs the information as a control signal CTRS. As described in the Outline of Embodiment 1, Embodiment 1 assumes a case where no context sharing is performed for the input signals SI included in a block having a small block size and different contexts are set for the input signals SI based on the respective block sizes and conditions. In other words, the contexts for the small blocks are determined substantially based on the respective block sizes and the respective coefficient positions. Accordingly, as a result, the context control unit 103 sets different contexts for the respective block sizes and coefficient positions (Step S223).

On the other hand, in the case where the block size of the input signal SI is larger than the predetermined size (YES in Step S222), the context block classification control unit 105 calculates a surrounding condition for the current signal to be coded (Step S224). The method for calculating the surrounding condition is described later.

Next, the context block classification control unit 105 determines whether the input signal SI is a quantized coefficient corresponding to a low frequency component or a quantized coefficient corresponding to a high frequency component (corresponding to Step S225, and Step S202 in FIG. 9).

In the case where the input signal SI is a signal corresponding to the low frequency component (YES in Step S225), the context block classification control unit 105 selects a context table in which the context for the block size is set, and outputs the information as a control signal CTRS. Here, in the context table, indices ctxIdx for the low frequency components are set further based on the conditions respectively determined based on the coefficient positions. Accordingly, as a result, the context control unit 103 sets contexts according to the coefficient positions and block sizes (Step S226).

In the case where the input signal SI is a signal corresponding to a high frequency component (No in Step S225), the context block classification control unit 105 selects a shared context table for large block sizes, and outputs the information as a control signal CTRS. Here, in the context table, indices ctxIdx for the high frequency components are set for the conditions respectively determined based on the surrounding conditions. Accordingly, as a result, the context control unit 103 sets the context for large size blocks, based on the surrounding condition (Step S227).

In the above example, it is possible, to select a 4×4, 8×8, 16×16, 32×32, and 64×64 block sizes as sizes in frequency transform. However, the selectable sizes are not limited thereto. Such selectable sizes can be arbitrarily set, for example, 4×4, 8×8, 16×16, and 32×32 block sizes can be set.

Operation Example 4

Figure 10B:
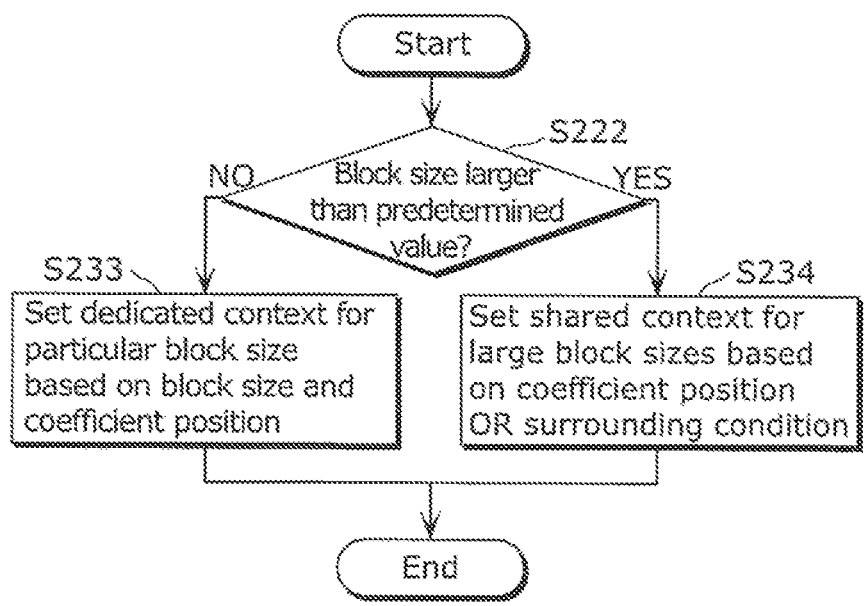
FIG. 10B is a flowchart indicating an example of a processing procedure in a context block classification control unit which constitutes an/the image coding method and an/image coding apparatus according to the present invention.

FIG. 10B is a flowchart in the case where a shared context is used for input signals SI each corresponding to a large block size irrespective of whether each of the input signals SI is a low frequency component or a high frequency component.

In FIG. 10B, the context block classification control unit 105 firstly determines whether or not the block size of the input signal SI which is a current signal to be coded is larger than a predetermined size (corresponding to Step S222 and S205 in FIG. 9). The following describes an assumed case where the predetermined size is the 8×8 block size.

In the case where the block size of the input signal SI is smaller than the predetermined size (NO in Step S222), the context block classification control unit 105 selects a context table in which the context for the block size is set, and outputs the information as a control signal CTRS. Here, as with Operation Example 3, Operation Example 4 assumes a case where no context sharing is performed for the input signals SI included in a block having a small block size, and contexts are set for the respective block sizes and conditions. In other words, the contexts for the small blocks are determined substantially based on the respective block sizes and the respective coefficient positions. Accordingly, the context control unit 103 sets different contexts for the respective block sizes and coefficient positions (Step S233).

In the case where the block size of the input signal SI is larger than the predetermined size (YES in Step S222), the context block classification control unit 105 selects a shared context table for large block sizes, and outputs the information as a control signal CTRS. Here, in the context table, indices ctxIdx for the low frequency components are set further based on the conditions respectively determined based on the coefficient positions, and indices ctxIdx for the high frequency components are set further based on the conditions respectively determined based on the surrounding conditions. Accordingly, as a result, the context control unit 103 sets the context for large size blocks, based on the coefficient position and the surrounding condition (Step S234).

In Operation Example 4, as mentioned above, context sharing is performed only for large block sizes (in Embodiment 4, the large block sizes are, for example, a 16×16, 32×32, 64×64 block sizes etc. which are larger than the 8×8 block size). In other words, different contexts are selected for the respective small block sizes. In this way, it is possible to select a context adapted to the features of the image, for each of the small blocks each having a comparatively large change. Furthermore, it is possible to increase the update frequency of the symbol occurrence probability by performing context sharing for large blocks each having a comparatively small change, and to thereby increase the coding efficiency.

In the above example, it is possible, to select a 4×4, 8×8, 16×16, 32×32, and 64×64 block sizes as sizes in frequency transform. However, the selectable sizes are not limited thereto. Such selectable sizes can be arbitrarily set, for example, a 4×4, 8×8, 16×16, and 32×32 block sizes can be set.

(Calculation of Surrounding Conditions)

A detailed description is given based on FIG. 11. In each of (a) to (c) of FIG. 11, the upper left 4×4 area LFR is a low frequency area corresponding to a signal of a low frequency component. In each of the above-described Operation Examples 1 to 3, a context table for the block size is selected. In the context table selected here, the indices ctxIdx indicating contexts are set for conditions determined based on coefficient positions, and a context is determined according to the block size and coefficient position.

On the other hand, the area other than the area LFR is a high frequency area corresponding to a signal of a high frequency component. Here, the high frequency area is further segmented into a partial area TOP corresponding to the upper end portion (the portion enclosed by diagonal lines from the upper right to the lower left), a partial area LEFT corresponding to the left end portion (the portion enclosed by diagonal lines from the upper left to the lower right), and a partial area HFR corresponding to the remaining area (the portion enclosed by crossing diagonal lines).

The surrounding conditions are calculated for the respective three partial areas.

First, a description is given of calculating the surrounding condition of the partial area TOP. In the partial area TOP, the surrounding condition corresponding to the coefficient position shown as X in (d) of FIG. 11 is determined based on the number of quantized coefficients of non-zero coefficients among the quantized coefficients at the adjacent coefficient positions a to d. In this case, the values of the surrounding conditions are five kinds ranging from 0 to 4. Here, contexts may be set separately for the respective five kinds of surrounding conditions. For example, it is possible to perform classification into three groups of (0), (1, 2), and (3, 4) and to set three contexts for the respective groups. In the classification, another combination may be used, and an arbitrary number of group may be generated.

Next, a description is given of calculating the surrounding condition of the partial area LEFT. In the partial area LEFT, the surrounding condition corresponding to the coefficient position shown as X in (e) of FIG. 11 is determined based on the number of quantized coefficients of non-zero coefficients among the quantized coefficients at the adjacent coefficient positions e to f. In this case, the values of the surrounding conditions are five types ranging from 0 to 4. As in the case of the partial area TOP, contexts may be set separately for the respective five kinds of surrounding conditions. For example, it is possible to perform classification into three groups of (0), (1, 2), and (3, 4) and to set three contexts for the respective groups. In the classification, another combination may be used, and an arbitrary number of group may be generated.

Next, a description is given of calculating the surrounding condition of the partial area HFR. In the partial area HFR, the surrounding condition corresponding to the coefficient position shown as X in (f) of FIG. 11 is determined based on the number of quantized coefficients of non-zero coefficients among the quantized coefficients at the adjacent coefficient positions i to s.

In this case, the values of the surrounding conditions are twelve types ranging from 0 to 11. As in the case of the partial area TOP and the partial area LEFT, contexts may be set separately for the respective twelve kinds of surrounding conditions. For example, it is possible to perform classification into five groups of (0), (1, 2), (3, 4), (5, 6), and (7, 8, 9, 10, 11) and to set five contexts for the respective groups. In the classification, another combination may be used, and an arbitrary number of group may be generated.

The surrounding conditions calculated according to the aforementioned method are represented, in common, as the numbers of non-zero coefficients located at the positions of the adjacent coefficients. Thus, it is possible to accurately obtain the statistical information without depending on the block sizes even when the block sizes are different. For this reason, it is possible to perform sharing of contexts irrespective of the block sizes, and to increase the coding efficiency by using the small number of contexts.

It is to be noted that the information indicating the combination of contexts may be recorded in the starting portion (stream header) in a bitstream. In this way, it is possible to change the combination of contexts according to the features of an image, and to thereby expect a further increase in the coding efficiency.

In addition, the information indicating whether or not the same context is used for blocks having different block sizes may be recorded in the starting portion (stream header) of a bitstream. In this way, it is possible to change the combination of contexts according to the features of an image, and to thereby expect a further increase in the coding efficiency.

It is to be noted that the unit of recording in the header may be a unit corresponding to a slice or a picture. In this case, it is possible to perform finer control than the control in the case of recording the information in units of a stream, and to thereby expect a further increase in the coding efficiency.

(Variation Example of Context Block Classification Control Unit)

Embodiment 1 describes a case of setting different contexts for input signals SI of low frequency components corresponding to a small block size and a large block size and setting a shared context for input signals SI of high frequency components corresponding to a large block size. However, in the case of large block sizes, it is also good to segment an image into sub blocks (having a small block size) having the same size (corresponding to the segmenting step), and to set a context table for small block sizes which is for each of the sub blocks. In other words, the context is shared by the sub block and blocks having the same small block size as that of the sub block.

More specifically, for example, a block having a 16×16 large block size is segmented into sixteen 4×4 sub blocks, and the context which is used for the blocks having a 4×4 small block size is applied to arithmetic coding for the respective sub blocks.

In this case, the binarization unit 101 generates a binary signal by executing binarization on each of the sub blocks. The binary arithmetic encoder 104 performs arithmetic coding of the binary signal of each of the sub blocks.

With this structure, it is possible to use the context table for small block sizes also for the large block sizes. As a result, it is possible to perform context sharing between the large block sizes and the small block sizes.

(Overall Structure of Image Coding Apparatus)

The arithmetic coding unit 100 according to Embodiment 1 is included in an image coding apparatus which compression codes the image.

The image coding apparatus 200 compression codes the image. For example, the image coding apparatus 200 receives, as input signals, the image in units of a block. The image coding apparatus 200 generates a coded signal by performing a transform and quantization on and a variable length coding of each of the input signals.

Figure 12:
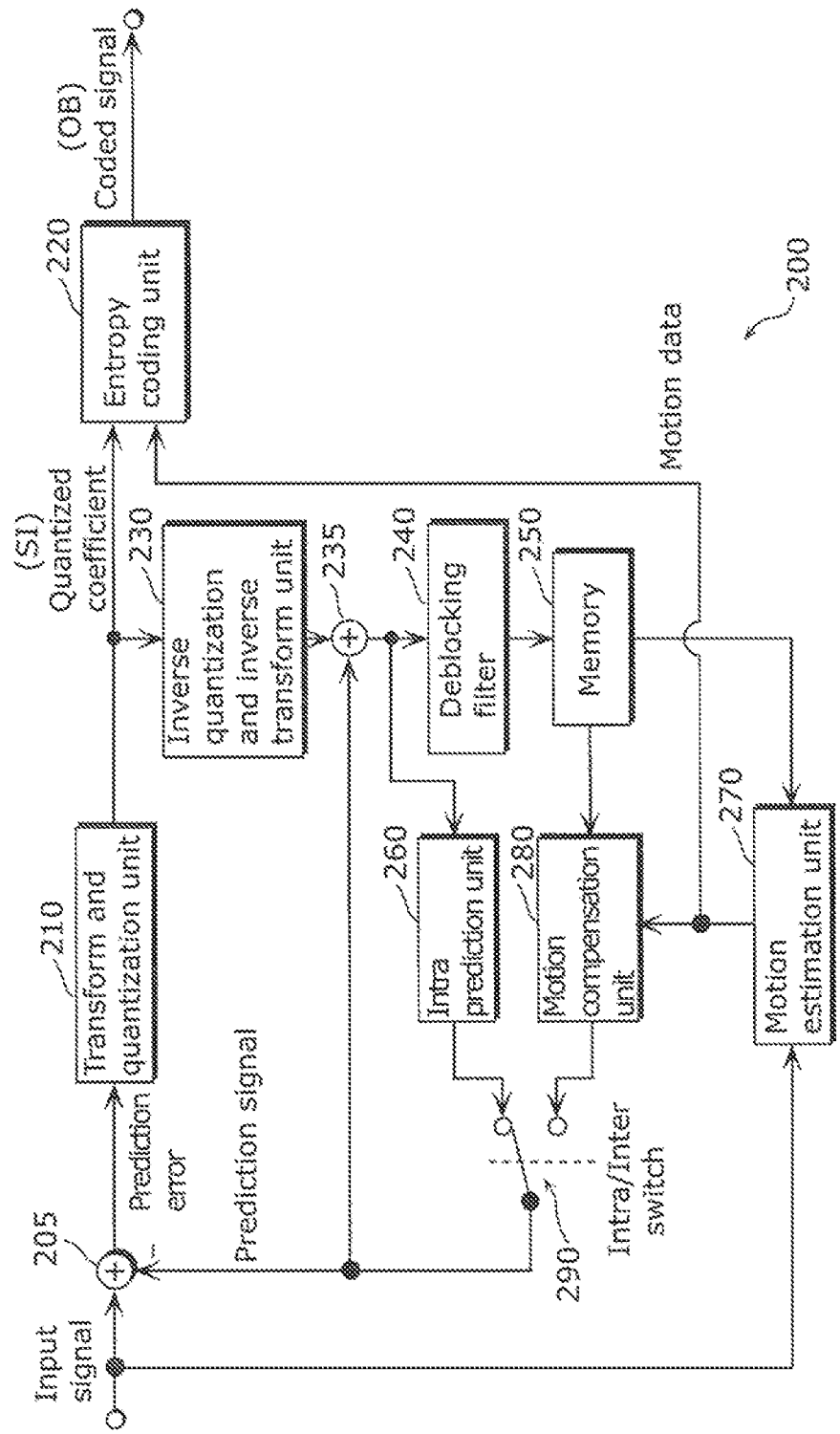
FIG. 12 is a block diagram showing an example of a whole structure of an/the image coding apparatus according to the present invention.

Here, FIG. 12 is a block diagram showing an example of the structure of the arithmetic coding apparatus 200 including the arithmetic coding unit 100 according to Embodiment 1. As shown in FIG. 12, the image coding apparatus 200 includes: a subtractor 205; a transform and quantization unit 210; an entropy coding unit 220 (corresponding to the arithmetic coding unit 100 in FIG. 3); an inverse quantization and inverse transform unit 230; an adder 235; a deblocking filter 240; a memory 250; an intra prediction unit 260; a motion estimation unit 270; a motion compensation unit 280; and an intra/inter switch 290.

The image coding apparatus 200 receives, as the input signals, the image in units of a block.

The subtractor 205 calculates a difference, specifically a prediction error between each of the input signals and a corresponding one of prediction signals.

The transform and quantization unit 210 generates transform coefficients in a frequency area by transforming the prediction error in a spatial domain. For example, the transform and quantization unit 210 generates transform coefficients by performing a Discrete Cosine Transform (DCT) on the prediction error. Furthermore, the transform and quantization unit 210 generates transform coefficients by quantizing the transform coefficients (this process corresponds to the frequency transform step).

The entropy coding unit 220 is configured with the arithmetic coding unit 100 shown in FIG. 3, and generates the coded signal by performing a variable length coding of each of the quantized coefficients. In addition, the entropy coding unit 220 codes motion data (for example, a motion vector) estimated by the motion estimation unit 270, adds the motion data into the coded signal, and outputs the coded signal. More specifically, the arithmetic coding unit 100 which constitutes the entropy coding unit 220 receives each of the quantized coefficients as the input signal SI, and performs binarization and arithmetic coding of the quantized coefficient. In addition, the signal type information SE is information indicating the motion data shown in FIG. 12, intra prediction direction and/or the like used by the intra prediction unit 260 which is described later, in addition to the coefficient position of the quantized coefficient.

The inverse quantization and inverse transform unit 230 reconstructs each of the transform coefficients by performing inverse quantization of the quantized coefficient output by the transform and quantization unit 210. Furthermore, the inverse quantization and inverse transform unit 230 reconstructs a prediction error by performing an inverse transform on the reconstructed transform coefficient. Here, the reconstructed prediction error has suffered from a partial loss of information through quantization, and thus does not completely match the prediction error generated by the subtractor 205. In other words, the reconstructed prediction errors include a quantization error.

The adder 235 generates local decoded images by adding each of the reconstructed prediction errors and a corresponding one of the prediction signals.

The deblocking filter 240 performs deblocking filtering on each of the generated local decoded images.

The memory 250 is a memory for storing reference images for use in motion compensation. More specifically, the memory 250 stores local decoded images subjected to the deblocking filtering.

The intra prediction unit 260 generates prediction signals (intra prediction signals) by performing intra predictions. More specifically, the intra prediction unit 260 generates an intra prediction signal by performing an intra prediction with reference to the images surrounding a current block to be decoded (input signal) in the local decoded image generated by the adder 235.

The motion estimation unit 270 estimates the motion data (for example, the motion vector) between each of the input signals and the reference image thereof stored in the memory 250.

The motion compensation unit 280 generates a prediction signal (an inter prediction signal) by performing motion compensation based on the estimated motion data.

The intra/inter switch 290 selects one of the intra prediction signal and the inter prediction signal, and outputs the selected signal as the prediction signal to the subtractor 205 and the adder 235.

With this structure, the image coding apparatus 200 according to Embodiment 1 compression codes the image.

The arithmetic coding unit 100 and the processing performed thereby in the image coding apparatus and the image coding method according to Embodiment 1 are configured to apply the same context to an image having the same statistical properties even when the block sizes are different. Thus, the number of contexts is reduced, which makes it possible to reduce the size of memory. Furthermore, generally, large block sizes of 16×16 or larger are less likely to occur than small block sizes such as 4×4, 8×8, and the like. For this reason, it is possible to increase the accuracy for the classifications with a low accuracy in the symbol occurrence probability PE by performing context sharing for the large block sizes which are less likely to occur. In other words, it is possible to reflect the statistical information more appropriately to the symbol occurrence probabilities PE as a whole. Therefore, it is possible to increase the coding efficiency.

Embodiment 2

Embodiment 2 of an image decoding method and an image decoding apparatus according to the present invention are described with reference to FIG. 13 to FIG. 16.

The image decoding method according to the present invention relates particularly to an arithmetic decoding method as an example of an entropy decoding, in decoding composed of variable length decoding (such as entropy decoding), inverse quantization and inverse transform, prediction, and the like on a current signal to be decoded of a coded image. In addition, the image decoding apparatus according to the present invention is configured to include an arithmetic decoding unit (entropy decoding unit) which executes the aforementioned arithmetic decoding method, a transform and quantization unit, and a prediction unit. The overall structure of the image decoding apparatus is described later.

(Outline of Embodiment 2)

The outline of an arithmetic decoding method and an arithmetic decoding unit according to Embodiment 2 is firstly described. Here, as in Embodiment 1, a description is given of a case where a signal indicating whether a current one of the quantized coefficients of frequency components generated through transform and quantization is a zero coefficient or a non-zero coefficient is input as an input stream IS to the arithmetic decoding unit.

As described in Embodiment 1, in Embodiment 2, (i) in the case of the input streams IS of high frequency components in large blocks each having a large block size, the context which is set for the same condition is partly or fully shared between the large blocks which have the same statistical properties even when the block sizes are different, and (ii) in the case of the input stream IS of low frequency components in the block having a large block size and the input stream IS of low frequency components in the block having a small block size, contexts are set for the respective block sizes and conditions without context sharing between the blocks even when the conditions are the same.

In this way, it is possible to appropriately decode the coded image coded more efficiently than the coded image in Embodiment 1.

In the case where, in Embodiment 1, a shared context is used for input streams IS each corresponding to a large block size irrespective of whether each of the input streams IS corresponds to a low frequency component or a high frequency component, the image decoding method and the image decoding apparatus in Embodiment 2 may use the shared context for the input streams IS corresponding to the large block size. The method of selecting targets for context sharing is preferably set according to the selection method in the image coding method and the image coding apparatus in Embodiment 1.

(Structure of Arithmetic Decoding Unit in Embodiment 2)

Next, a description is given of the structure of the arithmetic decoding unit which performs the arithmetic decoding method according to Embodiment 2.

Figure 13:
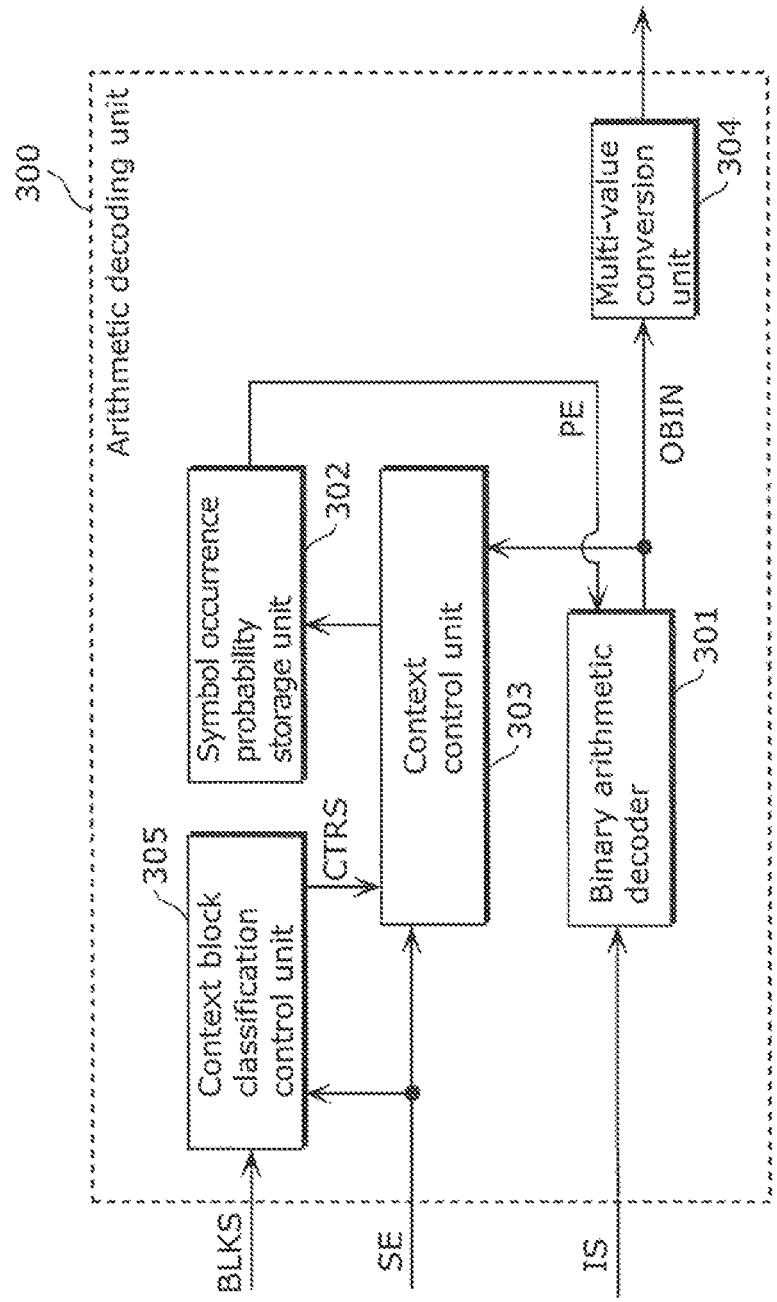
FIG. 13 is a block diagram showing an example of a structure of an/the arithmetic decoding unit of an/the image decoding apparatus according to the present invention.

Here, FIG. 13 is a block diagram showing an example of the structure of the arithmetic decoding unit 300 according to Embodiment 2.

As shown in FIG. 13, the arithmetic decoding unit 300 includes a binary arithmetic decoder 301, a symbol occurrence probability storage unit 302, a context control unit 303, a multi-value conversion unit 304, and a context block classification control unit 305.

The arithmetic decoding unit 300 reconstructs the coded image by executing an arithmetic decoding of the input stream IS which is a current signal to be decoded of the coded image, and outputs the reconstructed coded image. In Embodiment 2, the arithmetic decoding unit 300 receives, as inputs, the input stream IS, signal type information SE indicating the type of the input stream IS, and a block size signal BLKS indicating the block size of the input signal SI.

The input stream IS in Embodiment 2 is assumed to be a signal OB which is output from the arithmetic coding unit 100 in Embodiment 1.

In addition, the signal type information SE is information indicating the properties of the input stream IS which is the current signal to be decoded of the coded image. More specifically, the signal type information in Embodiment 2 is the same as the signal type information SE according to Embodiment 1. Here, a description is given assuming a case where the signal type information SE indicates coefficient positions and surrounding conditions. The signal type information SE may be motion data or information indicating an intra prediction direction or the like which is used by the intra prediction unit 450 of the image decoding apparatus 400 shown in FIG. 16 described later.

As in Embodiment 1, Embodiment 2 is configured to receive block size signals BLKS assuming that contexts are set suitably for block sizes. However, it is possible to configure an embodiment which does not use such block size signals BLKS in the case of setting contexts according to other features of the image.

The binary arithmetic decoder 301 generates a binary signal OBIN by performing arithmetic decoding of the input stream IS by using symbol occurrence probability PE which is decoded probability information read out from the symbol occurrence probability storage unit 302 by the context control unit 303 described later.

The symbol occurrence probability storage unit 302 is a storage unit configured with a non-volatile memory or the like, and stores a signal information table and a plurality of context tables.

The symbol occurrence probability storage unit 102 further stores an occurrence probability table (not shown) indicating a value of one of the symbol occurrence probabilities PE which corresponds to the probability information pStateIdx.

The signal information table is the same as a conventional signal information table shown in FIG. 4, and stores indices ctxIdx, occurrence probabilities pStateIdx, and symbols valMPS in an associated manner. Here, as in Embodiment 1, it is also good to use, as the signal information table, a table in which contexts ctxIdx and the values of the symbol occurrence probabilities PE are directly associated one to one with each other.

As in Embodiment 1, the context table is composed of a plurality of tables in which contexts ctxIds are set according to conditions. The details of the context table is the same as in Embodiment 1.

The context control unit 303 executes context control processing for identifying a symbol probability PE for use in the binary arithmetic decoder 301 and updates processing for updating the symbol occurrence probabilities PE in the symbol occurrence probability storage unit 302.

A description is given of context control processing by the context control unit 303. The context control unit 303 obtains a control signal CTRS which is output from a context block classification control unit 305 which is described later, and obtains a table to be used from among the context tables in the symbol occurrence probability storage unit 302. Furthermore, the context control unit 303 identifies the context ctxIdx corresponding to the condition identified based on the signal type information SE, with reference to the identified table in the symbol occurrence probability storage unit 302.

Next, the context control unit 303 obtains an occurrence probability pStateIdx corresponding to the index ctxIdx with reference to the signal information table. The context control unit 303 identifies a symbol occurrence probability PE for use in the binary arithmetic decoder 301, with reference to the occurrence probability table stored in the symbol occurrence probability storage unit 302, based on the occurrence probability pStateIdx. Furthermore, the context control unit 303 causes the symbol occurrence probability storage unit 302 to output the identified symbol occurrence probability PE to the binary arithmetic decoder 301.

Next, a description is given of update processing by context control unit 303. The update processing by the context control unit 303 is performed based on the H.264 Standard. More specifically, the context control unit 303 derives a new symbol occurrence probability PE and a symbol valMPS based on the input stream IS. The context control unit 303 replaces, with the value corresponding to the new symbol occurrence probability PE, the value of the occurrence probability pStateIdx corresponding to the context ctxIdx identified in the context control processing, in the signal information table stored in the symbol occurrence probability storage unit 302.

The multi-value conversion unit 304 reconstructs the image by performing multi-value conversion on the binary signal OBIN generated by the binary arithmetic decoder 301. The multi-value conversion scheme is determined based on the signal type information SE.

As in Embodiment 1, in Embodiment 2, the context block classification control unit 305 determines a table from among the context tables in the symbol occurrence probability storage unit 302 based on the block size signal BLKS and the signal type information SE, generates a control signal CTRS indicating the determined table, and outputs the control signal CTRS to the context control unit 103.

(Processing Procedure in Embodiment 2)

Next, a description is given of the structure of an arithmetic decoding method performed by the arithmetic decoding unit 300 according to Embodiment 2.

Figure 14:
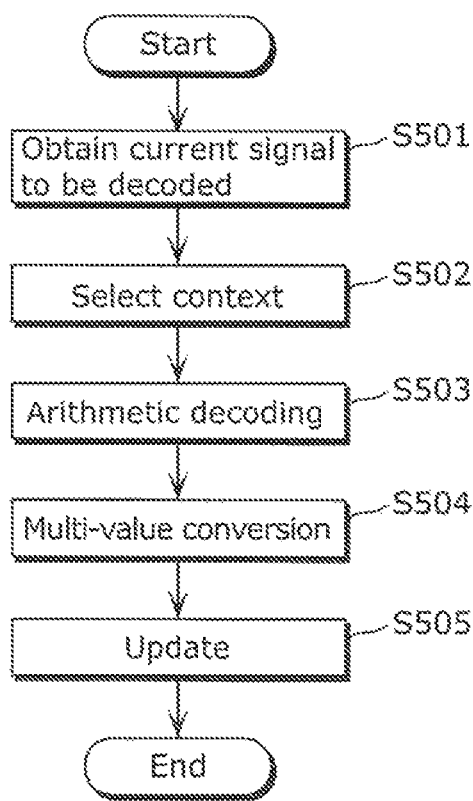
FIG. 14 is a flowchart indicating a processing procedure in an arithmetic decoding method in an/the image decoding method according to the present invention.

Here, FIG. 14 is a flowchart indicating a processing procedure in an arithmetic decoding method according to the present invention. The image decoding method according to the present invention is configured to include: a current signal to be decoded obtaining step of obtaining a current signal to be decoded of a coded image (Step S501); a context selecting step of selecting a context of the current signal to be decoded from among a plurality of contexts (Step S502); an arithmetic decoding step of generating a binary signal by performing an arithmetic decoding of the current signal to be decoded by using decoded probability information associated with the context selected in the context selecting step (Step S503), a multi-value conversion step of reconstructing an image by performing multi-value conversion on the binary signal (Step S504); and an update step of updating the decoded probability information associated with the context selected in the context selecting step (Step S505), and to select, in the context selecting step, a context for the current signal to be decoded also as a context for another signal to be decoded included in a processing unit having a size different from the size of the processing unit including the current signal to be decoded.

Figure 15:
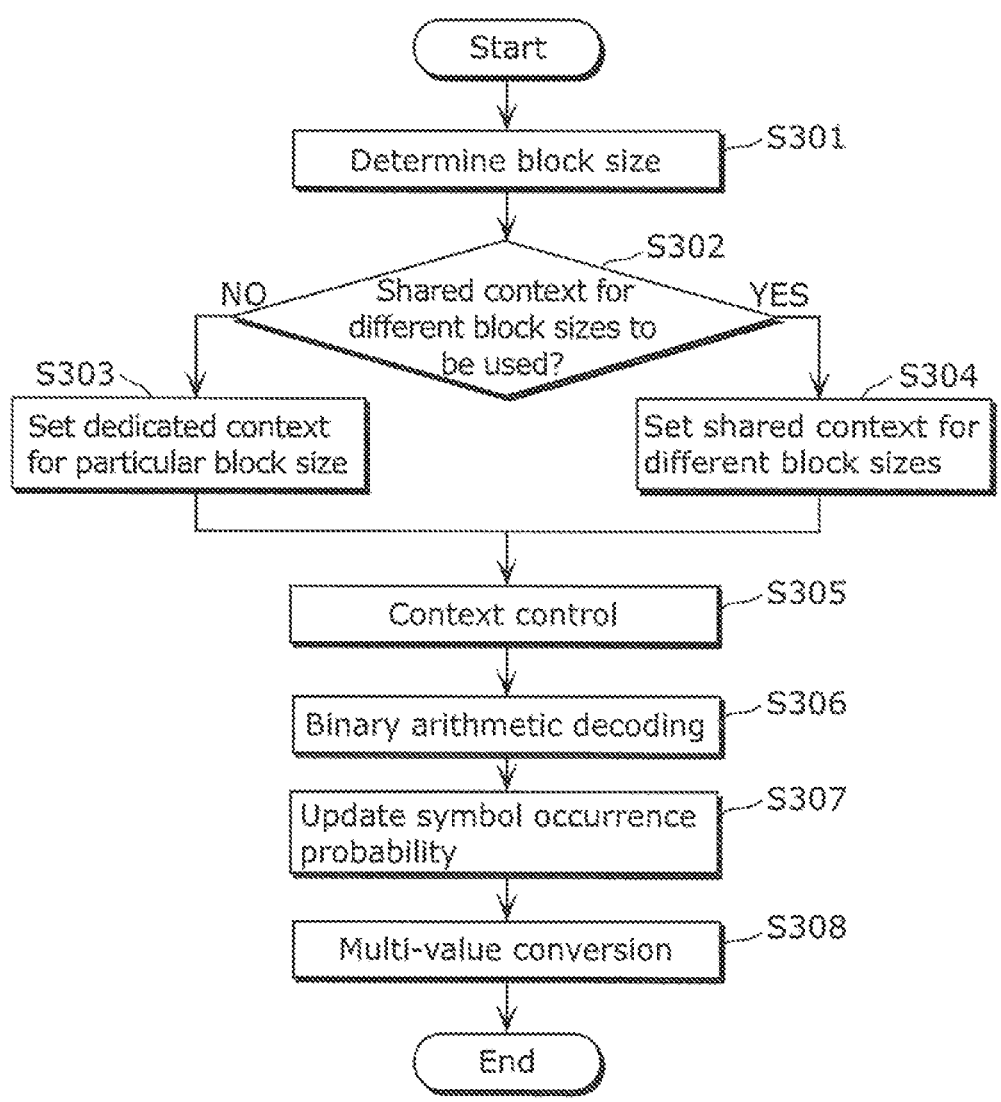
FIG. 15 is a flowchart indicating an example of an arithmetic decoding method in an/the image decoding method according to the present invention.

FIG. 15 is a flowchart indicating, in more detail, the outline of the processing procedure of the arithmetic decoding method according to Embodiment 2. The flowchart in FIG. 15 shows an arithmetic decoding of a signal input stream SI (a current signal to be decoded).

As shown in FIG. 15, when the arithmetic decoding is started, the context block classification control unit 305 obtains the block size of the current signal to be decoded, based on the block size signal BLKS (Step S301).

Next, the context block classification control unit 305 determines whether or not to use a shared context for different blocks sizes, based on the block size and the signal type information SE obtained in Step S301 (Step S302).

When the context block classification control unit 305 determines to use the context for the block size (NO in Step S302), the context block classification control unit 305 selects the table in which the context for the block size is set, and outputs a control signal CTRS indicating the table to the context control unit 303 (Step S303).

On the other hand, when the context block classification control unit 305 determines to use the shared context for the block size (YES in Step S302), the context block classification control unit 305 selects the table in which the shared context for the block size is set from among the context tables in the symbol occurrence probability storage unit 102, and outputs a control signal CTRS indicating the table to the context control unit 303 (Step S304).

The detailed operations by the context block classification control unit 305 are the same as in Operation Examples 1 to 3 in Embodiment 1.

The context control unit 303 determines the context table corresponding to the input stream IS from among the context tables stored in the symbol occurrence probability storage unit 302, based on the control signal CTRS (Step S305).

The context control unit 303 determines a context ctxIdx based on a condition determined based on the signal type information SE, with reference to the selected context table (the processing from Step S302 to this point corresponds to the context selecting step, and the context block classification control unit 305 and the context control unit 303 which execute the steps correspond to the context selection control unit). Furthermore, the context control unit 303 identifies a symbol occurrence probability PE corresponding to the context ctxIdx, with reference to the signal information table and the occurrence probability table, reads out the identified symbol occurrence probability PE from the symbol occurrence probability storage unit 302, and outputs the read-out symbol occurrence probability PE to the binary arithmetic decoder 301.

The binary arithmetic decoder 301 obtains the current signal to be decoded of the input stream IS (the current signal to be decoded obtaining step), and obtains the symbol occurrence probability PE (decoded probability information) identified by the context control unit 303. The binary arithmetic decoder 301 generates a binary output signal OBIN by executing an arithmetic decoding of the current signal to be decoded by using the obtained symbol occurrence probability PE (decoded probability information) according to the H.264 Standard (Step S306, the arithmetic decoding step).

The context control unit 303 executes update processing of updating the symbol occurrence probability PE based on the binary signal OBIN generated by the binary arithmetic decoder 301 (Step S307, the update step). The execution procedure in the update processing is the same as in the update processing according to Embodiment 1.

The multi-value conversion unit 304 reconstructs the image by performing a multi-value conversion on the binary signal OBIN (Step S308, the multi-value conversion step).
(Variation Example of Context Block Classification Control Unit)

For example, in the case where the arithmetic coding method and the arithmetic coding apparatus according to Embodiment 1 is configured to segment a block having a large block size into sub blocks (having a small block size) having the same size and to use a context for small block sizes which is for each of the sub blocks, it is preferable that the arithmetic decoding method and the arithmetic decoding apparatus according to Embodiment 2 be configured to segment a block having a large block size into sub blocks (having a small block size) having the same size and to use a context for small block sizes which is for each of the sub blocks.

More specifically, for example, in the case where the arithmetic coding apparatus segments a block having a 16×16 large block size into sub blocks having a 4×4 small block size and executes arithmetic coding of each of the sub blocks, the context which is used for the blocks having the 4×4 small block size is applied to arithmetic decoding of each of the sub blocks.

In this case, the arithmetic decoding unit 300 executes the arithmetic decoding of each of the sub block to reconstruct the sub blocks having the large block size, and outputs the reconstructed sub blocks to the inverse quantization and inverse transform unit 420.

With this structure, it is possible to use the context table for small block sizes also for the large block size. As a result, it is possible to perform context sharing between the large block having the large block size and the small blocks having the small block size.
(Overall Structure of Image Decoding Apparatus)

The arithmetic decoding unit 300 according to Embodiment 2 is included in an image decoding apparatus which decodes compression-coded image.

The image decoding apparatus 400 decodes the compression-coded image. For example, the image decoding apparatus 400 receives, as signals to be decoded, the coed image in units of a block. The image decoding apparatus 400 reconstructs the image by performing variable length decoding, and inverse quantization and inverse transform on the input signals to be decoded.

Figure 16:
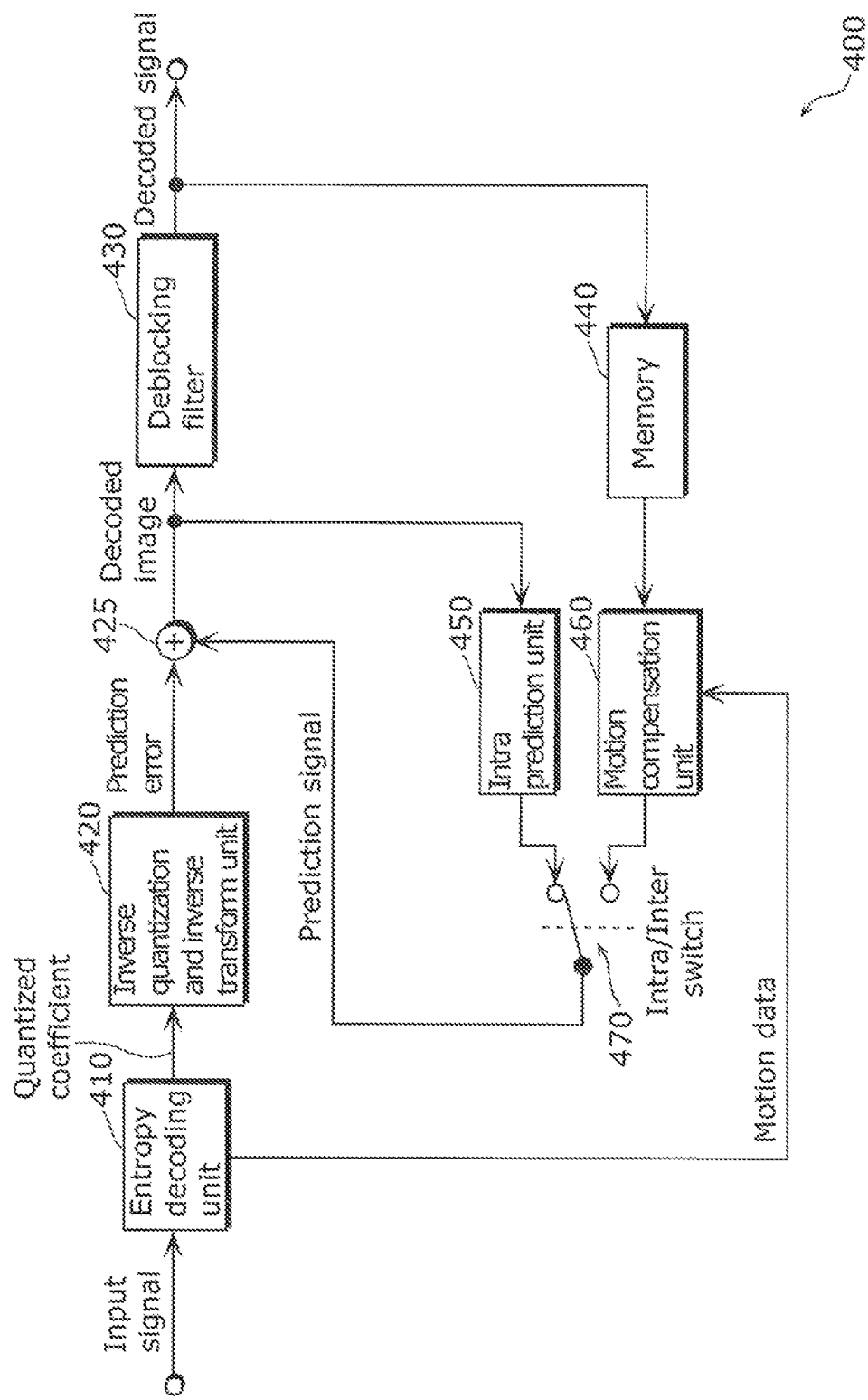
FIG. 16 is a block diagram showing an example of a whole structure of an/the image coding apparatus according to the present invention.

Here, FIG. 16 is a block diagram showing an example of the structure of the arithmetic decoding unit 400 according to Embodiment 2 of the present invention. As shown in FIG. 16, the image decoding apparatus 400 includes: an entropy decoding unit 410, an inverse quantization and inverse transform unit 420, an adder 425, a deblocking filter 430, a memory 440, an intra prediction unit 450, a motion compensation unit 460, and an intra/inter switch 470.

The image decoding apparatus 400 receives the coed image in units of a block as an input signal (an input stream IS).

The entropy decoding unit 410 is configured with the arithmetic decoding unit 300 shown in FIG. 13 and reconstructs quantized coefficients by performing variable length decoding which involves arithmetic decoding and multi-value conversion of the input signals (input streams IS). Here, the input signals (input streams IS) are signals to be coded, and correspond to data in units of a block of the coded image. In addition, the entropy decoding unit 410 obtains motion data from each of the input signals, and outputs the obtained motion data to the motion compensation unit 460.

The inverse quantization and inverse transform unit 420 reconstructs the transform coefficients by performing inverse quantization on the quantized coefficients reconstructed by the entropy decoding unit 410. Furthermore, the inverse quantization and inverse transform unit 420 reconstructs the prediction errors by performing inverse transform on the reconstructed transform coefficients, and outputs the reconstructed prediction errors to the adder 425.

The adder 425 generates a decoded image by adding the prediction error reconstructed by the inverse quantization and inverse transform unit 420 and a prediction signal which is described later, and outputs the generated decoded image to the deblocking filter 430 and the intra prediction unit 450.

The deblocking filter 430 performs deblocking filtering on the decoded image generated by the adder 425. The decoded image subjected to the deblocking filtering is output as a decoded signal.

The memory 440 is a memory for storing reference images for use in motion compensation. More specifically, the memory 440 stores decoded images subjected to the deblocking filtering.

The intra prediction unit 450 generates a prediction signal (an intra prediction signal) by performing an intra prediction. More specifically, the intra prediction unit 450 generates an intra prediction signal by performing an intra prediction with reference to the images surrounding a current block to be decoded (an input signal) in the decoded image generated by the adder 425.

The motion compensation unit 460 generates a prediction signal (an inter prediction signal) by performing motion compensation based on the motion data output from the entropy decoding unit 410.

The intra/inter switch 470 selects one of the intra prediction signal and the inter prediction signal, and outputs the selected signal as the prediction signal to the adder 425.

With this structure, the image decoding apparatus 400 according to Embodiment 2 decodes the compression coded image.

It is to be noted that Embodiment 1 may be configured to record information indicating whether or not a shared context is used for blocks having different block sizes in a starting portion (a stream header) of a bitstresam of the output signal OB, and that Embodiment 2 may be configured such that the entropy decoding unit 410 obtains the information as signal type information SE, and determines whether to use a context table for a block size or to use a shared context table. The unit of recording into the stream header can be decoded even when the unit corresponds to a slice or a picture.

As described above, as with the arithmetic coding unit 100 in Embodiment 1, the image decoding apparatus and the image decoding method according to Embodiment 2 are configured to apply the same context for image having the same statistical properties even when the block sizes are different, and thus to decode the coded image in Embodiment 1 more appropriately and accurately. Accordingly, the image decoding apparatus and the image decoding method according to Embodiment 2 of the present invention also make it possible to reduce the number of contexts, increase the update frequency of each of symbol occurrence probabilities PE having a low occurrence probability so as to increase the accuracy of the symbol occurrence probability PE, and to thereby increase the coding efficiency.

In addition, it is also preferable that an image coding and decoding apparatus is configured to include the image coding apparatus according to Embodiment 1 and the image decoding apparatus according to Embodiment 2.

Embodiment 3

The moving picture coding method (image coding method) or moving picture decoding method (image decoding method) described in any one of the embodiments can be simply implemented in an independent computer system, by recording, onto a recording medium, a program for implementing the configurations of the moving picture coding method and the moving picture decoding method described in any one of the embodiments. The recording media may be any recording media as long as the program can be recorded, such as a magnetic disk, an optical disk, a magnetic optical disk, an IC card, and a semiconductor memory.

Hereinafter, applications to the moving picture coding method and the moving picture decoding method described in any one of the embodiments and systems using thereof will be described. Each of the systems is characterized by including an image coding and decoding apparatus composed of an image coding apparatus which performs an image coding method and an image decoding apparatus which performs an image decoding apparatus. The other structural elements in the system can be appropriately modified adapted to cases.

Figure 17:
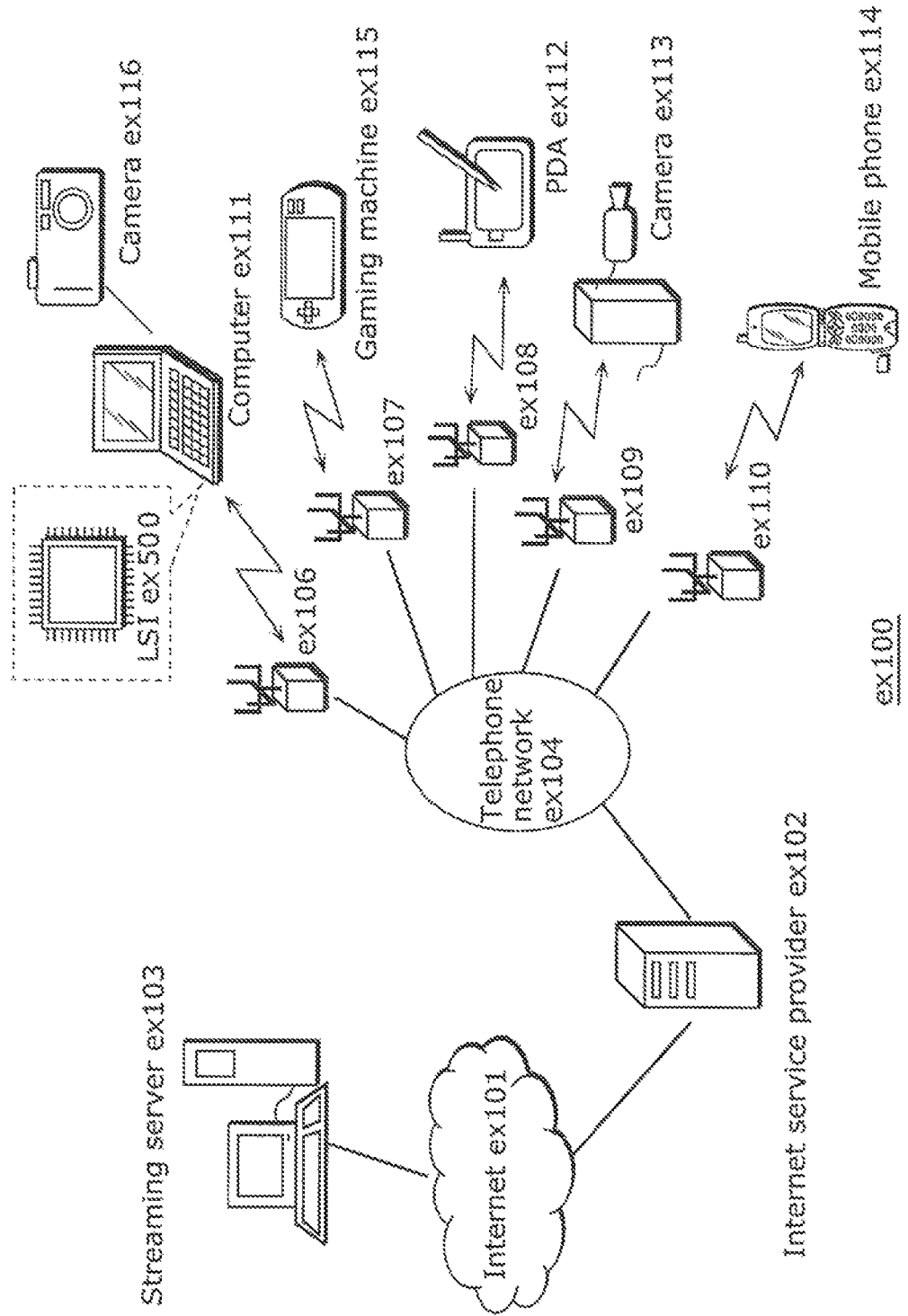
FIG. 17 is an overall configuration of a content providing system for implementing content distribution services.

FIG. 17 illustrates an overall structure of a content providing system ex100 for implementing content distribution services. The area for providing communication services is divided into cells of desired size, and base stations ex106, ex107, ex108, ex109, and ex110 which are fixed wireless stations are placed in each of the cells.

The content providing system ex100 is connected to devices, such as a computer ex111, a personal digital assistant (PDA) ex112, a camera ex113, a mobile phone ex114 and a gaming machine ex115, via the Internet ex101, an Internet service provider ex102, a telephone network ex104, as well as the base stations ex106 to ex110.

However, the configuration of the content providing system ex100 is not limited to the configuration shown in FIG. 17, and a combination in which any of the elements are connected is acceptable. In addition, each device may be directly connected to the telephone network ex104, rather than via the base stations ex106 to ex110 which are the fixed wireless stations. Furthermore, the devices may be interconnected to each other via a short distance wireless communication and others.

The camera ex113, such as a digital video camera, is capable of capturing videos. A camera ex116, such as a digital video camera, is capable of capturing both still images and videos. Furthermore, the mobile phone ex114 may be the one that meets any of the standards such as Global System for Mobile Communications (GSM), Code Division Multiple Access (CDMA), Wideband-Code Division Multiple Access (W-CDMA), Long Term Evolution (LTE), and High Speed Packet Access (HSPA). Alternatively, the mobile phone ex114 may be a Personal Handyphone System (PHS).

In the content providing system ex100, a streaming server ex103 is connected to the camera ex113 and others via the telephone network ex104 and the base station ex109, which enables distribution of images of a live show and others. In such a distribution, a content (for example, video of a music live show) captured by the user using the camera ex113 is coded (that is, as if the content were coded in the image coding apparatus according to the present invention) as described above in any one of the embodiments, and the coded content is transmitted to the streaming server ex103. On the other hand, the streaming server ex103 carries out stream distribution of the transmitted content data to the clients upon their requests. The clients include the computer ex111, the PDA ex112, the camera ex113, the mobile phone ex114, and the gaming machine ex115 that are capable of decoding the above-mentioned coded data. Upon receiving the distributed data, each of the apparatuses decodes the received data and reproduces the decoded data (that is, as if the content were coded in the image coding apparatus according to the present invention).

The captured data may be coded by the camera ex113 or the streaming server ex103 that transmits the data, or the coding processes may be shared between the camera ex113 and the streaming server ex103. Similarly, the distributed data may be decoded by the clients or the streaming server ex103, or the decoding processes may be shared between the clients and the streaming server ex103. Furthermore, the data of the still images and videos captured by not only the camera ex113 but also the camera ex116 may be transmitted to the streaming server ex103 through the computer ex111. The coding processes may be performed by the camera ex116, the computer ex111, or the streaming server ex103, or shared among them.

Furthermore, the coding and decoding processes may be performed by an LSI ex500 generally included in each of the computer ex111 and the devices. The LSI ex500 may be configured of a single chip or a plurality of chips. Software for coding and decoding moving pictures may be integrated into some type of a recording medium (such as a CD-ROM, a flexible disk, a hard disk) that is readable by the computer ex111 and others, and the coding and decoding processes may be performed using the software. Furthermore, when the mobile phone ex114 is equipped with a camera, the video data obtained by the camera may be transmitted. The video data is data coded by the LSI ex500 included in the mobile phone ex114.

Furthermore, the streaming server ex103 may be composed of servers and computers, and may decentralize data and process the decentralized data, record, or distribute data.

As described above, the clients may receive and reproduce the coded data in the content providing system ex100. In other words, the clients can receive and decode information transmitted by the user, and reproduce the decoded data in real time in the content providing system ex100, so that the user who does not have any right and equipment for such purposes can enjoy personal broadcasting.

Figure 18:
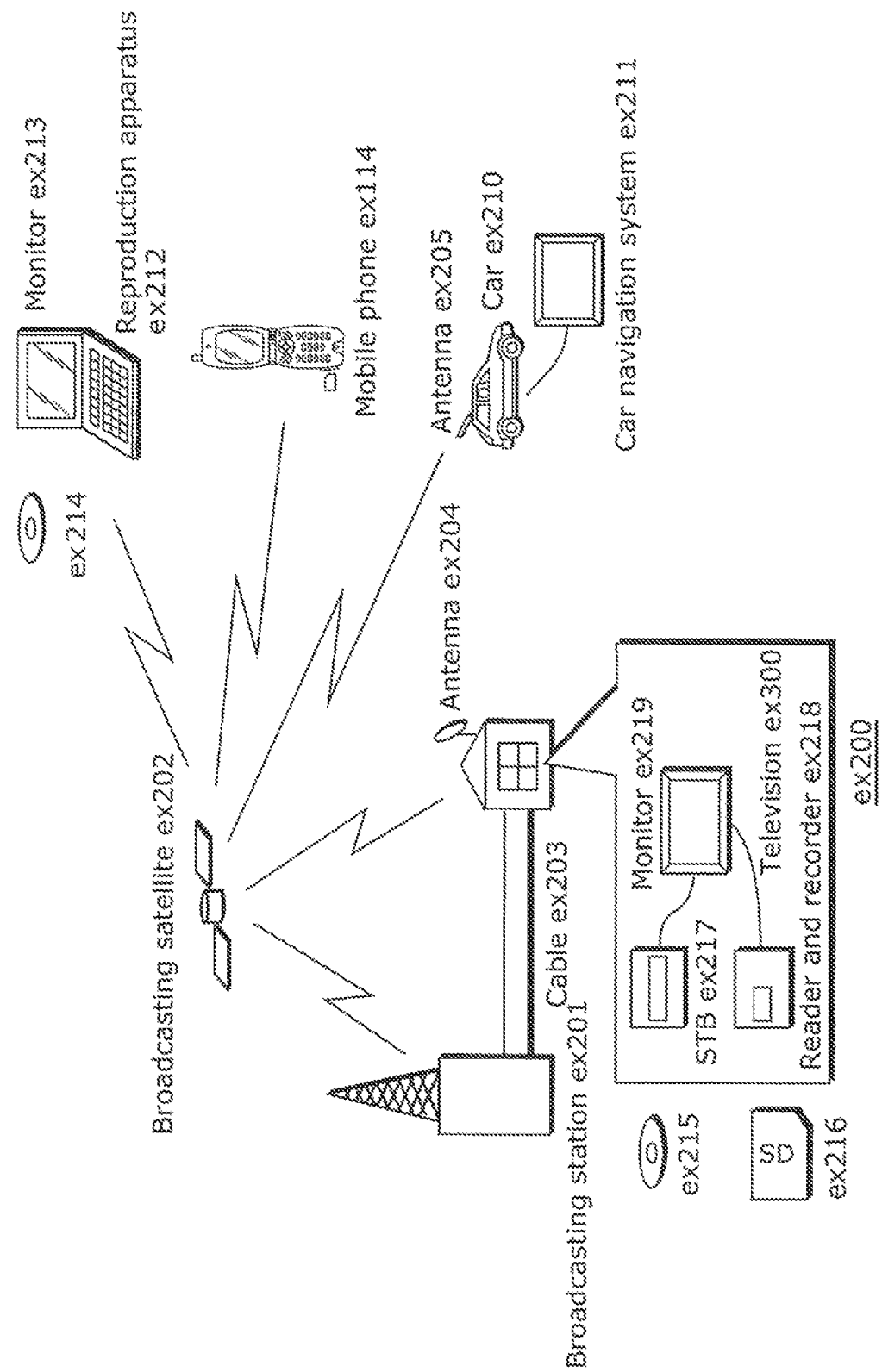
FIG. 18 is an overall configuration of a digital broadcasting system.

Aside from the example of the content providing system ex100, at least one of the moving picture coding apparatus and the moving picture decoding apparatus described in any one of the embodiments may be incorporated in a digital broadcasting system ex200 as illustrated in FIG. 18. More specifically, a broadcasting station ex201 communicates or transmits, via radio waves to a broadcasting satellite ex202, multiplexed data obtained by multiplexing audio data and others onto video data. This video data is data coded according to the moving picture coding method in any one of the embodiments (that is, data coded by the image coding apparatus according to the present invention). Upon reception of the multiplexed data, the broadcasting satellite ex202 transmits radio waves for broadcasting. Then, a home-use antenna ex204 with a satellite broadcast reception function receives the radio waves. Next, a device such as a television (receiver) ex300 and a set top box (STB) ex217 decodes the received multiplexed data and reproduces the decoded data (that is, as if the content were coded in the image coding apparatus according to the present invention).

Furthermore, a reader and recorder ex218 that (i) reads and decodes the multiplexed data recorded on a recording media ex215, such as a DVD and a BD, or (i) codes video signals in the recording medium ex215, and in some cases, writes data obtained by multiplexing an audio signal on the coded data can include the moving picture decoding apparatus or the moving picture coding apparatus as shown in any one of the embodiments. In this case, the reproduced video signals are displayed on the monitor ex219, and can be reproduced by another device or system using the recording medium ex215 on which the multiplexed data is recorded. It is also possible to implement the moving picture decoding apparatus in the set top box ex217 connected to the cable ex203 for a cable television (receiver) or to the antenna ex204 for satellite and/or terrestrial broadcasting, so as to display the video signals on the monitor ex219 of the television (receiver) ex300. The moving picture decoding apparatus may be incorporated not in the set top box but in the television (receiver) ex300.

Figure 19:
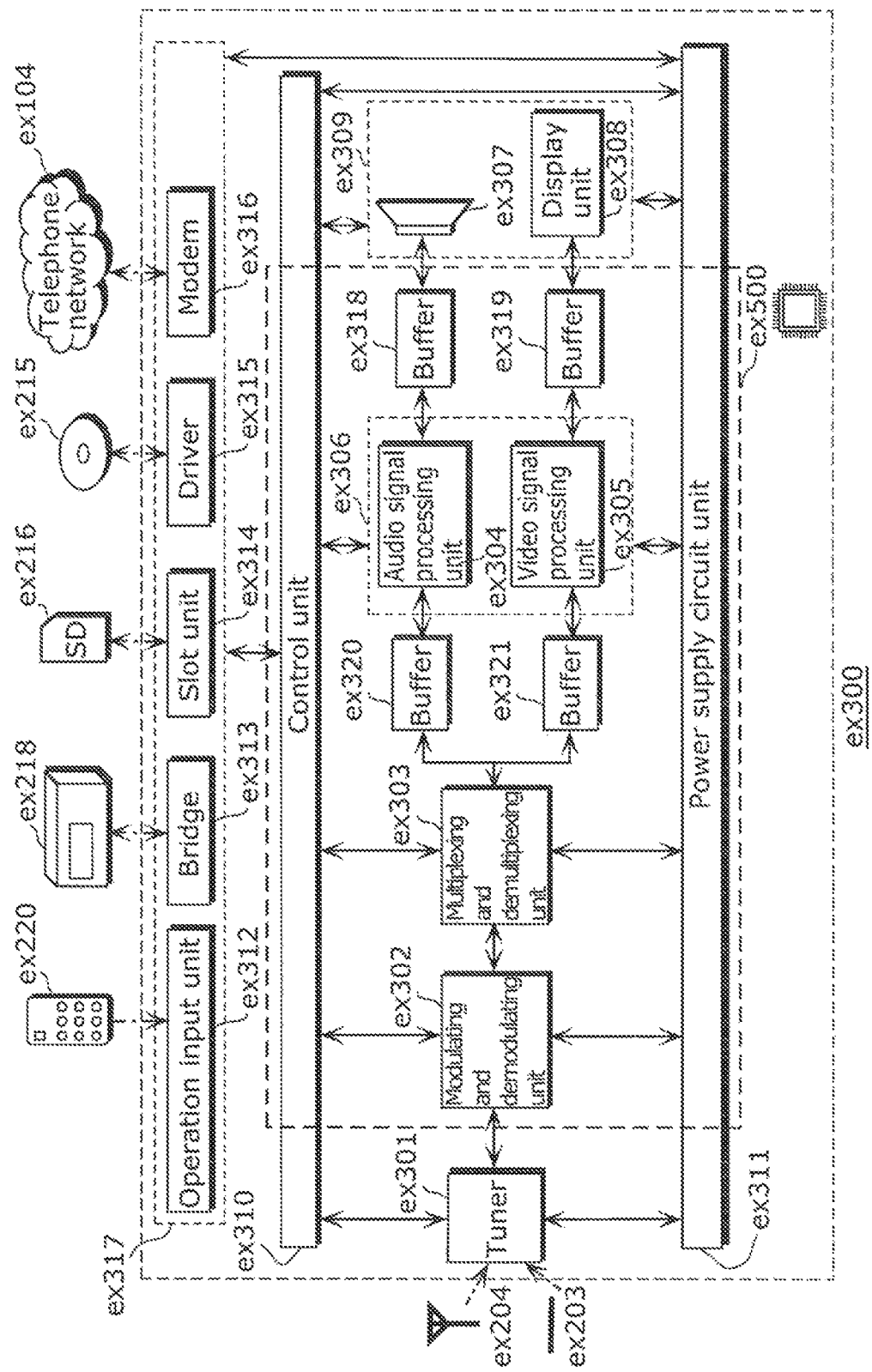
FIG. 19 is a block diagram illustrating an example of a structure of a television receiver.

FIG. 19 illustrates the television (receiver) ex300 that uses the moving picture coding method and the moving picture decoding method described in any one of the embodiments. The television (receiver) ex300 includes: a tuner ex301 that obtains or provides multiplexed data obtained by multiplexing audio data onto video data, through the antenna ex204 or the cable ex203, etc. that receives a broadcast; a modulating and demodulating unit ex302 that demodulates the received multiplexed data or modulates data into multiplexed data to be supplied outside; and a multiplexing and demultiplexing unit ex303 that demultiplexes the modulated multiplexed data into video data and audio data, or multiplexes video data and audio data coded by a signal processing unit ex306 into data.

In addition, the television (receiver) ex300 includes: a signal processing unit ex306 including an audio signal processing unit ex304 and a video signal processing unit ex305 which decode audio data and video data or code the information thereof, respectively (the television (receiver) 300 functions as the image coding apparatus or the image decoding apparatus according to the present invention); and an output unit ex309 including a speaker ex307 which provides the decoded audio signal, and a display unit ex308, such as a display, which displays the decoded video signal. Furthermore, the television (receiver) ex300 includes an interface unit ex317 including an operation input unit ex312 that receives an input of a user operation. Furthermore, the television (receiver) ex300 includes a control unit ex310 that controls overall each structural element of the television (receiver) ex300, and a power supply circuit unit ex311 that supplies power to each of the elements. Other than the operation input unit ex312, the interface unit ex317 may include: a bridge ex313 that is connected to an external device, such as the reader and recorder ex218; a slot unit ex314 for enabling attachment of the recording medium ex216, such as an SD card; a driver ex315 to be connected to an external recording medium, such as a hard disk; and a modem ex316 to be connected to a telephone network. Here, the recording medium ex216 can electrically record information using a non-volatile or volatile semiconductor memory element for storage. The structural elements of the television (receiver) ex300 are connected to each other through a synchronous bus.

First, the configuration in which the television (receiver) ex300 decodes multiplexed data obtained from outside through the antenna ex204 and others and reproduces the decoded data will be described. In the television (receiver) ex300, upon a user operation from a remote controller ex220 and others, the multiplexing and demultiplexing unit ex303 demultiplexes the multiplexed data demodulated by the modulating and demodulating unit ex302, under control of the control unit ex310 including a CPU. Furthermore, in the television (receiver) ex300, the audio signal processing unit ex304 decodes the demultiplexed audio data, and the video signal processing unit ex305 decodes the demultiplexed video data, using the decoding method described in any one of the embodiments. The output unit ex309 provides the decoded video signal and audio signal outside, respectively. When the output unit ex309 provides the video signal and the audio signal, the signals may be temporarily stored in buffers ex318 and ex319, and others so that the video signals and audio signals are reproduced in synchronization with each other. Furthermore, the television (receiver) ex300 may read multiplexed data not through a broadcast and others but from the recording media ex215 and ex216, such as a magnetic disk, an optical disk, and a SD card. Next, a configuration in which the television (receiver) ex300 codes an audio signal and a video signal, and transmits the data outside or writes the data on a recording medium will be described. In the television (receiver) ex300, upon a user operation from the remote controller ex220 or the like, the audio signal processing unit ex304 codes an audio signal, and the video signal processing unit ex305 codes a video signal, under control of the control unit ex310 using the coding method described in any one of the embodiments. The multiplexing and demultiplexing unit ex303 multiplexes the coded video signal and audio signal, and provides the resulting signals outside. When the multiplexing and demultiplexing unit ex303 multiplexes the video signal and the audio signal, the signals may be temporarily stored in the buffers ex320 and ex321 or the like so that the signals are reproduced in synchronization with each other. Here, the buffers ex318, ex319, ex320, and ex321 may be plural as illustrated, or at least one buffer may be shared in the television (receiver) ex300. Furthermore, data may be stored in a buffer so that the system overflow and underflow may be avoided between the modulating and demodulating unit ex302 and the multiplexing and demultiplexing unit ex303, other than the illustrated cases.

Furthermore, the television (receiver) ex300 may include a structural element for receiving an AV input from a microphone or a camera other than the structural element for obtaining audio and video data from a broadcast or a recording medium, and may code the obtained data. Although the television (receiver) ex300 can code, multiplex, and provide outside data in the above description, it may be capable of only receiving, decoding, and providing outside data but not the coding, multiplexing, and providing outside data.

Furthermore, when the reader and recorder ex218 reads or writes multiplexed data from or on a recording medium, one of the television (receiver) ex300 and the reader and recorder ex218 may decode or code the multiplexed data, and the television (receiver) ex300 and the reader and recorder ex218 may share the decoding or coding.

Figure 20:
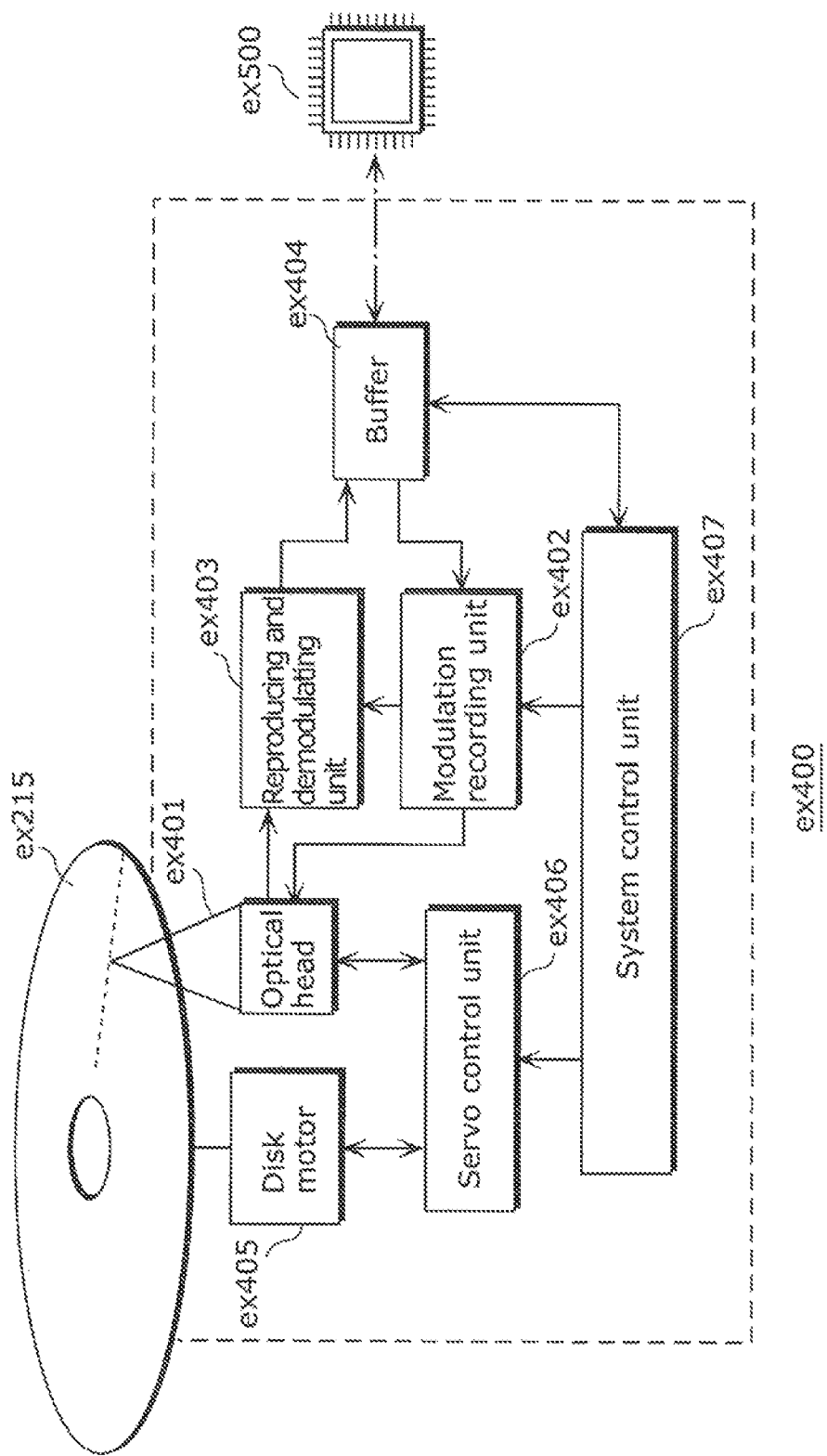
FIG. 20 is a block diagram illustrating an example of a structure of an information reproducing and recording unit that reads and writes information from or on a recording medium that is an optical disk.

As an example, FIG. 20 illustrates a structure of an information reproducing and recording unit ex400 when data is read or written from or on an optical disk. The information reproducing and recording unit ex400 includes structural elements ex401, ex402, ex403, ex404, ex405, ex406, and ex407 to be described hereinafter. The optical head ex401 irradiates a laser spot in a recording surface of the recording medium ex215 that is an optical disk to write information, and detects reflected light from the recording surface of the recording medium ex215 to read the information. The modulation recording unit ex402 electrically drives a semiconductor laser included in the optical head ex401, and modulates the laser light according to recorded data. The reproducing and demodulating unit ex403 amplifies a reproduction signal obtained by electrically detecting the reflected light from the recording surface using a photo detector included in the optical head ex401, and demodulates the reproduction signal by separating a signal component recorded on the recording medium ex215 to reproduce the necessary information. The buffer ex404 temporarily holds the information to be recorded on the recording medium ex215 and the information reproduced from the recording medium ex215. The disk motor ex405 rotates the recording medium ex215. The servo control unit ex406 moves the optical head ex401 to a predetermined information track while controlling the rotation drive of the disk motor ex405 so as to follow the laser spot. The system control unit ex407 controls overall the information reproducing and recording unit ex400. The reading and writing processes can be performed by the system control unit ex407 using various information stored in the buffer ex404 and generating and adding new information as necessary, and by the modulation recording unit ex402, the reproduction demodulating unit ex403, and the servo control unit ex406 that record and reproduce information through the optical head ex401 while being operated in a coordinated manner. The system control unit ex407 includes, for example, a microprocessor, and executes processing by causing a computer to execute a program for read and write.

Although the optical head ex401 irradiates a laser spot in the description, it may perform high-density recording using near field light.

Figure 21:
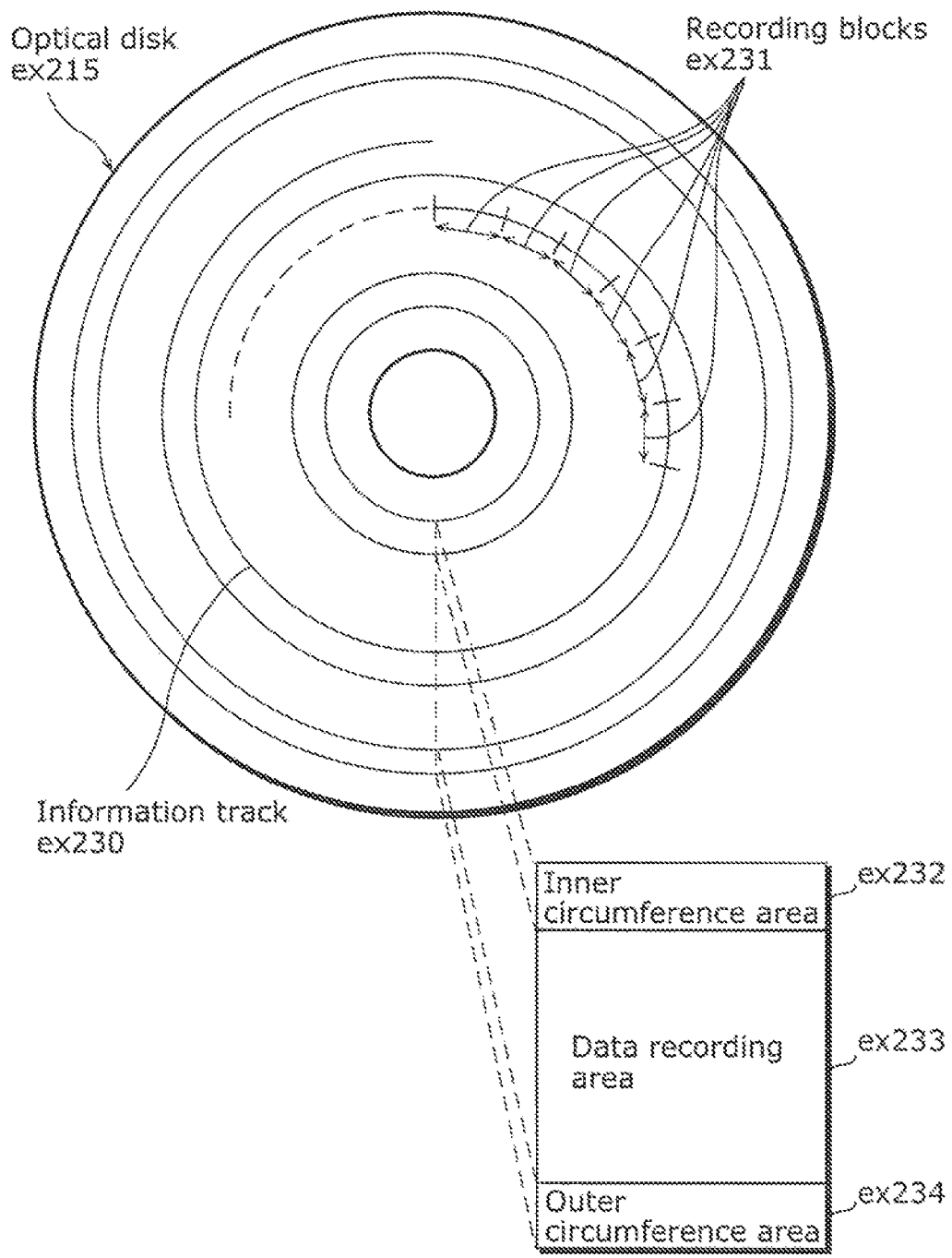
FIG. 21 is a drawing showing an example of a structure of a recording medium that is an optical disk.

FIG. 21 is a schematic diagram of the recording medium ex215 that is the optical disk. On the recording surface of the recording medium ex215, guide grooves are spirally formed, and an information track ex230 records, in advance, address information indicating an absolute position on the disk according to change in the shape of the guide grooves. The address information includes information for determining positions of recording blocks ex231 that are a unit for recording data. Reproducing the information track ex230 and reading the address information in an apparatus that records and reproduces data can lead to determination of the positions of the recording blocks. Furthermore, the recording medium ex215 includes a data recording area ex233, an inner circumference area ex232, and an outer circumference area ex234. The data recording area ex233 is an area for use in recording the user data. The inner circumference area ex232 and the outer circumference area ex234 that are inside and outside of the data recording area ex233, respectively are for specific use except for recording the user data. The information reproducing and recording unit 400 reads and writes coded audio, coded video data, or multiplexed data obtained by multiplexing the coded audio and video data, from and on the data recording area ex233 of the recording medium ex215.

Although an optical disk having a layer, such as a DVD and a BD is described as an example in the description, the optical disk is not limited to such, and may be an optical disk having a multilayer structure and capable of being recorded on a part other than the surface. Furthermore, the optical disk may have a structure for multidimensional recording and reproduction, such as recording of information using light of colors with different wavelengths in the same portion of the optical disk and recording information having different layers from various angles.

Furthermore, in the digital broadcasting system ex200, a car ex210 having an antenna ex205 can receive data from the broadcasting satellite ex202 and others, and reproduce video on a display device such as a car navigation system ex211 set in the car ex210. Here, the car navigation system ex211 may be configured to further include a GPS receiving unit in addition to the configuration illustrated in FIG. 63. The same is true for the computer ex111, the mobile phone ex114, and the like.

Figure 22A:
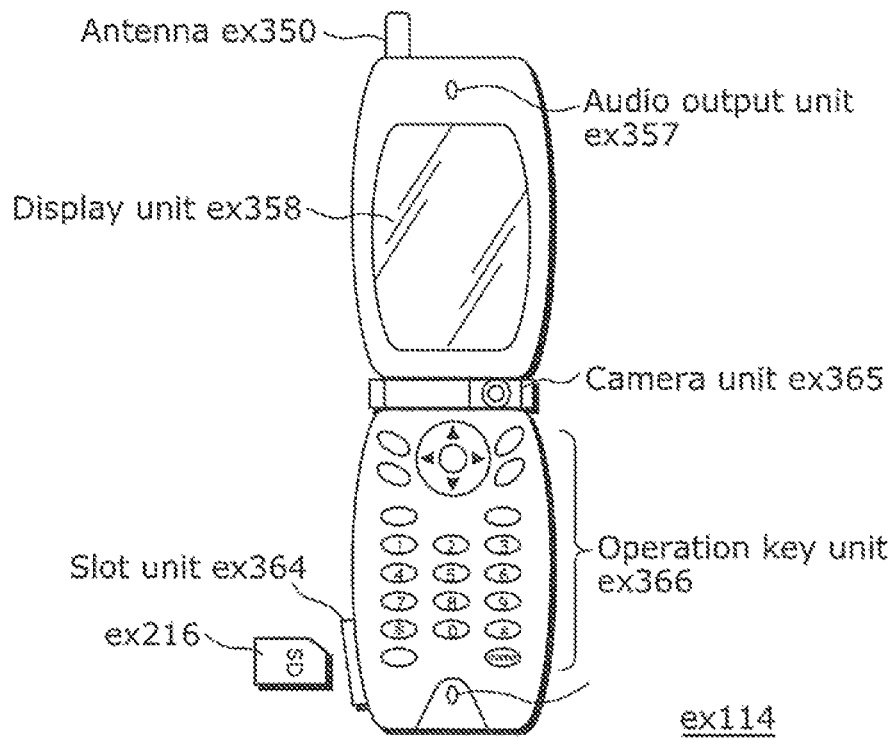
FIG. 22A is a drawing illustrating an example of a mobile phone.

FIG. 22A illustrates the mobile phone ex114 that uses the moving picture coding method and the moving picture decoding method described in any one of the embodiments. The mobile phone ex114 includes: an antenna ex350 for transmitting and receiving radio waves through the base station ex110; a camera unit ex365 capable of capturing moving and still images; and a display unit ex358 such as a liquid crystal display for displaying the data such as decoded video captured by the camera unit ex365 or received by the antenna ex350. The mobile phone ex114 further includes: a main body unit including a set of operation keys ex366; an audio output unit ex357 such as a speaker for output of audio; an audio input unit ex356 such as a microphone for input of audio; a memory unit ex367 for storing captured video or still pictures, recorded audio, coded or decoded data of the received video, the still pictures, e-mails, or others; and a slot unit ex364 that is an interface unit for a recording medium that stores data in the same manner as the memory unit ex367.

Figure 22B:
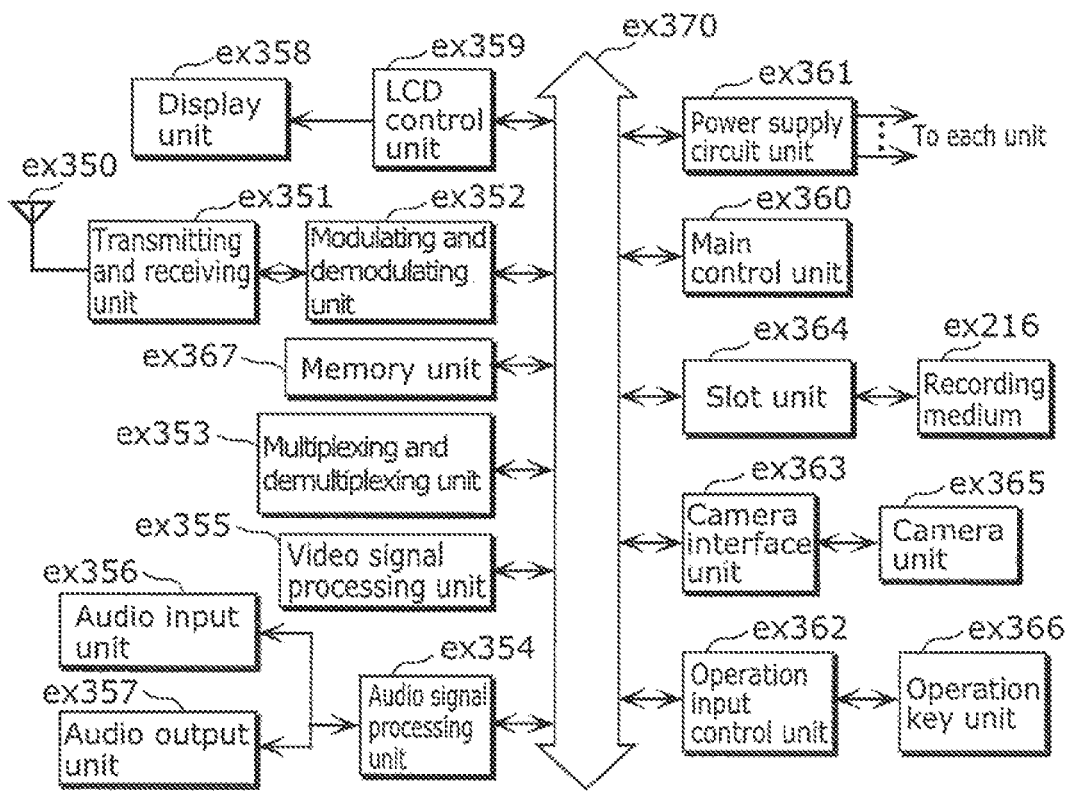
FIG. 22B is a block diagram illustrating a structure of the mobile phone.

Next, an example of a structure of the mobile phone ex114 will be described with reference to FIG. 22B. In the mobile phone ex114, a main control unit ex360 designed to control overall each unit of the main body including the display unit ex358 as well as the operation key unit ex366 is connected mutually, via a synchronous bus ex370, to a power supply circuit unit ex361, an operation input control unit ex362, a video signal processing unit ex355, a camera interface unit ex363, a liquid crystal display (LCD) control unit ex359, a modulating and demodulating unit ex352, a multiplexing and demultiplexing unit ex353, an audio signal processing unit ex354, the slot unit ex364, and the memory unit ex367.

When a call-end key or a power key is turned ON by a user's operation, the power supply circuit unit ex361 supplies the respective units with power from a battery pack so as to activate the cell phone ex114.

In the mobile phone ex114, the audio signal processing unit ex354 converts the audio signals collected by the audio input unit ex356 in voice conversation mode into digital audio signals under the control of the main control unit ex360 including a CPU, ROM, RAM, or the like. Then, the modulating and demodulating unit ex352 performs spread spectrum processing on the digital audio signals, and the transmitting and receiving unit ex351 performs digital-to-analog conversion and frequency conversion on the data, and transmit the resulting data via the antenna ex350. In addition, the mobile phone ex114 amplifies the data received via the antenna ex350 in voice conversation mode, and performs frequency conversion and the analog-to-digital conversion on the data. Then, the modulating and demodulating unit ex352 performs inverse spread spectrum processing on the data, the audio signal processing unit ex354 converts the data into analog audio signals, and the audio output unit ex357 outputs the audio data.

Furthermore, when an e-mail in data communication mode is transmitted, text data of the e-mail inputted by operating the operation keys ex366 and others of the main body is sent out to the main control unit ex360 via the operation input control unit ex362. The main control unit ex360 causes the modulating and demodulating unit ex352 to perform spread spectrum processing on text data, and the transmitting and receiving unit ex351 performs the digital-to-analog conversion and the frequency conversion on the resulting data and transmits the data to the base station ex110 via the antenna ex350. When an e-mail is received, processing that is approximately inverse to the processing for transmitting an e-mail is performed on the received data, and the resulting data is provided to the display unit ex358.

When video, still images, or video and audio in data communication mode is or are transmitted, the video signal processing unit ex355 compresses and video signals supplied from the camera unit ex365 using the moving picture coding method shown in any one of the embodiments (that is, the video signal processing unit ex355 functions as the image coding apparatus according to the present invention), and transmits the coded video data to the multiplexing and demultiplexing unit ex353. In contrast, while the camera unit ex365 is capturing video, still images, and others, the audio signal processing unit ex354 codes audio signals collected by the audio input unit ex356, and transmits the coded audio data to the multiplexing and demultiplexing unit ex353.

The multiplexing and demultiplexing unit ex353 multiplexes the coded video data supplied from the video signal processing unit ex355 and the coded audio data supplied from the audio signal processing unit ex354, using a predetermined method. Then, the modulating and demodulating unit ex352 performs spread spectrum processing on the resulting multiplexed data. Next, the transmitting and receiving unit ex351 performs digital-to-analog conversion and frequency conversion on the data, and transmits the resulting data via the antenna ex350.

When receiving data of a video file which is linked to a Web page and others in data communication mode or when receiving an e-mail with video and/or audio attached, in order to decode the multiplexed data received via the antenna ex350, the multiplexing and demultiplexing unit ex353 demultiplexes the multiplexed data into a video data bit stream and an audio data bit stream, and supplies the video signal processing unit ex355 with the coded video data and the audio signal processing unit ex354 with the coded audio data, through the synchronous bus ex370. The video signal processing unit ex355 decodes the video signal using a moving picture decoding method corresponding to the coding method shown in any one of the embodiments (that is, the video signal processing unit ex355 functions as the image coding apparatus according to the present invention), and then the display unit ex358 displays, for instance, the video and still images included in the video file linked to the Web page via the LCD control unit ex359. Furthermore, the audio signal processing unit ex354 decodes the audio signal, and the audio output unit ex357 provides the audio.

Furthermore, similarly to the television (receiver) ex300, a terminal such as the mobile phone ex114 probably have three types of implementations including not only (i) a transmitting and receiving terminal including both a coding apparatus and a decoding apparatus, but also (ii) a transmitting terminal including only a coding apparatus and (iii) a receiving terminal including only a decoding apparatus. Although the digital broadcasting system ex200 receives and transmits the multiplexed data obtained by multiplexing audio data onto video data in the description, the multiplexed data may be data obtained by multiplexing not only audio data but also character data related to video onto video data, and may be not multiplexed data but video data itself.

As such, each of the above described apparatuses and systems is capable of performing a corresponding one of the moving picture coding methods and the moving picture decoding methods described in the embodiments, and thereby provides the advantageous effects described in the embodiments.

Furthermore, the present invention is not limited to the embodiments, and various modifications and revisions are possible without departing from the scope of the present invention.

Embodiment 4

Video data can be generated by switching, as necessary, between (i) the moving picture coding method and/or the moving picture coding apparatus shown in any one of the embodiments and (ii) a moving picture coding method and/or a moving picture coding apparatus in conformity with a different standard, such as MPEG-2, MPEG-4 AVC, and VC-1.

Here, when a plurality of video data that conforms to the different standards is generated and is then decoded, the decoding methods need to be selected to conform to the different standards. However, since to which standard each of the plurality of the video data to be decoded conform cannot be detected, there is a problem that an appropriate decoding method cannot be selected.

In order to solve this problem, multiplexed data obtained by multiplexing audio data and others onto video data has a structure including identification information indicating to which standard the video data conforms. Hereinafter, a description is given of the specific structure of the multiplexed data including the video data generated in the moving picture coding method and by the moving picture coding apparatus shown in any one of the embodiments. The multiplexed data is a digital stream in the MPEG-2 Transport Stream format.

FIG. 23 illustrates a structure of the multiplexed data. As illustrated in FIG. 23, the multiplexed data can be obtained by multiplexing at least one of a video stream, an audio stream, a presentation graphics stream (PG), and an interactive graphics stream. The video stream represents primary video and secondary video of a movie, the audio stream (IG) represents a primary audio part and a secondary audio part to be mixed with the primary audio part of a movie, and the presentation graphics stream represents subtitles of the movie. Here, the primary video is normal video to be displayed on a screen, and the secondary video is video to be displayed on a smaller window in the main video. Furthermore, the interactive graphics stream represents an interactive screen to be generated by arranging the GUI components on a screen. The video stream is coded in the moving picture coding method or by the moving picture coding apparatus shown in any one of the embodiments, or in a moving picture coding method or by a moving picture coding apparatus in conformity with any one of the conventional standards such as MPEG-2, MPEG-4 AVC, and VC-1. The audio stream is coded in accordance with a standard, such as Dolby-AC-3, Dolby Digital Plus, MLP, DTS, DTS-HD, and linear PCM.

Each stream included in the multiplexed data is identified by PID. For example, 0x1011 is allocated to the video stream to be used for video of a movie, 0x1100 to 0x111F are allocated to the audio streams, 0x1200 to 0x121F are allocated to the presentation graphics streams, 0x1400 to 0x141F are allocated to the interactive graphics streams, 0x1B00 to 0x1B1F are allocated to the video streams to be used for secondary video of the movie, and 0x1A00 to 0x1A1F are allocated to the audio streams to be used for the secondary video to be mixed with the primary audio.

Figure 24:
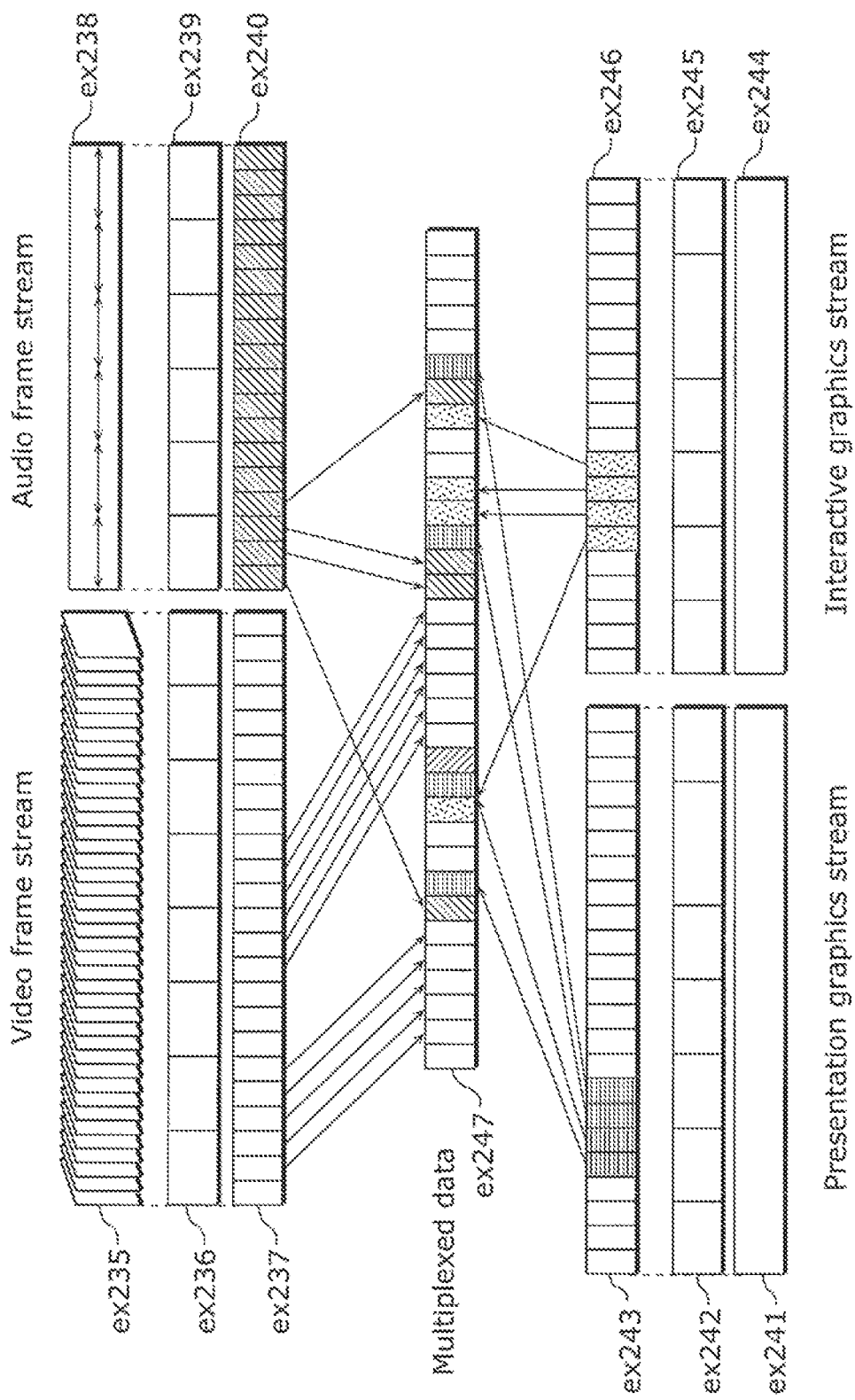
FIG. 24 is a drawing schematically illustrating how each of the streams is multiplexed in multiplexed data.

FIG. 24 schematically illustrates how data is multiplexed. First, a video stream ex235 composed of video frames and an audio stream ex238 composed of audio frames are transformed into a stream of PES packets ex236 and a stream of PES packets ex239, and further into TS packets ex237 and TS packets ex240, respectively. Similarly, data of a presentation graphics stream ex241 and data of an interactive graphics stream ex244 are transformed into a stream of PES packets ex242 and a stream of PES packets ex245, respectively, and further into TS packets ex243 and TS packets ex246, respectively. These TS packets are multiplexed into a stream to obtain multiplexed data ex247.

Figure 25:
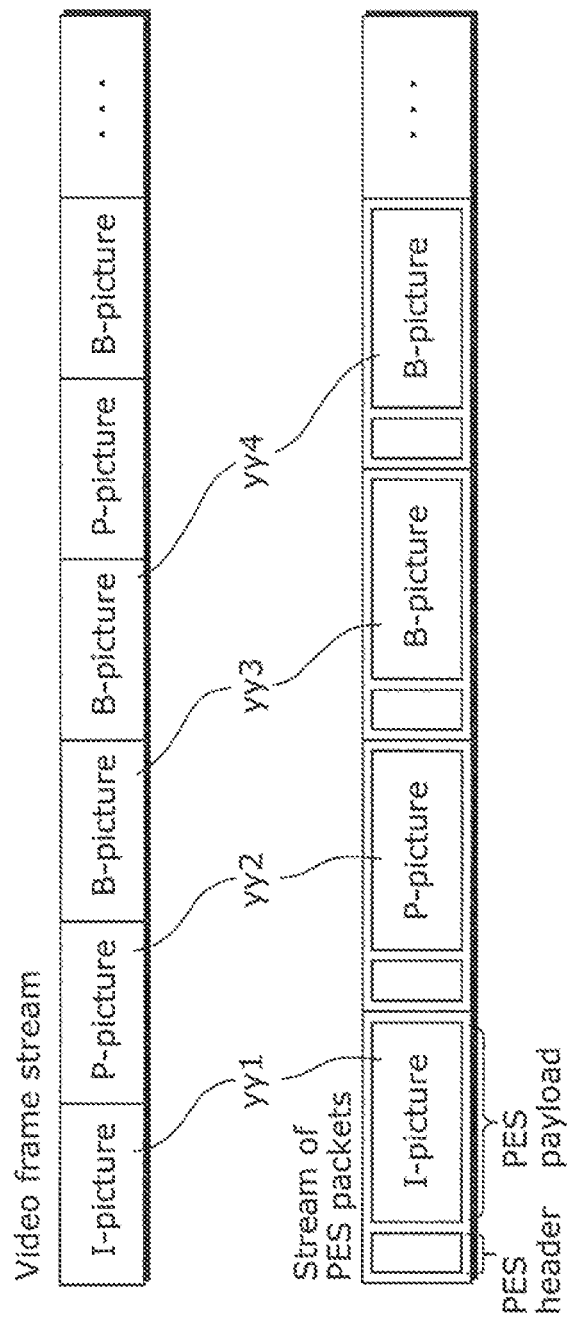
FIG. 25 is a drawing illustrating how a video stream is stored in a stream of PES packets in more detail.

FIG. 25 illustrates how a video stream is stored in a stream of PES packets in more detail. The first bar in FIG. 25 shows a video frame stream in a video stream. The second bar shows the stream of PES packets. As indicated by arrows denoted as yy1, yy2, yy3, and yy4 in FIG. 25, the video stream is divided into pictures as I-pictures, B-pictures, and P-pictures each of which is a video presentation unit, and the pictures are stored in a payload of each of the PES packets. Each of the PES packets has a PES header, and the PES header stores a Presentation Time-Stamp (PTS) indicating a display time of the picture, and a Decoding Time-Stamp (DTS) indicating a decoding time of the picture.

Figure 26:
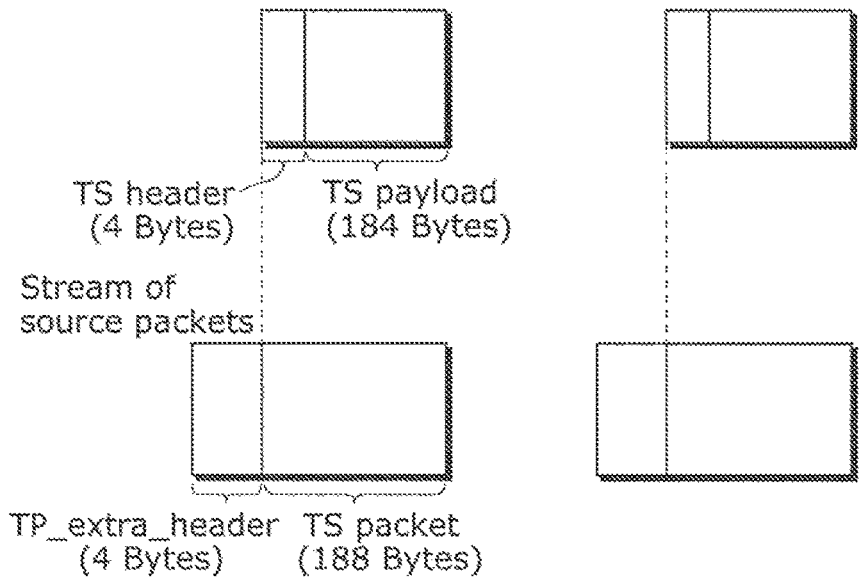
FIG. 26 is a drawing showing a structure of TS packets and source packets in the multiplexed data.

FIG. 26 illustrates a format of TS packets to be finally written on the multiplexed data. Each of the TS packets is a 188-byte fixed length packet including a 4-byte TS header having information, such as a PID for identifying a stream and a 184-byte TS payload for storing data. The PES packets are divided, and stored in the TS payloads, respectively. When a BD ROM is used, each of the TS packets is given a 4-byte TP_Extra_Header, thus resulting in 192-byte source packets. The source packets are written on the multiplexed data. The TP_Extra_Header stores information such as an Arrival_Time_Stamp (ATS). The ATS shows a transfer start time at which each of the TS packets is to be transferred to a PID filter. The source packets are arranged as shown in the lowermost bar in FIG. 26. The numbers incrementing from the head of the multiplexed data are called source packet numbers (SPNs).

Each of the TS packets included in the multiplexed data includes not only streams of audio, video, subtitles and others, but also a Program Association Table (PAT), a Program Map Table (PMT), and a Program Clock Reference (PCR). The PAT shows what a PID in a PMT used in the multiplexed data indicates, and a PID of the PAT itself is registered as zero. The PMT stores PIDs of the streams of video, audio, subtitles and others included in the multiplexed data, and attribute information of the streams corresponding to the PIDs. The PMT also has various descriptors relating to the multiplexed data. The descriptors have information such as copy control information showing whether copying of the multiplexed data is permitted or not. The PCR stores STC time information corresponding to an ATS showing when the PCR packet is transferred to a decoder, in order to achieve synchronization between an Arrival Time Clock (ATC) that is a time axis of ATSs, and an System Time Clock (STC) that is a time axis of PTSs and DTSs.

Figure 27:
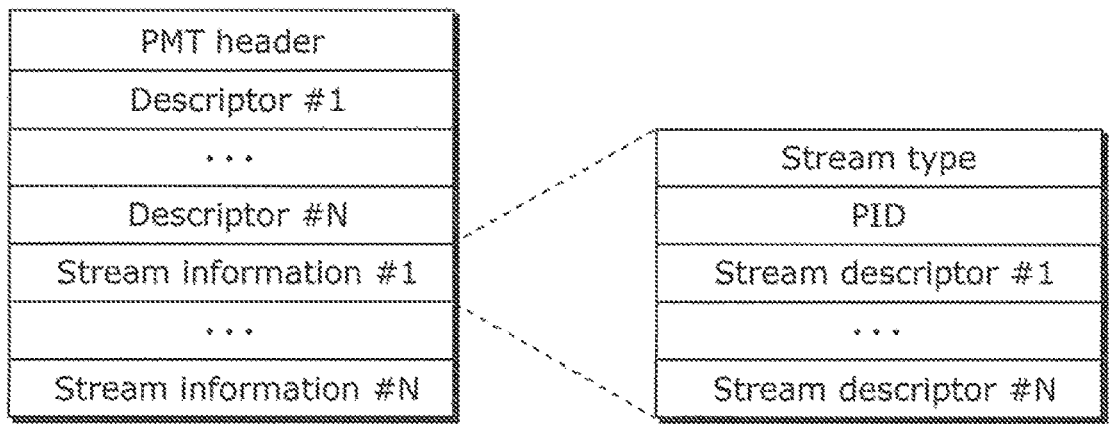
FIG. 27 is a drawing showing a data structure of a PMT.

FIG. 27 illustrates the data structure of the PMT in detail. A PMT header is disposed at the top of the PMT. The PMT header describes the length etc. of data included in the PMT. A plurality of descriptors relating to the multiplexed data is disposed after the PMT header. Information such as the copy control information is described in the descriptors. After the descriptors, a plurality of pieces of stream information relating to the streams included in the multiplexed data is disposed. Each piece of stream information includes stream descriptors each describing information, such as a stream type for identifying a compression codec etc. of a stream, a stream PID, and stream attribute information (such as a frame rate, an aspect ratio, or the like). The stream descriptors are equal in number to the number of streams in the multiplexed data.

When the multiplexed data is recorded onto a recording medium etc., it is recorded together with multiplexed data information files.

Figure 28:
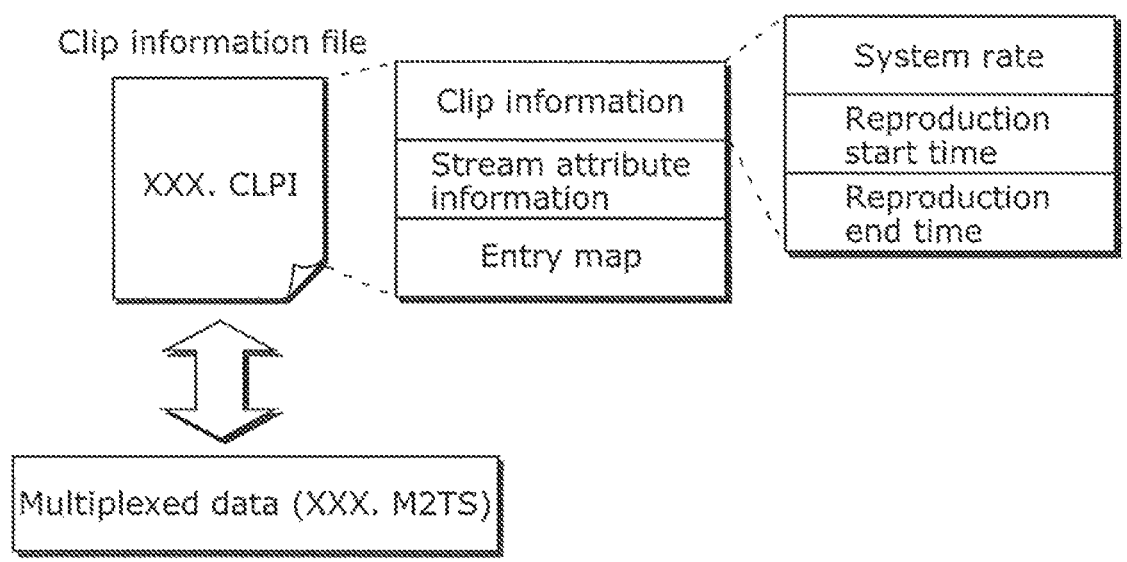
FIG. 28 is a drawing showing an internal structure of multiplexed data information.

Each of the multiplexed data information files is management information of the multiplexed data as shown in FIG. 28. The multiplexed data information files are in one to one correspondence with the multiplexed data, and each of the files includes multiplexed data information, stream attribute information, and an entry map.

As illustrated in FIG. 28, the multiplexed data includes a system rate, a reproduction start time, and a reproduction end time. The system rate indicates the maximum transfer rate at which a system target decoder to be described later transfers the multiplexed data to a PID filter. The intervals of the ATSs included in the multiplexed data are set to not higher than a system rate. The reproduction start time indicates a PTS in a video frame at the head of the multiplexed data. An interval of one frame is added to a PTS in a video frame at the end of the multiplexed data, and the PTS is set to the reproduction end time.

Figure 29:
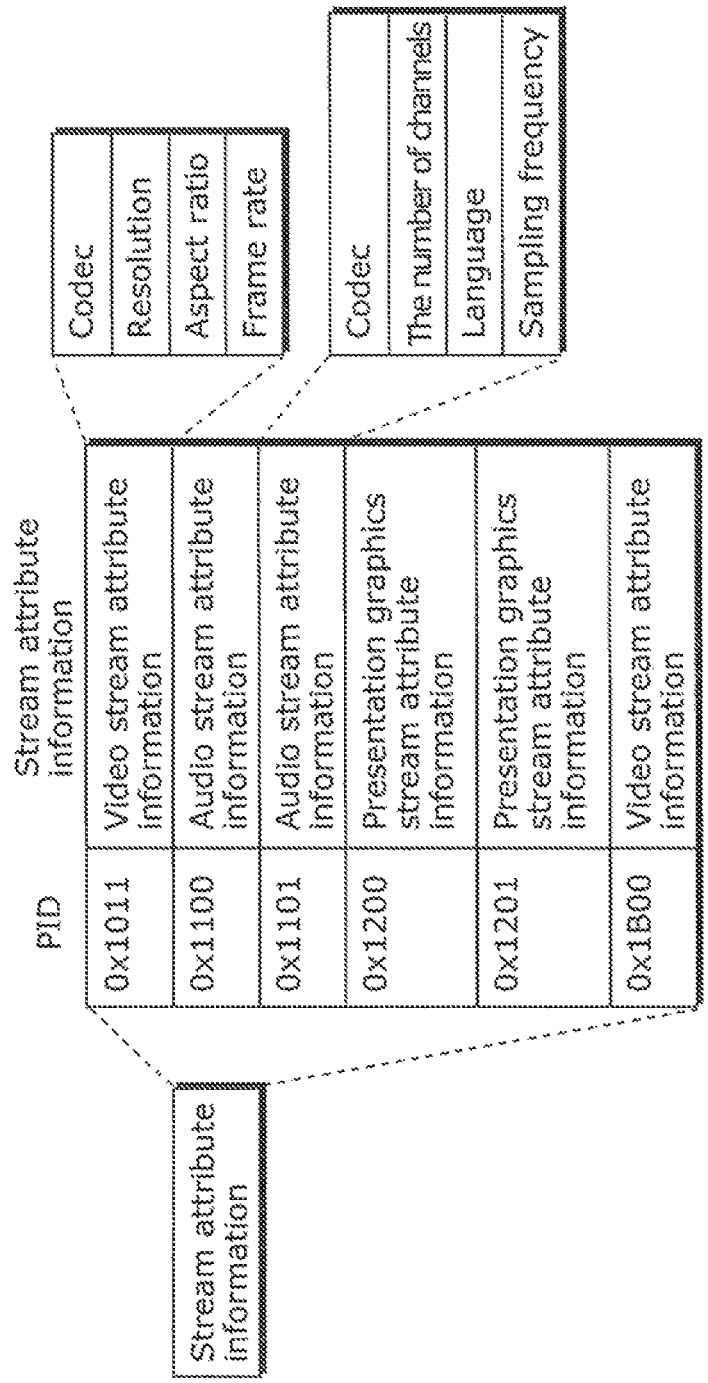
FIG. 29 is a drawing showing an internal structure of stream attribute information.

As shown in FIG. 29, a piece of attribute information is registered in the stream attribute information, for each PID of each stream included in the multiplexed data. Each piece of attribute information has different information depending on whether the corresponding stream is a video stream, an audio stream, a presentation graphics stream, or an interactive graphics stream. Each piece of video stream attribute information carries information including what kind of compression codec is used for compressing the video stream, and the resolution, aspect ratio and frame rate of the pieces of picture data included in the video stream. Each piece of audio stream attribute information carries information including what kind of compression codec is used for compressing the audio stream, how many channels are included in the audio stream, which language the audio stream supports, and how high the sampling frequency is.

The video stream attribute information and the audio stream attribute information are used for initialization of a decoder before the player plays back the information.

In this embodiment, the multiplexed data to be used among the multiplexed data is of a stream type included in the PMT. Furthermore, when the multiplexed data is recorded on a recording medium, the video stream attribute information included in the multiplexed data information is used. More specifically, the moving picture coding method or the moving picture coding apparatus described in any one of the embodiments includes a step or a unit for allocating unique information indicating video data generated by the moving picture coding method or the moving picture coding apparatus in any one of the embodiments, to the stream type included in the PMT or the video stream attribute information. With this structure, the video data generated by the moving picture coding method or the moving picture coding apparatus described in any one of the embodiments can be distinguished from video data that conforms to another standard.

Figure 30:
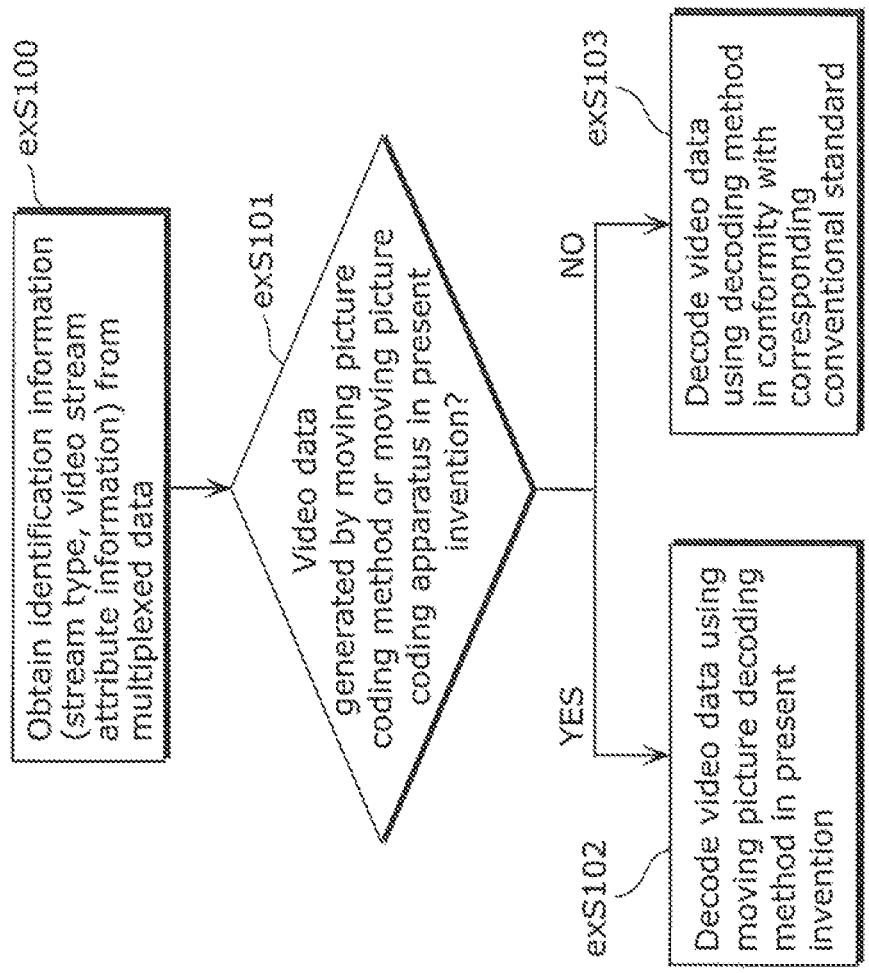
FIG. 30 is a drawing showing steps for identifying video data.

Furthermore, FIG. 30 illustrates steps of the moving picture decoding method according to this embodiment. In Step exS100, the stream type included in the PMT or the video stream attribute information is obtained from the multiplexed data. Next, in Step exS101, it is determined whether or not the stream type or the video stream attribute information indicates that the multiplexed data is generated by the moving picture coding method or the moving picture coding apparatus in any one of the embodiments. When it is determined that the stream type or the video stream attribute information indicates that the multiplexed data is generated by the moving picture coding method or the moving picture coding apparatus in any one of the embodiments, in Step exS102, the stream type or the video stream attribute information is decoded by the moving picture decoding method in any one of the embodiments. Furthermore, when the stream type or the video stream attribute information indicates conformance to any one of the conventional standards such as MPEG-2, MPEG-4 AVC, and VC-1, in Step exS103, the stream type or the video stream attribute information is decoded by a moving picture decoding method in conformity with any one of the conventional standards.

As such, allocating a new unique value to the stream type or the video stream attribute information enables determination whether or not the moving picture decoding method or the moving picture decoding apparatus that is described in any one of the embodiments can perform decoding. Even when multiplexed data that conforms to a different standard, an appropriate decoding method or apparatus can be selected. Thus, it becomes possible to decode information without any error. Furthermore, the moving picture coding method or apparatus, or the moving picture decoding method or apparatus in this embodiment can be used in the devices and systems described above.

Embodiment 5

Figure 31:
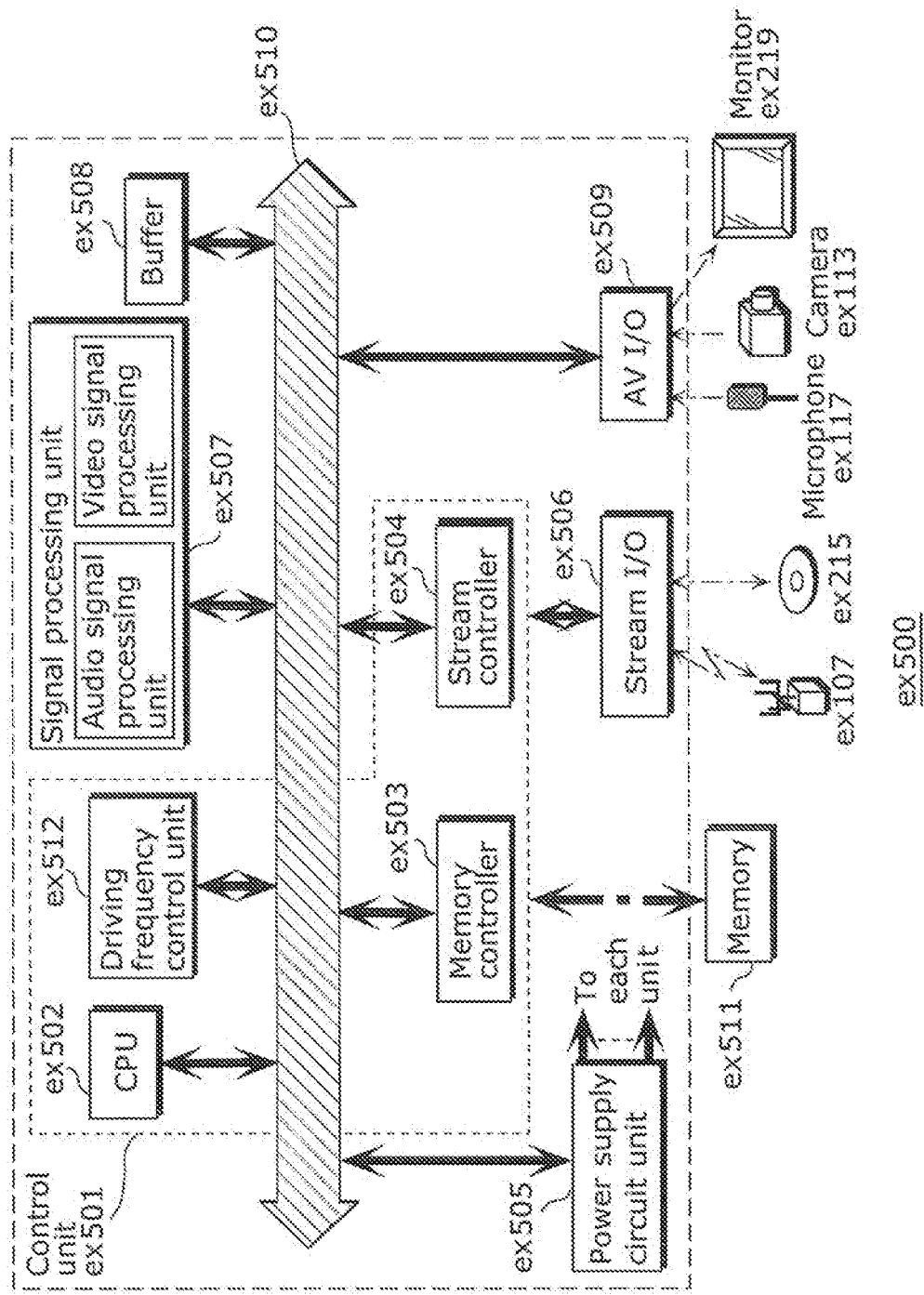
FIG. 31 is a block diagram illustrating an example of a structure of an integrated circuit for implementing the moving picture coding method and the moving picture decoding method according to any one of the embodiments.

Each of the moving picture coding method, the moving picture coding apparatus, the moving picture decoding method, and the moving picture decoding apparatus in any one of the embodiments is typically achieved in the form of an integrated circuit or a Large Scale Integrated (LSI) circuit. As an example of the LSI, FIG. 31 illustrates a configuration of the LSI ex500 that is made into one chip. The LSI ex500 includes elements ex501, ex502, ex503, ex504, ex505, ex506, ex507, ex508, and ex509 to be described below, and the elements are connected to each other through a bus ex510. The power supply circuit unit ex505 is activated by supplying each of the elements with power when the power supply circuit unit ex505 is turned on.

For example, when coding is performed, the LSI ex500 receives an AV signal from a microphone ex117, a camera ex113, and others through an AV I/O ex509 under control of a control unit ex501 including a CPU ex502, a memory controller ex503, a stream controller ex504, and a driving frequency control unit ex512. The received AV signal is temporarily stored in an external memory ex511, such as an SDRAM. Under control of the control unit ex501, the stored data is segmented into data portions according to the processing amount and speed to be transmitted to a signal processing unit ex507. Then, the signal processing unit ex507 codes an audio signal and/or a video signal. Here, the coding of the video signal is the coding described in any one of the embodiments. Furthermore, the signal processing unit ex507 multiplexes the coded audio data and the coded video data as necessary, and a stream I/O ex506 outputs the multiplexed data. The provided multiplexed data is transmitted to a base station ex107, or written onto the recording media ex215. Prior to the multiplexing, the audio and video data be preferably temporarily stored in the buffer ex508 so that the audio and video data are synchronized with each other.

Although the memory ex511 is described as an element outside the LSI ex500, it may be included in the LSI ex500. The buffer ex508 is not limited to one buffer, but may be composed of buffers. Furthermore, the LSI ex500 may be made into a single chip or a plurality of chips.

Furthermore, although the control unit ex501 includes the CPU ex502, the memory controller ex503, the stream controller ex504, the driving frequency control unit ex512, the configuration of the control unit ex501 is not limited to such. For example, the signal processing unit ex507 may further include a CPU. Inclusion of another CPU in the signal processing unit ex507 can improve the processing speed. Furthermore, as another example, the CPU ex502 may serve as or be a part of the signal processing unit ex507, and, for example, may include an audio signal processing unit. In such a case, the control unit ex501 includes the signal processing unit ex507 or the CPU ex502 including a part of the signal processing unit ex507.

The name used here is LSI, but it may also be called IC, system LSI, super LSI, or ultra LSI depending on the degree of integration.

Moreover, ways to achieve integration are not limited to the LSI, and a special circuit or a general purpose processor and so forth can also achieve the integration. Field Programmable Gate Array (FPGA) that can be programmed after manufacturing LSIs or a reconfigurable processor that allows re-configuration of the connection or configuration of an LSI can be used for the same purpose.

In the future, with advancement in semiconductor technology, a brand-new technology may replace LSI. The functional blocks can be integrated using such a technology. Application of biotechnology is one such possibility.

Embodiment 6

When video data is decoded in the moving picture coding method or by the moving picture coding apparatus described in any one of the embodiment, the processing amount probably increases compared to when video data that conforms to any one of the conventional standards such as MPEG-2, MPEG-4 AVC, and VC-1. Thus, the LSI ex500 needs to be set to a driving frequency higher than that of the CPU ex502 to be used when video data in conformity with any one of the conventional standards is decoded. However, when the driving frequency is set higher, there is a problem that the power consumption increases.

Figure 32:
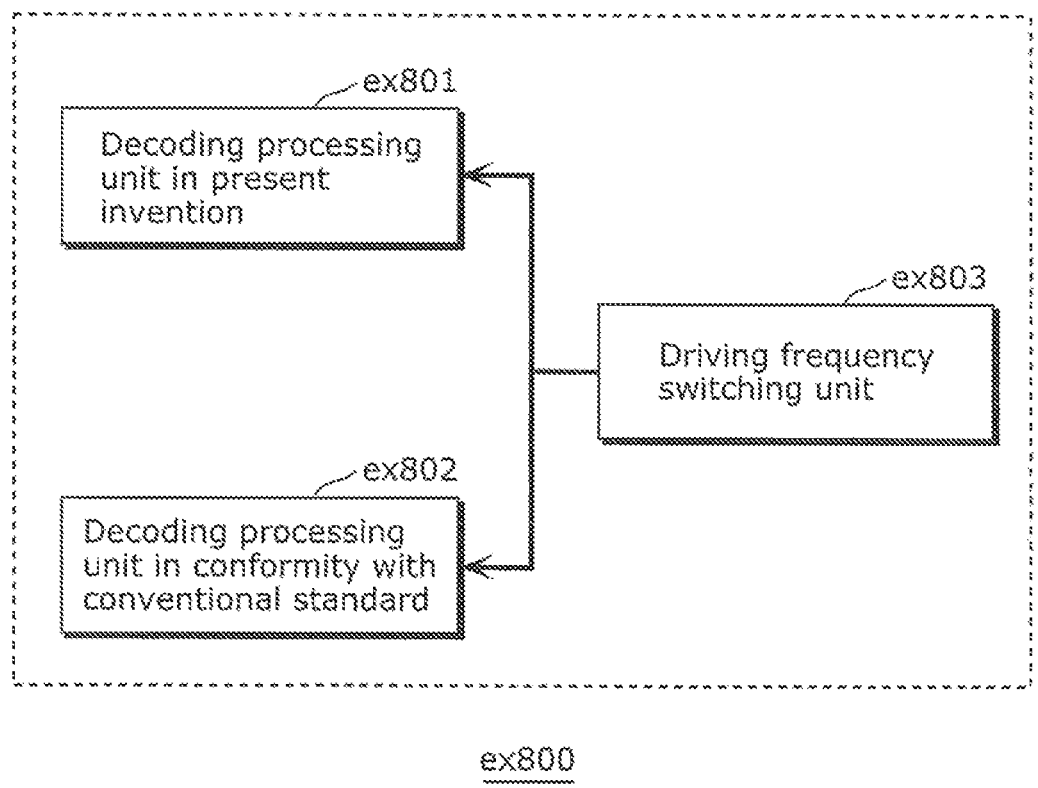
FIG. 32 is a drawing showing a structure for switching between driving frequencies.

In order to solve this problem, the moving picture decoding apparatus, such as the television (receiver) ex300, the LSI ex500, or the like is configured to determine to which standard the video data conforms, and switch between the driving frequencies according to the determined standard. FIG. 32 illustrates a structure of ex800 in this embodiment. A driving frequency switching unit ex803 sets a driving frequency to a higher driving frequency when video data is generated by the moving picture coding method or the moving picture coding apparatus described in any one of the embodiments. Then, the driving frequency switching unit ex803 instructs a decoding processing unit ex801 that executes the moving picture decoding method described in any one of the embodiments to decode the video data. When the video data conforms to any one of the conventional standards, the driving frequency switching unit ex803 sets a driving frequency to a lower driving frequency than that of the video data generated by the moving picture coding method or the moving picture coding apparatus described in any one of the embodiments. Then, the driving frequency switching unit ex803 instructs the decoding processing unit ex802 that conforms to any one of the conventional standards to decode the video data.

More specifically, the driving frequency switching unit ex803 includes the CPU ex502 and the driving frequency control unit ex512 in FIG. 31. Here, each of the decoding processing unit ex801 that executes the moving picture decoding method described in any one of the embodiments and the decoding processing unit ex802 that conforms to any one of the conventional standards corresponds to the signal processing unit ex507 in FIG. 31. The CPU ex502 determines to which standard the video data conforms. Then, the driving frequency control unit ex512 determines a driving frequency based on a signal from the CPU ex502. Furthermore, the signal processing unit ex507 decodes the video data based on a signal from the CPU ex502. For example, the identification information described in Embodiment 4 is probably used for identifying the video data. The identification information is not limited to the one described in Embodiment 4 but may be any information as long as the information indicates to which standard the video data conforms. For example, when which standard video data conforms to can be determined based on an external signal for determining that the video data is used for a television (receiver) or a disk, etc., the determination may be made based on such an external signal. Furthermore, the CPU ex502 selects a driving frequency based on, for example, a look-up table in which the standards of the video data are associated with the driving frequencies as shown in FIG. 34. The driving frequency can be selected by storing the look-up table in the buffer ex508 and an internal memory of an LSI and with reference to the look-up table by the CPU ex502.

FIG. 33 illustrates steps for executing a method in this embodiment. First, in Step exS200, the signal processing unit ex507 obtains identification information from the multiplexed data. Next, in Step exS201, the CPU ex502 determines whether or not the video data is generated based on the identification information by the coding method and the coding apparatus described in any one of the embodiments. When the video data is generated by the moving picture coding method and the moving picture coding apparatus described in any one of the embodiments, in Step exS202, the CPU ex502 transmits a signal for setting the driving frequency to a higher driving frequency to the driving frequency control unit ex512. Then, the driving frequency control unit ex512 sets the driving frequency to the higher driving frequency. On the other hand, when the identification information indicates that the video data conforms to any one of the conventional standards such as MPEG-2, MPEG-4 AVC, and VC-1, in Step exS203, the CPU ex502 transmits a signal for setting the driving frequency to a lower driving frequency to the driving frequency control unit ex512. Then, the driving frequency control unit ex512 sets the driving frequency to the lower driving frequency than that in the case where the video data is generated by the moving picture coding method and the moving picture coding apparatus described in any one of the embodiments.

Furthermore, along with the switching of the driving frequencies, the power conservation effect can be improved by changing the voltage to be applied to the LSI ex500 or an apparatus including the LSI ex500. For example, when the driving frequency is set lower, the voltage to be applied to the LSI ex500 or the apparatus including the LSI ex500 is probably set to a voltage lower than that in the case where the driving frequency is set higher.

Furthermore, when the processing amount for decoding is larger, the driving frequency may be set higher, and when the processing amount for decoding is smaller, the driving frequency may be set lower as the method for setting the driving frequency. Thus, the setting method is not limited to the ones described above. For example, when the processing amount for decoding video data in conformity with MPEG-3 AVC is larger than the processing amount for decoding video data generated by the moving picture coding method and the moving picture coding apparatus described in any one of the embodiments, the driving frequency is probably set in reverse order to the setting described above.

Furthermore, the method for setting the driving frequency is not limited to the method for setting the driving frequency lower. For example, when the identification information indicates that the video data is generated by the moving picture coding method and the moving picture coding apparatus described in any one of the embodiments, the voltage to be applied to the LSI ex500 or the apparatus including the LSI ex500 is probably set higher. When the identification information indicates that the video data conforms to the conventional standard, such as MPEG-2, MPEG-4 AVC, and VC-1, the voltage to be applied to the LSI ex500 or the apparatus including the LSI ex500 is probably set lower. As another example, when the identification information indicates that the video data is generated by the moving picture coding method and the moving picture coding apparatus described in any one of the embodiments, the driving of the CPU ex502 does not probably have to be suspended. When the identification information indicates that the video data conforms to the conventional standard, such as MPEG-2, MPEG-4 AVC, and VC-1, the driving of the CPU ex502 is probably suspended at a given time because the CPU ex502 has extra processing capacity. Even when the identification information indicates that the video data is generated by the moving picture coding method and the moving picture coding apparatus described in any one of the embodiments, in the case where the CPU ex502 may have a time delay, the driving of the CPU ex502 is probably suspended at a given time. In such a case, the suspending time is probably set shorter than that in the case where when the identification information indicates that the video data conforms to any one of the conventional standards such as MPEG-2, MPEG-4 AVC, and VC-1.

Accordingly, the power saving effect can be improved by switching between the driving frequencies in accordance with the standard to which the video data conforms. Furthermore, when the LSI ex500 or the apparatus including the LSI ex500 is driven using a battery, the battery life can be extended with the power saving effect.

Embodiment 7

There are cases where a plurality of video data that conforms to a different standard, is provided to the devices and systems, such as a television (receiver) and a mobile phone. In order to enable decoding of the plurality of video data that conforms to the different standards, the signal processing unit ex507 of the LSI ex500 needs to conform to the different standards. However, the problems of increase in the scale of the circuit of the LSI ex500 and increase in the cost arise with the individual use of the signal processing unit ex507 that conforms to the respective standards.

Figure 35A:
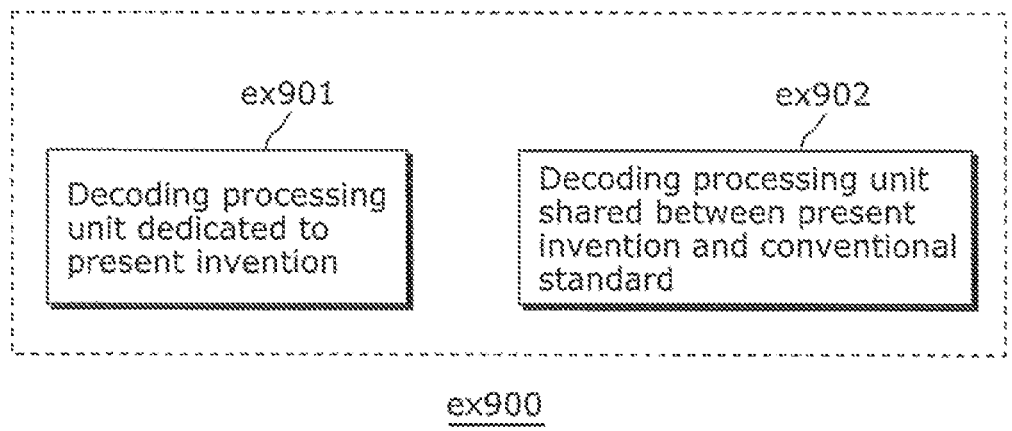
FIG. 35A is a drawing showing an example of a structure for sharing a module of a signal processing unit.

What is conceived to solve the problem is a structure for partly sharing the decoding processing unit for implementing the moving picture decoding method described in any one of the embodiments and the decoding processing unit that conforms to any one of the conventional standards such as MPEG-2, MPEG-4 AVC, and VC-1. An example of this structure is shown as ex900 in FIG. 35A. For example, the moving picture decoding method described in any one of the embodiments and the moving picture decoding method that conforms to MPEG-4 AVC have, partly in common, the details of processes such as entropy coding, inverse quantization, deblocking filtering, and motion compensated prediction. The details of processes to be shared probably include use of a decoding processing unit ex902 that conforms to MPEG-4 AVC. In contrast, a dedicated decoding processing unit ex901 is probably used for other processes which is unique to the present invention and thus do not conform to the MPEG-4 AVC. In particular, the present invention is characterized in the entropy coding. Thus, for example, the decoding processing unit ex901 is used for the entropy coding, and a shared decoding processing unit may be used for any one of or all of the other processes such as the inverse quantization, deblocking filtering, and motion compensation. As for such sharing of a decoding processing unit, the shared decoding processing unit is used for performing sharable processes in the moving picture decoding method described in any one of the embodiments, while a dedicated decoding processing unit may be used for processes unique to MPEG-4 AVC Standard.

Figure 35B:
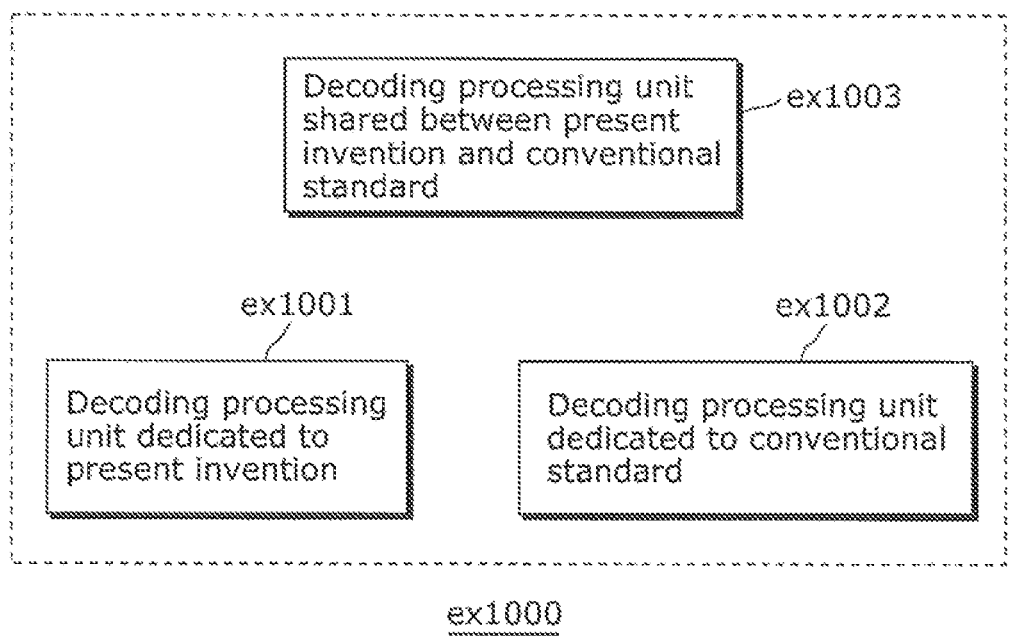
FIG. 35B is a drawing showing another example of a structure for sharing a module of a signal processing unit.

Furthermore, ex1000 in FIG. 35B shows another example for partially sharing such processes. This example uses a structure including a dedicated decoding processing unit ex1001 that supports the processes unique to the present invention, a dedicated decoding processing unit ex1002 that supports the processes unique to another one of the conventional standards, and a decoding processing unit ex1003 that supports processing to be shared between the moving picture decoding method in the present invention and the conventional moving picture decoding method. Here, the dedicated decoding processing units ex1001 and ex1002 are not necessarily specialized for the processing of the present invention and the processing of any one of the conventional standards, respectively, and may be the ones capable of implementing general processing. Furthermore, the structure of this embodiment can be implemented by the LSI ex500.

As such, the scale of the circuit of an LSI and the cost can be reduced by sharing the decoding processing unit for the processing sharable between the moving picture decoding method in the present invention and the moving picture decoding method in conformity with any one of the conventional standards.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

An image coding method, an image decoding method, an image coding apparatus, an image decoding apparatus, and an image coding and decoding apparatus are applicable to, for example, information display apparatuses and image capturing apparatuses which support high resolution. Examples of such apparatuses include a television receiver, a digital video recorder, a car navigation system, a mobile phone, a digital camera, and a digital video camera.

What is claimed is:

1. An image decoding method for decoding a coded image comprising:
    obtaining a current signal to be decoded of a current processing unit of the coded image;
    selecting a context for the current signal to be decoded from among a plurality of contexts; and
    performing arithmetic decoding of the current signal to be decoded by using the selected context,
    wherein, in said selecting, a shared context is selected as the context for the current signal to be decoded in the case where a size of the processing unit which includes the current signal to be decoded is a block size of 16×16, and in the case where the size of the processing unit which includes the current signal to be decoded is a block size of 32×32, and
    wherein, in said selecting, a dedicated context is selected as the context for the current signal to be decoded in the case where the size of the processing unit which includes the current signal to be decoded is smaller than the block size of 16×16.

2. An image coding method for coding an image comprising:
    obtaining a current signal to be coded of a current processing unit of the image;
    selecting a context for the current signal to be coded from among a plurality of contexts; and
    performing arithmetic coding of the current signal to be coded by using the selected context,
    wherein, in said selecting, a shared context is selected as the context for the current signal to be coded in the case where a size of the processing unit which includes the current signal to be coded is a block size of 16×16, and in the case where the size of the processing unit which includes the current signal to be coded is a block size of 32×32, and
    wherein, in said selecting, a dedicated context is selected as the context for the current signal to be coded in the case where the size of the processing unit which includes the current signal to be coded is smaller than the block size of 16×16.

* * * * *